US012283330B2

(12) United States Patent
Tokutomi et al.

(10) Patent No.: US 12,283,330 B2
(45) Date of Patent: Apr. 22, 2025

(54) MEMORY SYSTEM

(71) Applicant: KIOXIA CORPORATION, Tokyo (JP)

(72) Inventors: Tsukasa Tokutomi, Kamakura Kanagawa (JP); Masanobu Shirakawa, Chigasaki Kanagawa (JP); Kiwamu Watanabe, Kawasaki Kanagawa (JP); Kengo Kurose, Tokyo (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 18/354,300

(22) Filed: Jul. 18, 2023

(65) Prior Publication Data

US 2023/0360714 A1 Nov. 9, 2023

Related U.S. Application Data

(62) Division of application No. 17/476,229, filed on Sep. 15, 2021, now Pat. No. 11,756,642, which is a (Continued)

(30) Foreign Application Priority Data

Sep. 14, 2018 (JP) ................................ 2018-172913

(51) Int. Cl.
*G11C 29/12* (2006.01)
*G06F 3/06* (2006.01)
(Continued)

(52) U.S. Cl.
CPC ............ *G11C 29/12* (2013.01); *G06F 3/0619* (2013.01); *G06F 3/0658* (2013.01); (Continued)

(58) Field of Classification Search
CPC ...................................................... G11C 29/42
(Continued)

(56) References Cited

U.S. PATENT DOCUMENTS 8,930,778 B2  1/2015  Cohen
9,236,139 B1  1/2016  Lai
(Continued)

FOREIGN PATENT DOCUMENTS

JP        2017-224370        12/2017

*Primary Examiner* — Anthan Tran
(74) *Attorney, Agent, or Firm* — Oblon, McClelland, Maier & Neustadt, L.L.P.

(57) ABSTRACT

A memory system according to an embodiment includes a semiconductor memory, and a memory controller. The semiconductor memory comprises memory cells and word lines. Each of the word lines is connected to the memory cells. The memory controller executes a patrol operation including a read operation of the semiconductor memory. The word lines are classified into one of first and second groups. The memory controller executes patrol operations in which the word lines are respectively selected in a first patrol period and, in a second patrol period subsequent to the first patrol period, executes a patrol operation in which the word line included in the first group is selected and omits a patrol operation in which the word line included in the second group is selected.

20 Claims, 33 Drawing Sheets

Related U.S. Application Data division of application No. 16/294,185, filed on Mar. 6, 2019, now Pat. No. 11,152,075.

(51) Int. Cl.
 *G11C 16/08* (2006.01)
 *G11C 16/26* (2006.01)

(52) U.S. Cl.
 CPC ............ *G06F 3/0673* (2013.01); *G11C 16/08* (2013.01); *G11C 16/26* (2013.01); *G11C 2029/1202* (2013.01)

(58) Field of Classification Search
 USPC ........................................................ 365/200
 See application file for complete search history.

(56) References Cited

U.S. PATENT DOCUMENTS

| | | |
|---|---|---|
| 10,121,536 B2 | 11/2018 | Wang et al. |
| 2008/0170435 A1 | 7/2008 | Tokiwa |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2015/0261604 A1* | 9/2015 | Sugiyama .............. G11C 29/42 714/764 |
| 2017/0125090 A1 | 5/2017 | Zeng et al. |
| 2018/0033490 A1 | 2/2018 | Marelli et al. |
| 2018/0102790 A1 | 4/2018 | Oh |
| 2019/0138392 A1 | 5/2019 | Jung |
| 2019/0265888 A1 | 8/2019 | Yang |
| 2020/0090762 A1 | 3/2020 | Shirakawa |

\* cited by examiner

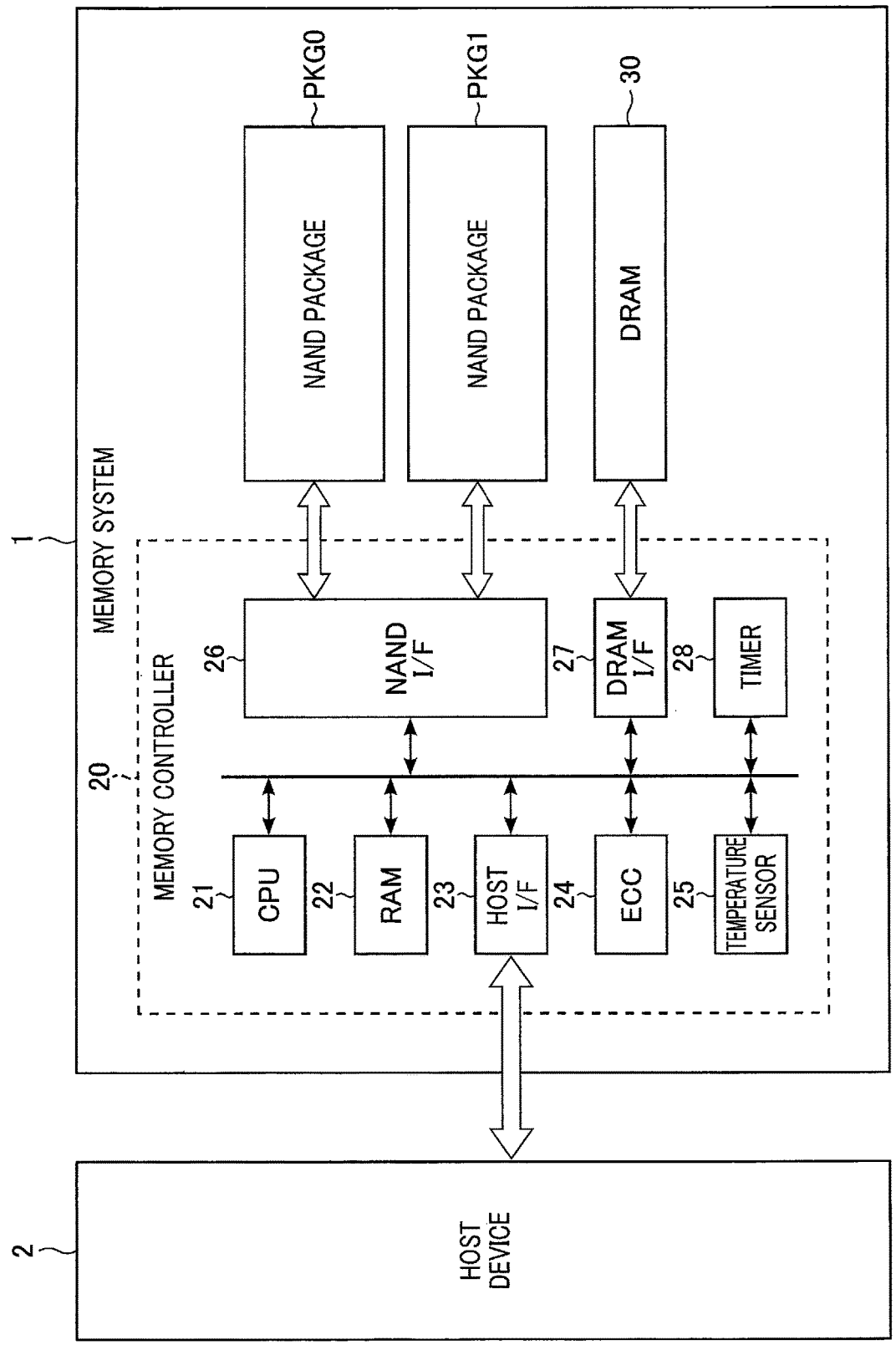
F I G. 1

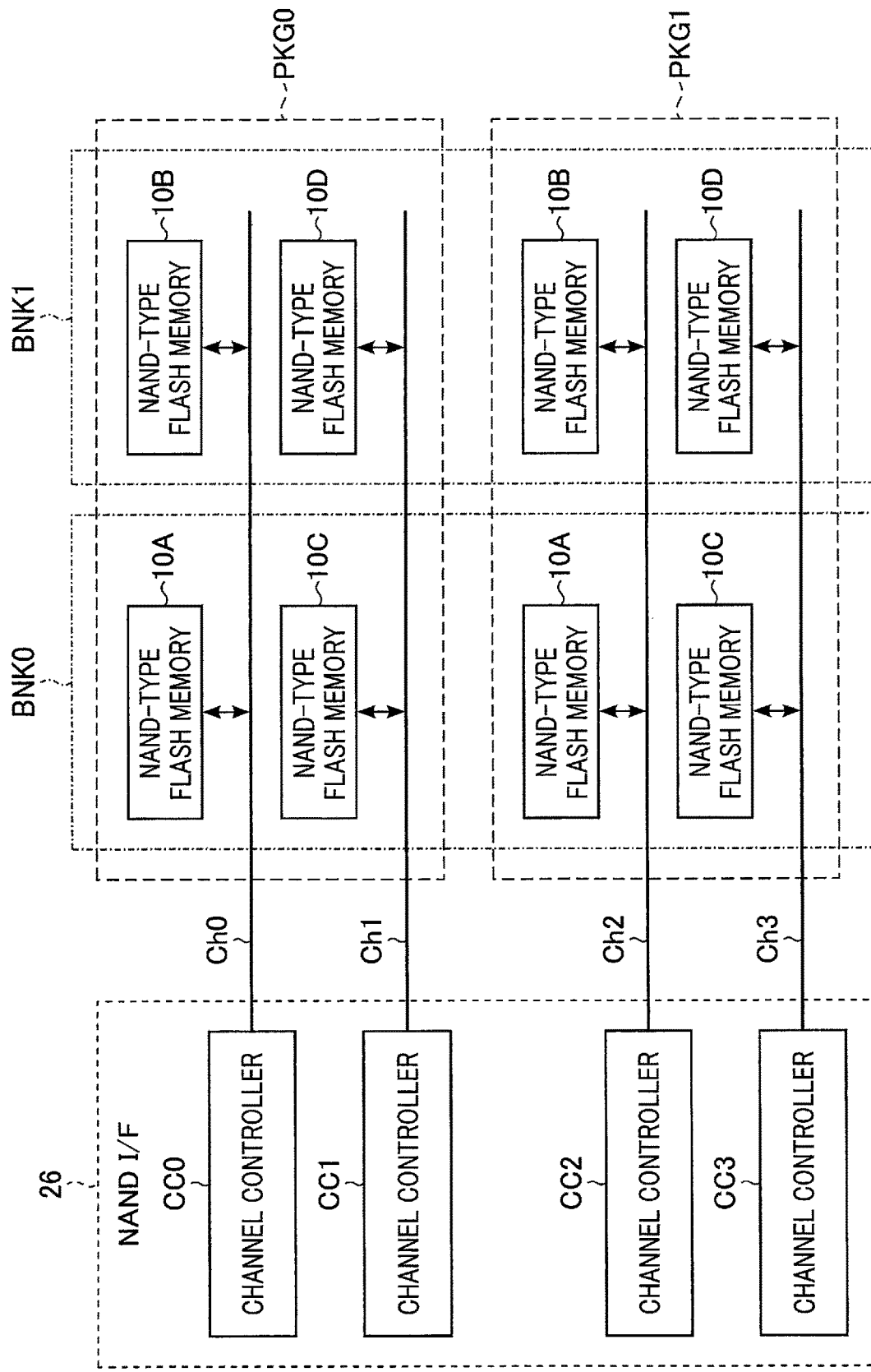
F I G. 2

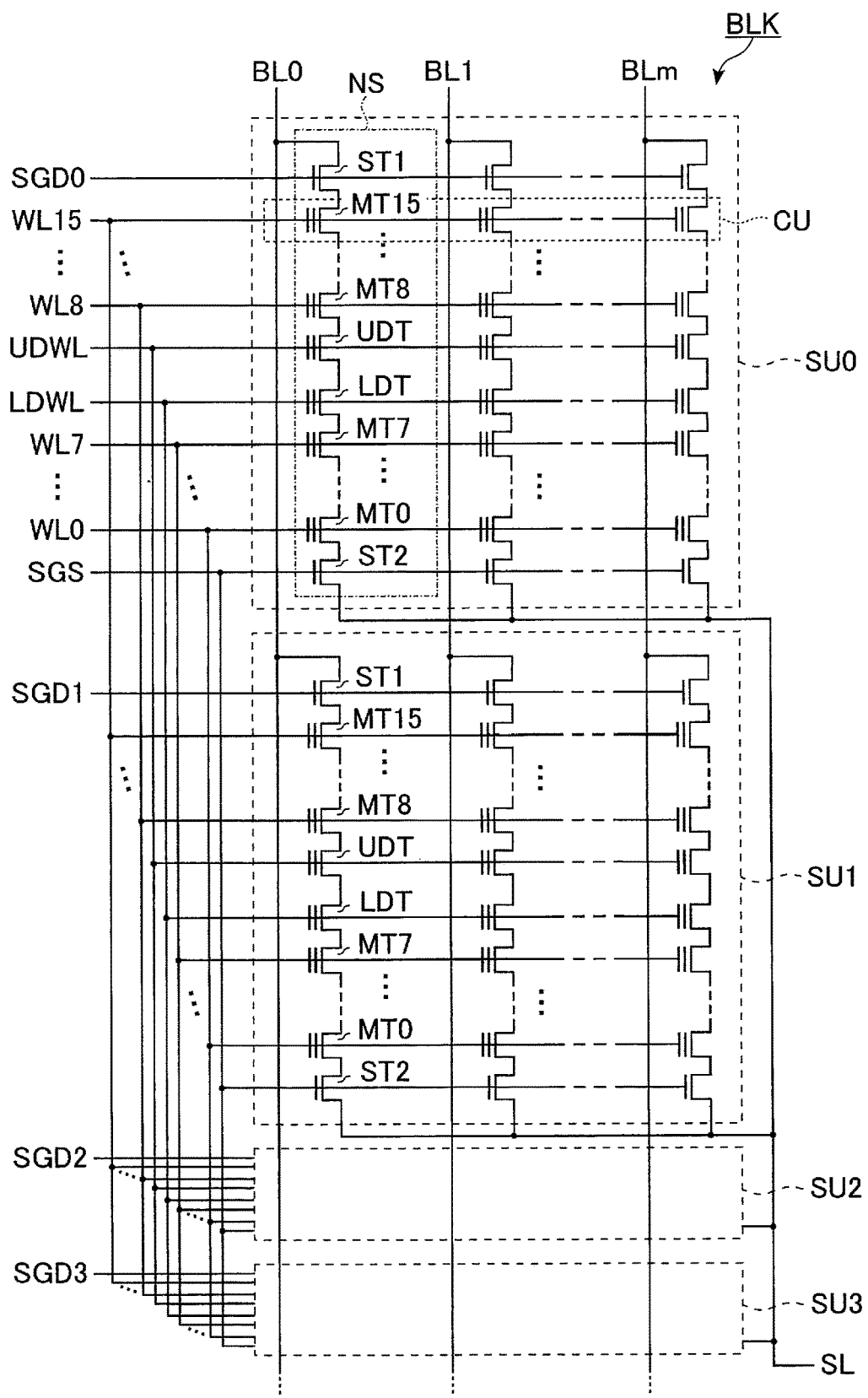
F I G. 4

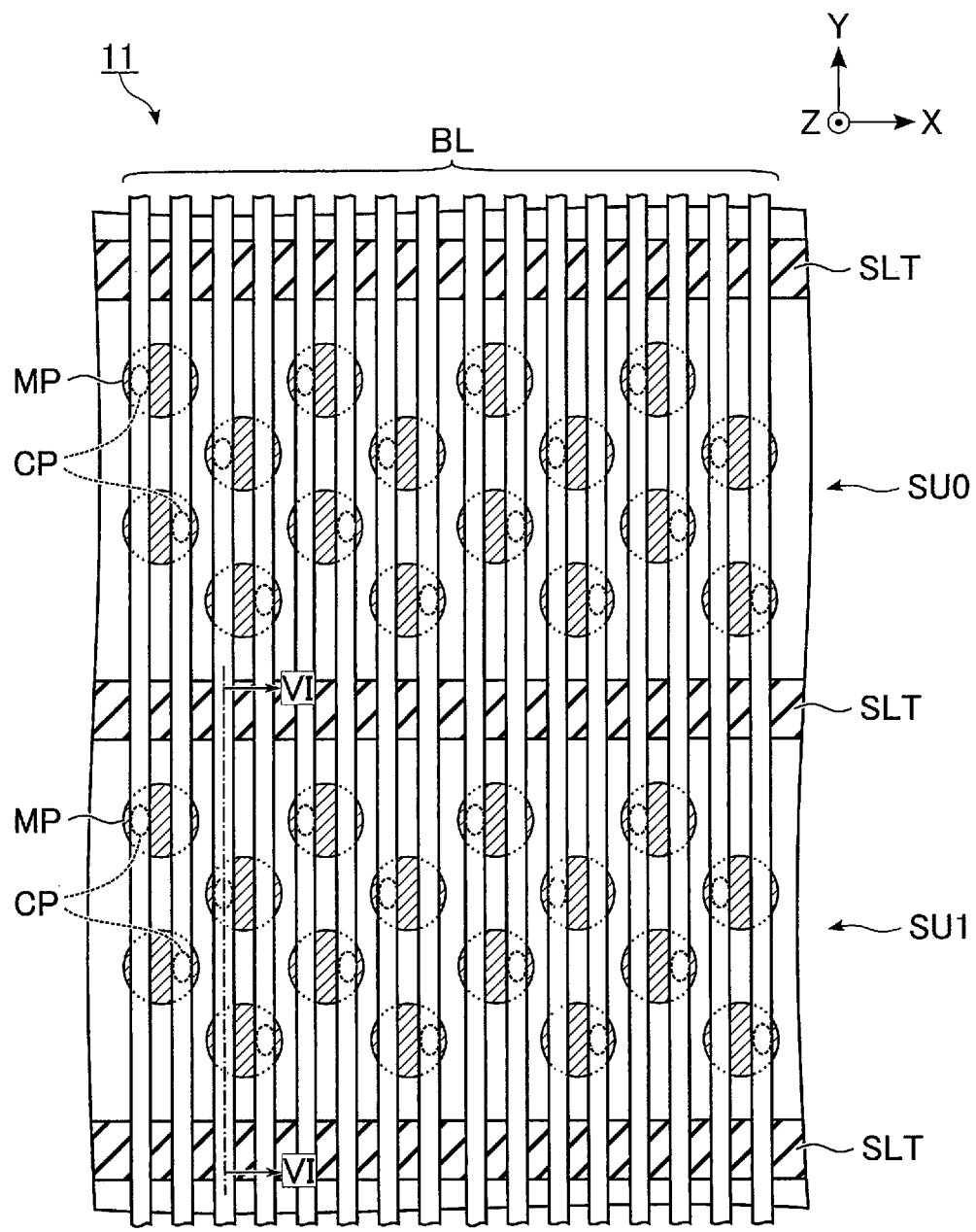
F I G. 5

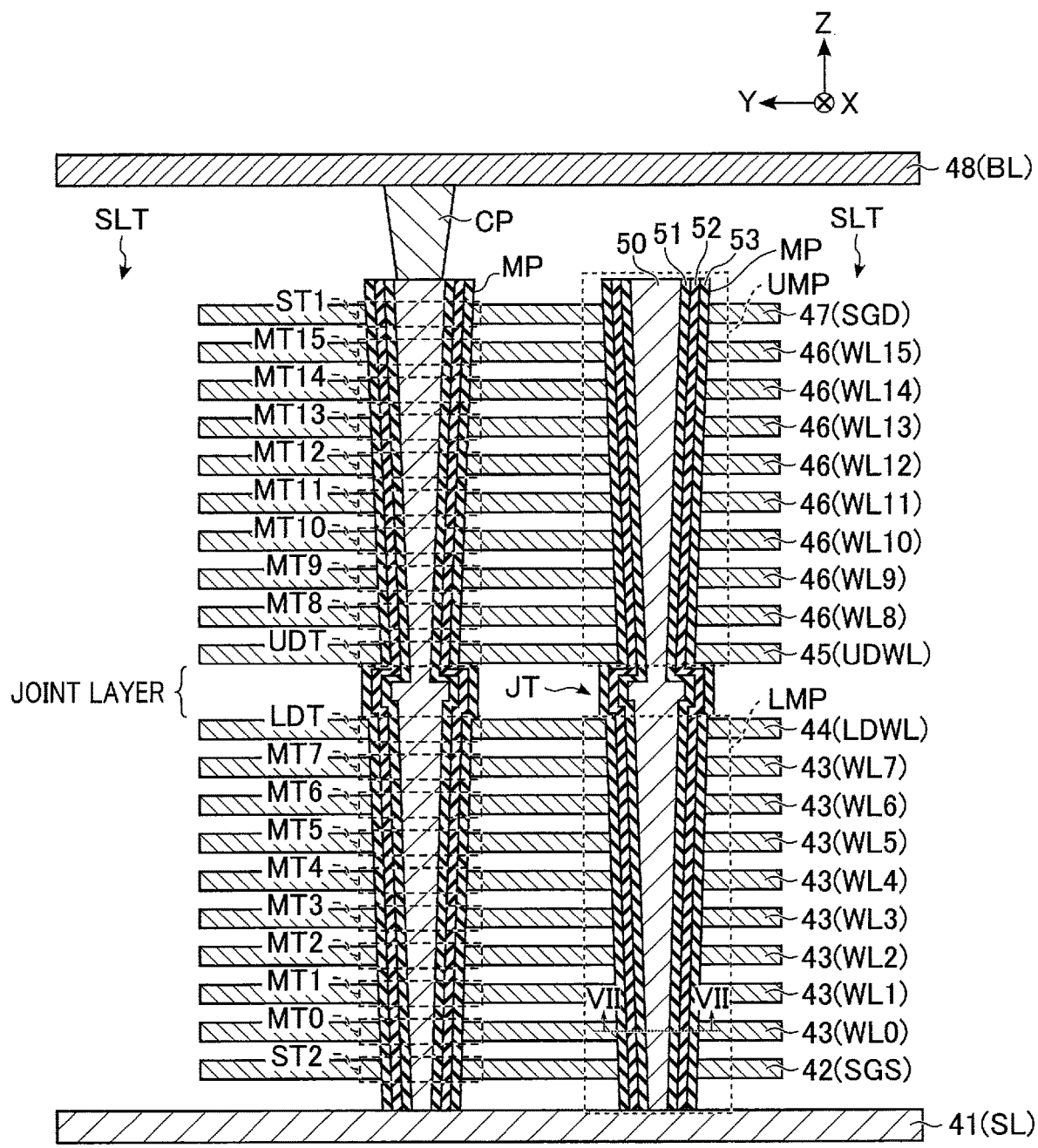
F I G. 6

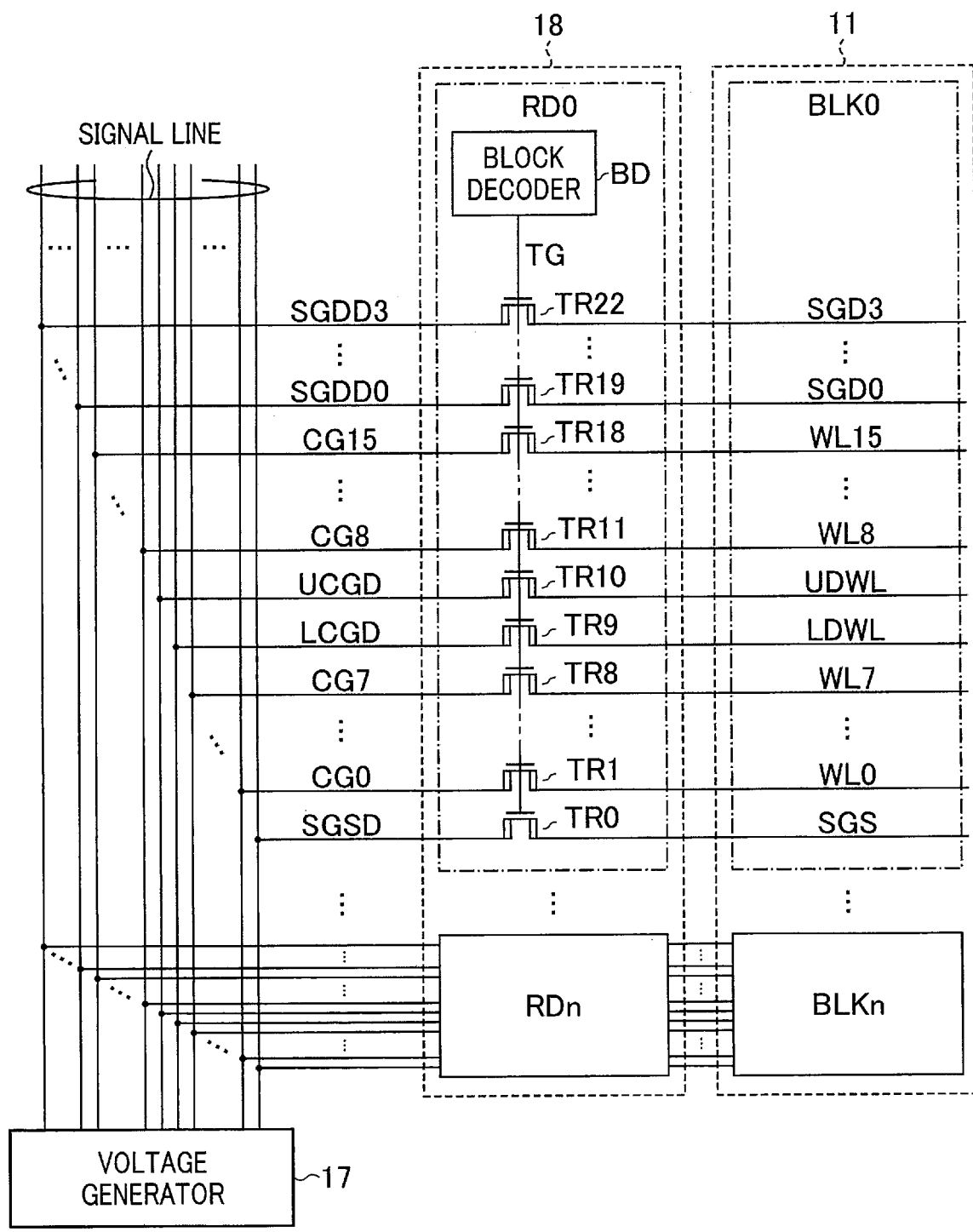
F I G. 8

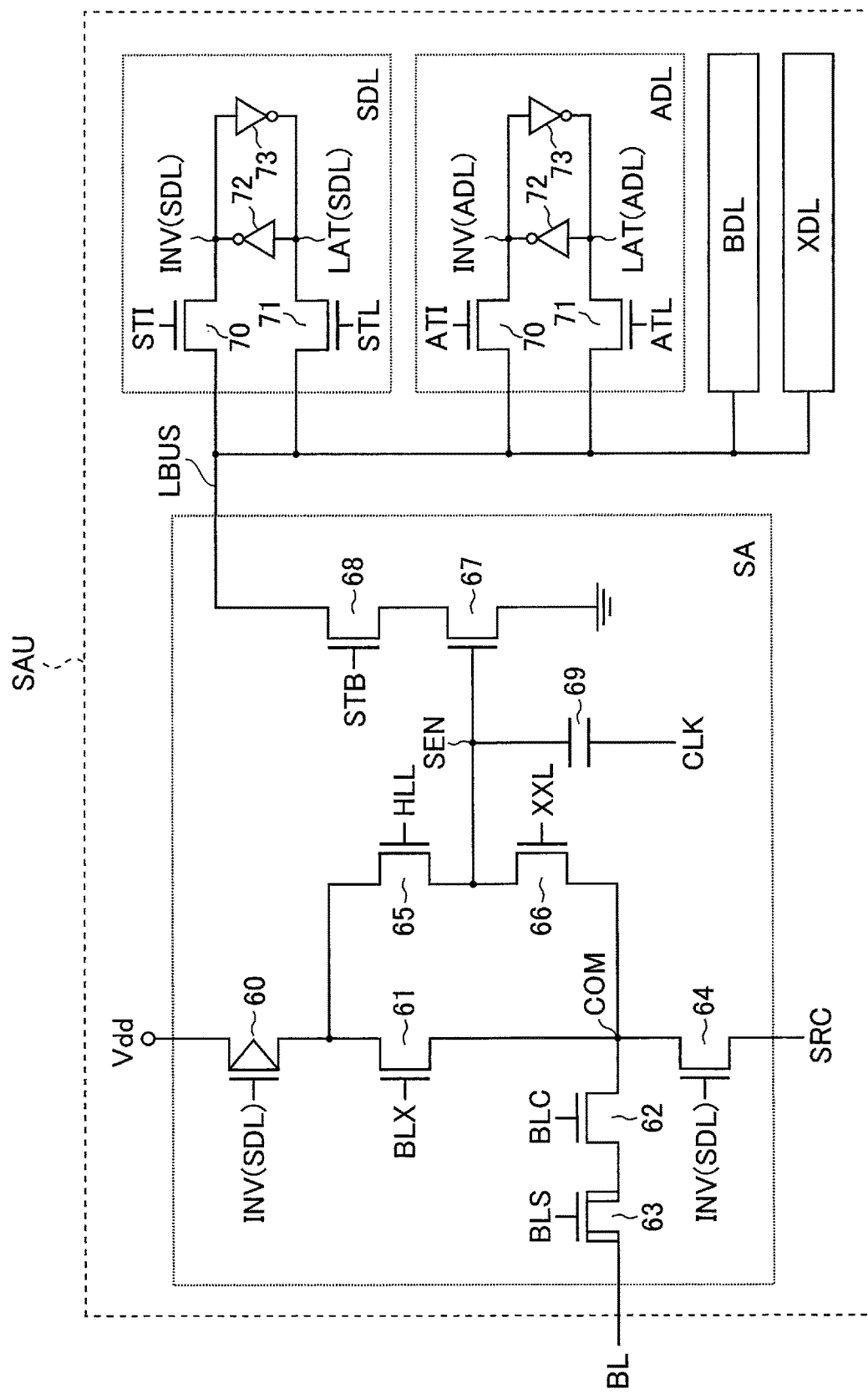
F I G. 10

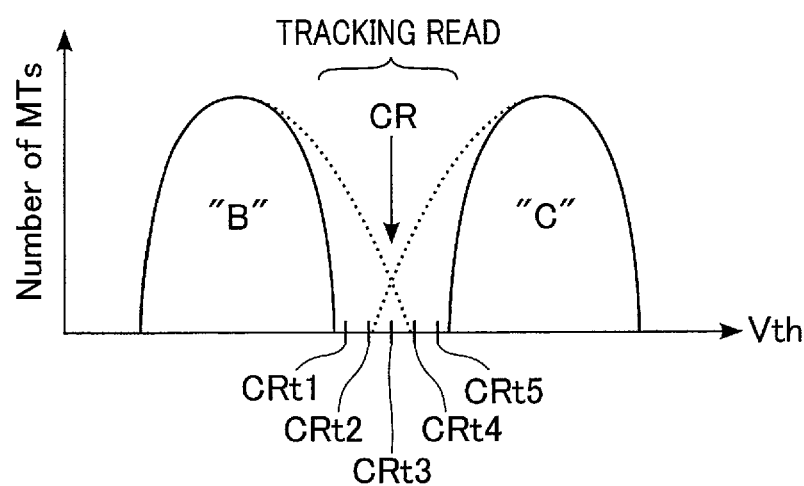
F I G. 12

FIG. 16

PROCESSING ORDER OF PATROL OPERATION: IN UNITS OF STRING UNIT (FIRST EMBODIMENT)

HISTORY LEARNING

| BLKx | | SU0 | SU1 | SU2 | SU3 |
|---|---|---|---|---|---|
| WL0 | L | 1 | 2 | 3 | 4 |
| | M | | | | |
| | U | | | | |
| WL1 | L | 5 | 6 | 7 | 8 |
| | M | | | | |
| | U | | | | |
| WL2 | L | — | — | — | — |
| | M | | | | |
| | U | | | | |
| WL3 | L | — | — | — | — |
| | M | | | | |
| | U | | | | |
| WL4 | L | — | — | — | — |
| | M | | | | |
| | U | | | | |
| ... | ... | ... | ... | ... | ... |

DEFECT DETECTION

| BLKx | | SU0 | SU1 | SU2 | SU3 |
|---|---|---|---|---|---|
| WL0 | L | 1 | 2 | 3 | 4 |
| | M | | | | |
| | U | | | | |
| WL1 | L | 5 | 6 | 7 | 8 |
| | M | | | | |
| | U | | | | |
| WL2 | L | 9 | 10 | 11 | 12 |
| | M | | | | |
| | U | | | | |
| WL3 | L | 13 | 14 | 15 | 16 |
| | M | | | | |
| | U | | | | |
| WL4 | L | 17 | 18 | 19 | 20 |
| | M | | | | |
| | U | | | | |
| ... | ... | ... | ... | ... | ... |

F I G. 18

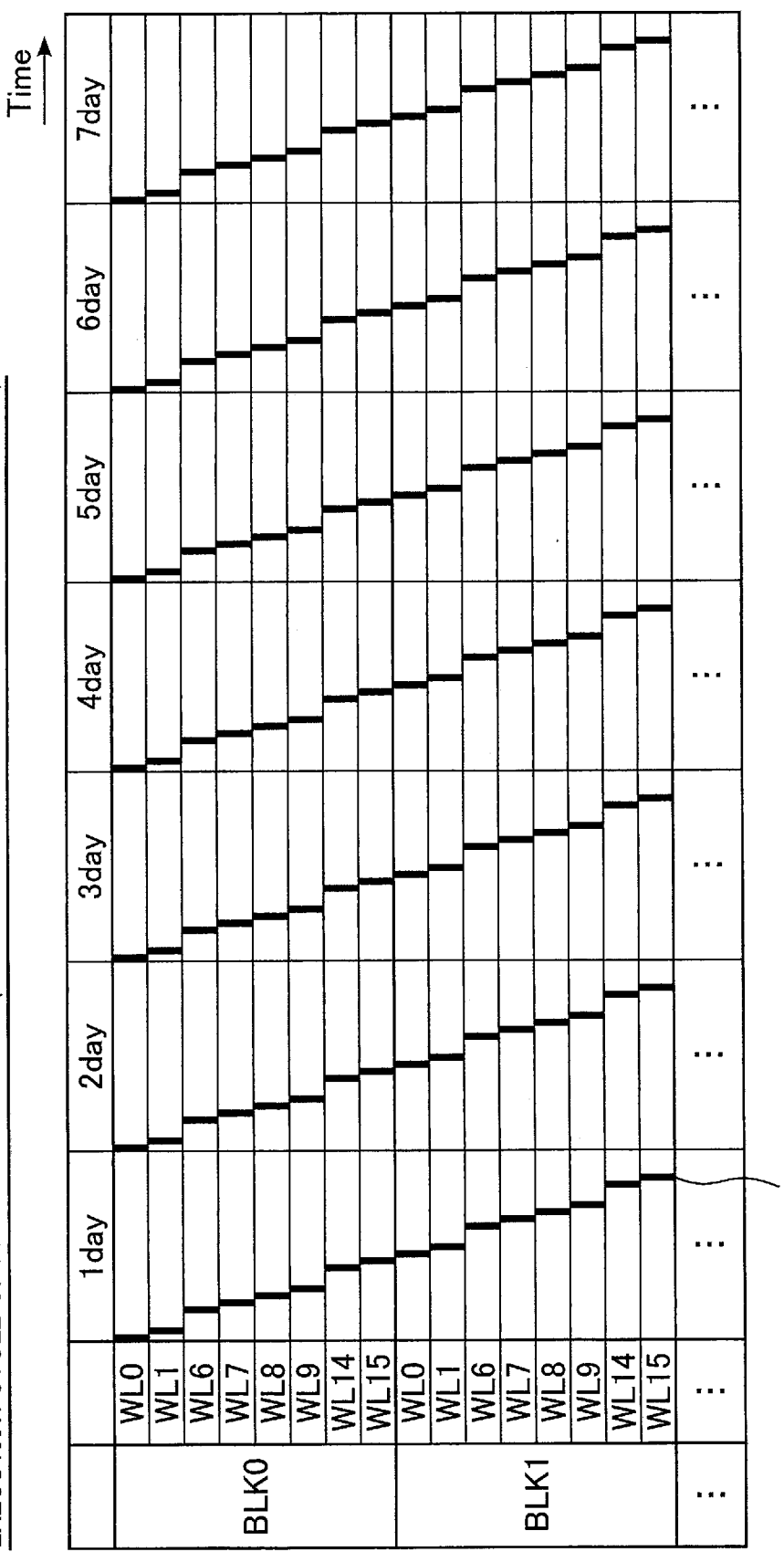
F I G. 24

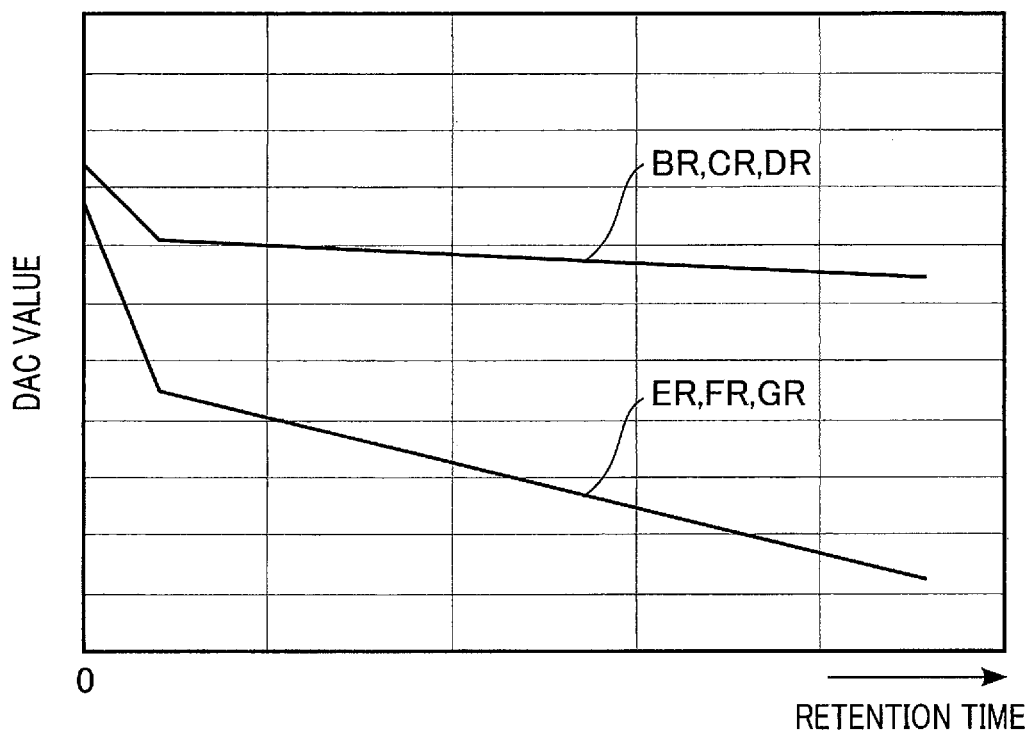
F I G. 26

TRACKING TARGET LEVEL IN ABBREVIATED TRACKING READ

| OBJECT TO BE READ | READ VOLTAGE | |
|---|---|---|
| | EXECUTE TRACKING | OMIT TRACKING |
| LOWER PAGE | AR, ER | – |
| MIDDLE PAGE | FR | BR, DR |
| UPPER PAGE | GR | CR |

F I G. 28

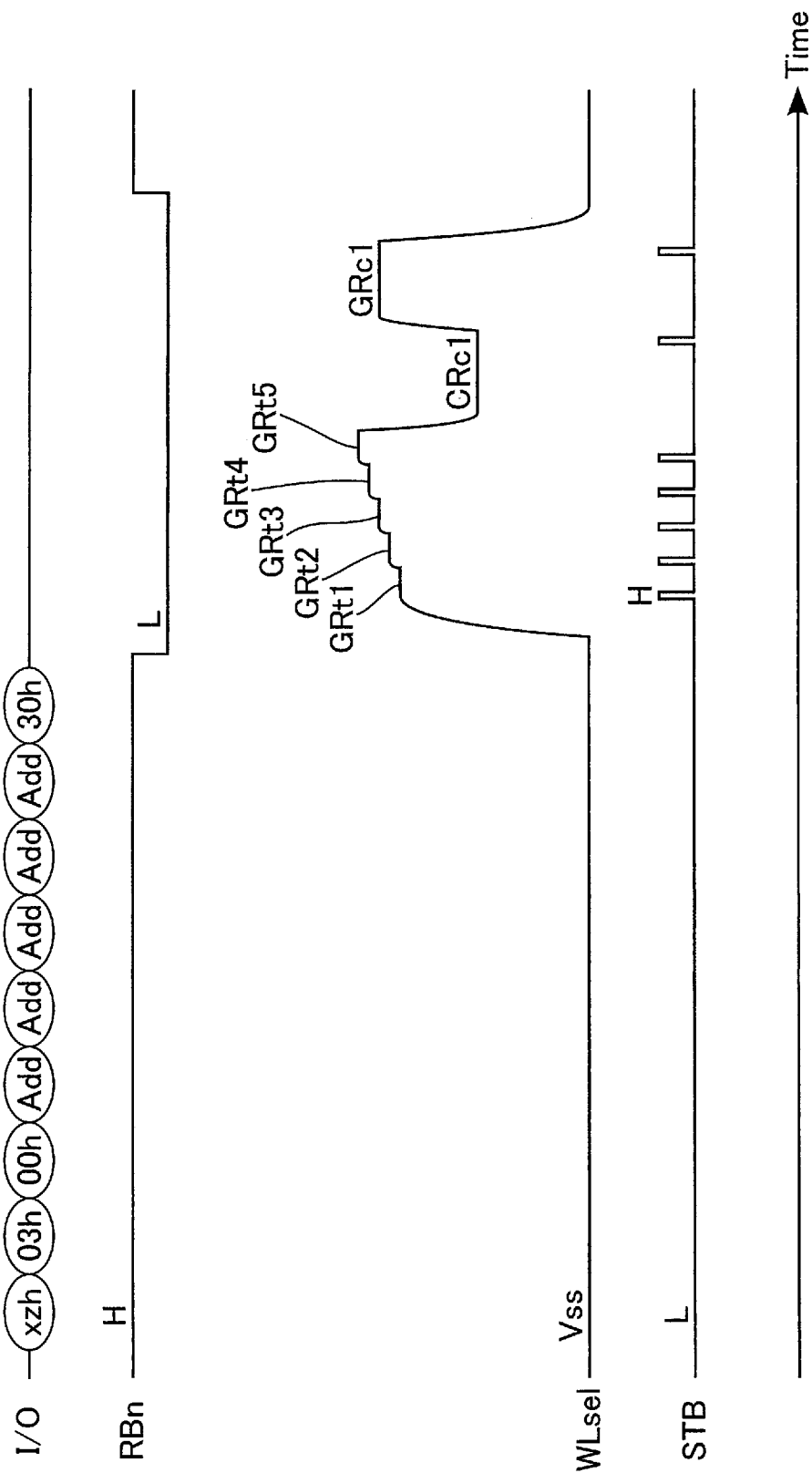
F I G. 29

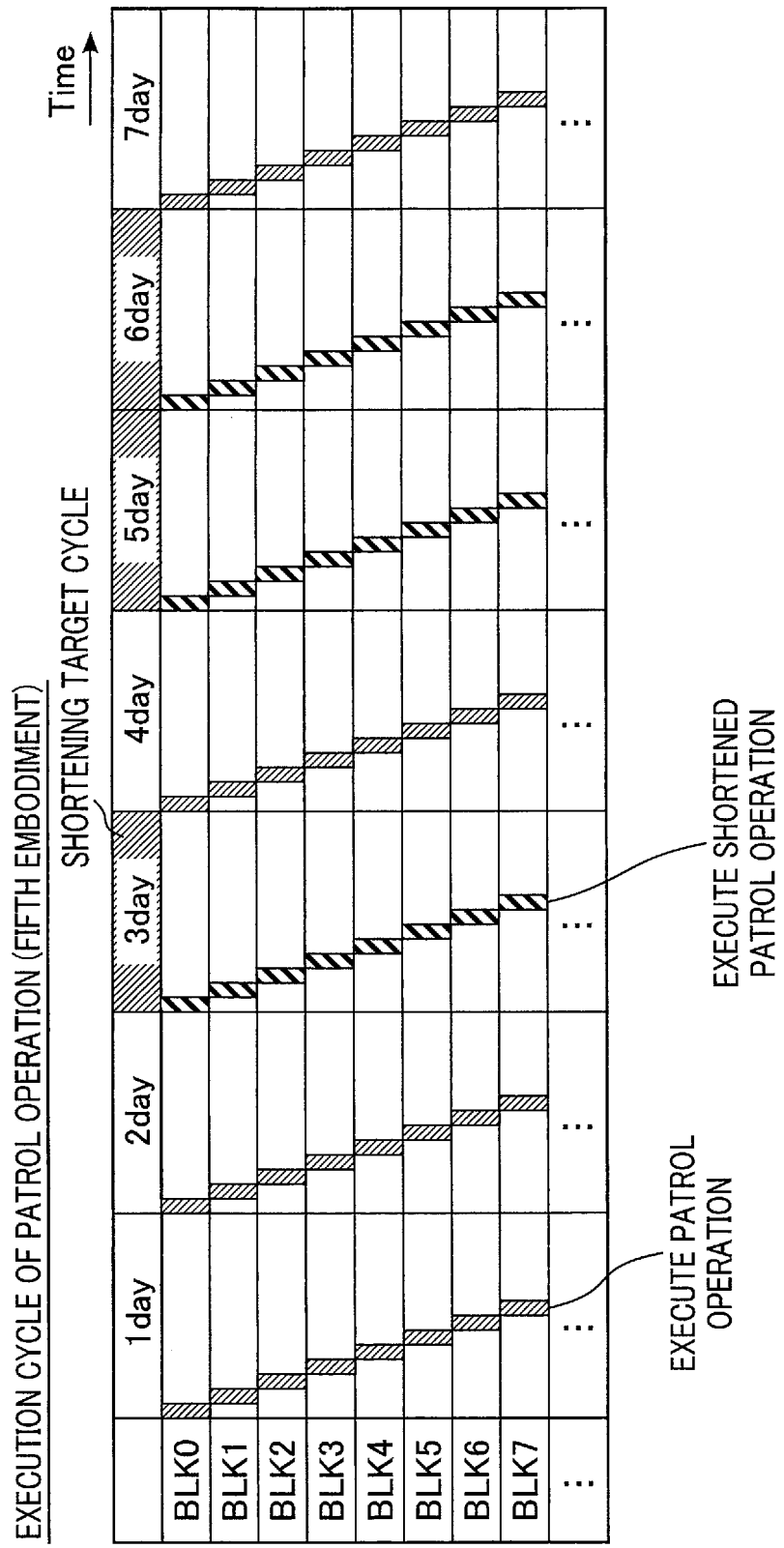
F I G. 30

TEMPERATURE DEPENDENCE OF DATA RETENTION CHARACTERISTICS AND PATROL CRITERIA
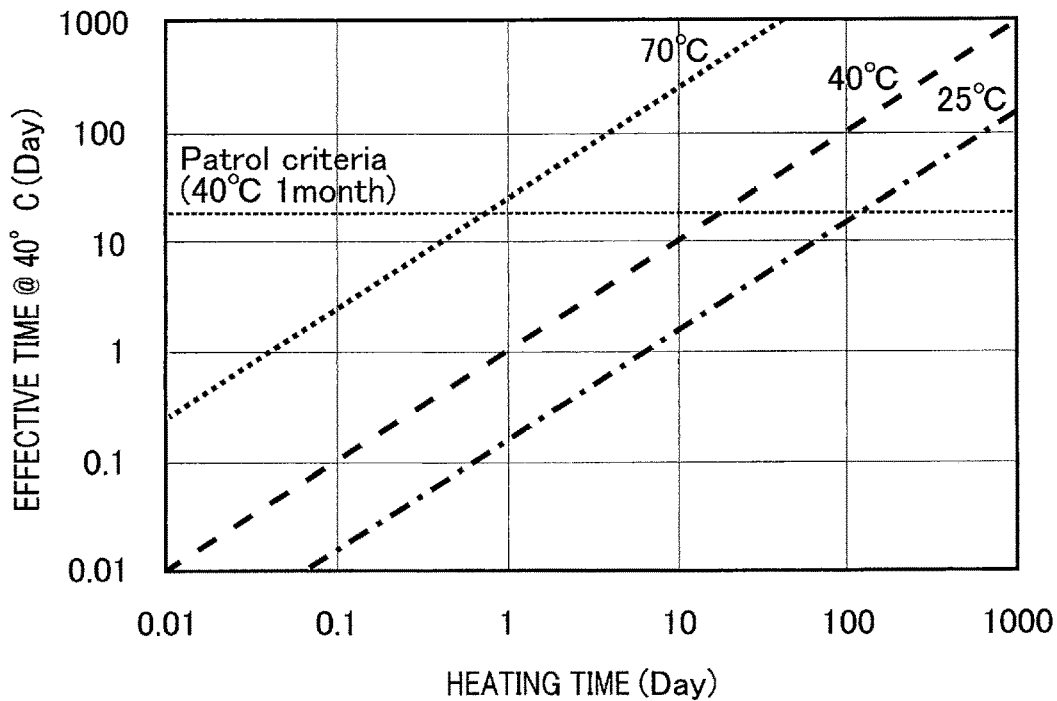
F I G. 31
PATROL MANAGEMENT PARAMETER (SIXTH EMBODIMENT)
|  | EFFECTIVE DATA RETENTION TIME |
|---|---|
| BLK0 | 10day |
| BLK1 | 8day |
| BLK2 | 24day |
| BLK3 | 7day |
| BLK4 | 2day |
| BLK5 | 35day |
| BLK6 | 40day |
| BLK7 | 5day |
| ⋮ | ⋮ |
F I G. 32

PATROL MANAGEMENT PARAMETER (SEVENTH EMBODIMENT)

|      | VALID DATA AREA FLAG |
|------|----------------------|
| BLK0 | FALSE                |
| BLK1 | FALSE                |
| BLK2 | TRUE                 |
| BLK3 | TRUE                 |
| BLK4 | TRUE                 |
| BLK5 | FALSE                |
| BLK6 | FALSE                |
| BLK7 | FALSE                |
| ⋮    | ⋮                    |

F I G. 33

MEMORY SYSTEM

CROSS-REFERENCE TO RELATED APPLICATIONS

This application is a divisional of and claims benefit under 35 U.S.C. § 120 to U.S. application Ser. No. 17/476,229 filed Sep. 15, 2021, which is a divisional of and claims benefit under 35 U.S.C. § 120 to U.S. application Ser. No. 16/294,185 filed Mar. 6, 2019 (now U.S. Pat. No. 11,152,075), which is based upon and claims the benefit of priority under 35 U.S.C. § 119 from Japanese Patent Application No. 2018-172913, filed Sep. 14, 2018, the entire contents of each of which are incorporated herein by reference.

FIELD

Embodiments relate to a memory system.

BACKGROUND

A NAND-type flash memory which can nonvolatilely store data has been known.

BRIEF DESCRIPTION OF THE DRAWINGS

FIG. 1 is a block diagram showing a configuration example of a memory system according to a first embodiment;

FIG. 2 is a block diagram showing a configuration example of a NAND package and a NAND interface circuit in the memory system according to the first embodiment;

FIG. 4 is a circuit diagram showing an example of a circuit configuration of a memory cell array included in the NAND-type flash memory in the first embodiment;

FIG. 5 is a plan view showing an example of a planar layout of the memory cell array included in the NAND-type flash memory in the first embodiment;

FIG. 6 is a cross-sectional view showing an example of a cross-sectional structure of the memory cell array included in the NAND-type flash memory in the first embodiment;

FIG. 8 is a circuit diagram showing an example of a circuit configuration of a row decoder module included in the NAND-type flash memory in the first embodiment;

FIG. 10 is a circuit diagram showing an example of a circuit configuration a sense amplifier unit included in the sense amplifier module included in the NAND-type flash memory in the first embodiment;

FIG. 12 is a threshold distribution chart showing an example of the read voltage used in tracking read in the NAND-type flash memory in the first embodiment and two adjacent threshold distributions;

FIG. 16 is a table showing an example of processing order of the patrol operation in the memory system according to the first embodiment;

FIG. 18 is a table showing an example of processing order of the patrol operation in the memory system according to the first embodiment;

FIG. 24 is a timing chart showing an example of an execution cycle of patrol operation in a memory system according to a comparative example of a third embodiment;

FIG. 26 is a graph showing an example of a change in read voltage after writing to a memory cell transistor in a memory system according to a fourth embodiment;

FIG. 28 is a table showing an example of a tracking target state in abbreviated tracking read of a memory system according to a fifth embodiment;

FIG. 29 is a timing chart showing an example of abbreviated tracking read in the memory system according to the fifth embodiment;

FIG. 30 is a timing chart showing an example of an execution cycle of patrol operation in the memory system according to the fifth embodiment;

FIG. 31 is a graph showing an example of a temperature dependence of data retention characteristics and a patrol criteria of a memory cell transistor in a memory system according to a sixth embodiment;

FIG. 32 is a table showing an example of a patrol management parameter in patrol operation of the memory system according to the sixth embodiment;

FIG. 33 is a table showing an example of a patrol management parameter in patrol operation of a memory system according to a seventh embodiment.

DETAILED DESCRIPTION

Figure 3:
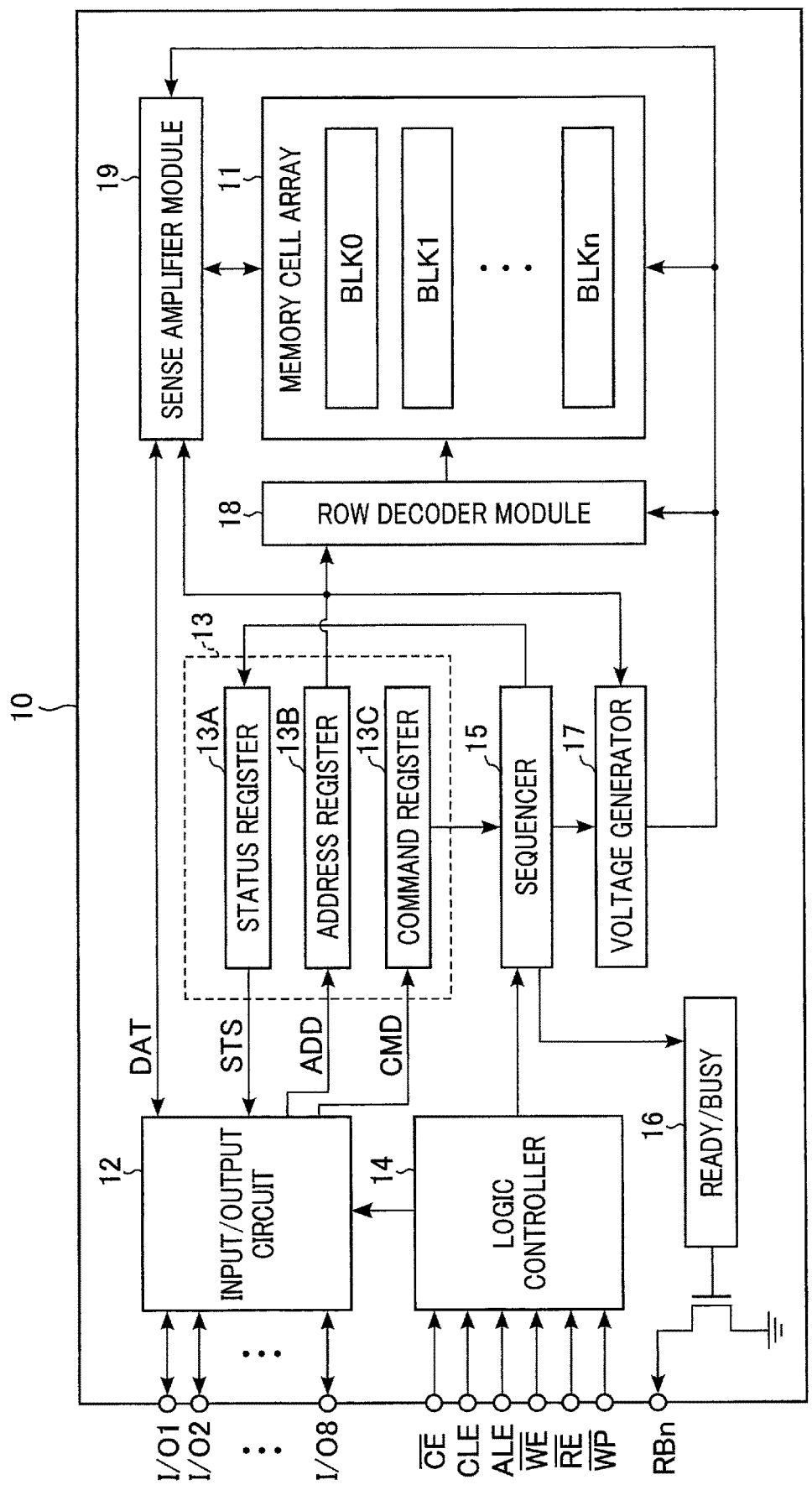
FIG. 3 is a block diagram showing a configuration example of a NAND-type flash memory included in the NAND package included in the memory system according to the first embodiment.

A memory system according to an embodiment includes a semiconductor memory, and a memory controller. The semiconductor memory comprises a plurality of memory cells connected in series and a plurality of word lines. Each of the plurality of word lines is connected to each of the memory cells. The memory controller executes a patrol operation including a read operation of the semiconductor memory. The word lines are classified into one of a first group and a second group based on an address of the word line. The memory controller executes a plurality of patrol operations in which the word lines are respectively selected in a first patrol period and, in a second patrol period subsequent to the first patrol period, executes a patrol operation in which the word line included in the first group is selected and omits a patrol operation in which the word line included in the second group is selected.

Hereinafter, embodiments will be described with reference to the drawings. The embodiments to be described below exemplify devices and methods for embodying the technical concepts of the invention. The drawings are schematic or conceptual, and the dimensions, ratios, and the like in the respective drawings are not necessarily identical to those in reality. The technical idea of the present invention is not specified by the shapes, structures, and layouts of the constituent parts.

In the following explanation, the same reference numerals denote constituent elements having almost the same functions and arrangements. A number just after a character constituting a reference numeral is referred to by the reference numeral containing the same character and is used for distinguishing the components having a similar configuration. A character just after a number constituting a reference numeral is referred to by the reference numeral containing the same number and is used for distinguishing the components having a similar configuration. When the components indicated by the reference numerals containing the same character or number do not need to be distinguished from each other, the components are referred to by the reference numeral containing only a character or number.

[1] First Embodiment

Hereinafter, a memory system 1 in a first embodiment will be described.
[1-1] Configuration
[1-1-1] Overall Configuration of Memory System 1

The memory system 1 according to the first embodiment is, for example, a solid state drive (SSD) and can nonvolatilely hold data. The memory system 1 is connected to an external host device 2, for example, and can execute various operations in accordance with a command from the host device 2.

FIG. 1 shows a configuration example of the memory system 1 according to the first embodiment. As shown in FIG. 1, the memory system 1 according to the first embodiment includes, for example, NAND packages PKG0 and PKG1, a memory controller 20, and a dynamic random access memory (DRAM) 30.

Each of the NAND packages PKG0 and PKG1 includes a plurality of NAND-type flash memories. Details of the configuration of the NAND package PKG will be described later.

The memory controller 20 is, for example, system on chip (SoC). The memory controller 20 issues instructions for reading, writing, erasing or the like to each of the NAND packages PKG0 and PKG1, in response to an instruction from the host device 2, for example.

The memory controller 20 includes, for example, a central processing unit (CPU) 21, a random access memory (RAM) 22, a host interface circuit 23, an error correction code (ECC) circuit 24, a temperature sensor 25, a NAND interface circuit 26, a DRAM interface circuit 27, and a timer 28.

The CPU 21 controls the overall operation of the memory controller 20. For example, the CPU 21 issues a write command in response to a write instruction received from the host device 2. The CPU 21 can execute patrol operation based on a count of a timer 28. Details of the patrol operation will be described later. Further, the CPU 21 executes various processes for managing a memory space of the NAND package PKG, such as wear leveling.

The RAM 22 is a volatile memory such as static random access memory (SRAM), for example. The RAM 22 is used as a work area of the CPU 21, and holds, for example, a firmware for managing the NAND package PKG, various management tables, and the like. The management table includes, for example, a look up table (LUT) in which a correction value of a read voltage is recorded.

The host interface circuit 23 is connected to the host device 2 via a host bus and controls transfer of data, commands, and addresses between the memory controller 20 and the host device 2. For example, the host interface circuit 23 may support communication interface standards such as serial advanced technology attachment (SATA), serial attached SCSI (SAS), and PCI Express (PCIe) (registered trademark).

The ECC circuit 24 executes error correction processing of data. During write operation, the ECC circuit 24 generates a parity based on write data received from the host device 2 and attaches the generated parity to the write data. During read operation, the ECC circuit 24 generates a syndrome based on read data received from the NAND package PKG and detects and corrects an error in the read data based on the generated syndrome.

The temperature sensor 25 measures the system temperature of the memory system 1. The measured temperature is referred to by the CPU 21, for example, and is used in the patrol operation to be described later. The temperature sensor 25 may not be included in the memory controller 20 and may be externally connected to the memory controller 20 in the memory system 1. Further, the temperature sensor 25 may be incorporated in a NAND-type flash memory 10 to be described later. In this case, the memory controller 20 can acquire temperature information from the NAND-type flash memory 10 by inputting a command to the NAND-type flash memory 10.

The NAND interface circuit 26 controls transfer of data, commands, and addresses between the memory controller 20 and the NAND package PKG. The NAND interface circuit 26 supports a NAND interface standard.

The DRAM interface circuit 27 is connected to the DRAM 30 and governs communication between the memory controller 20 and the DRAM 30. The DRAM interface circuit 27 supports a DRAM interface standard.

The timer 28 can measure a time related to various operations of the memory system 1 and an elapsed time since data is written in the memory cell. The timer 28 may not be included in the memory controller 20 and may be externally connected to the memory controller 20 in the memory system 1.

The DRAM 30 is a volatile memory capable of temporarily storing data and is used as an external storage area of the memory controller 20. For example, the DRAM 30 temporarily stores the write data received from the host device 2. The DRAM 30 may be incorporated in the memory controller 20.

FIG. 2 shows a configuration example of the NAND packages PKG0 and PKG1 and the NAND interface circuit 26 in the memory system 1 according to the first embodiment. As shown in FIG. 2, each of the NAND packages PKG0 and PKG1 includes, for example, NAND-type flash memories 10A, 10B, 10C, and 10D. The NAND interface circuit 26 includes, for example, channel controllers CC0, CC1, CC2 and CC3.

The NAND-type flash memory 10 can nonvolatilely store data. The configuration of the NAND-type flash memory 10 will be described later.

Each of the channel controllers CC0 to CC3 supports the NAND interface standard. The channel controllers CC0 to CC3 are connected to bus lines Ch0 to Ch3, respectively. Each of the bus lines Ch0 to Ch3 is used for transmitting and receiving a signal based on the NAND interface standard.

Further, each of the bus lines Ch0 to Ch3 is connected to a plurality of the NAND-type flash memories 10. That is, each of the channel controllers CC0 to CC3 is connected to the plurality of NAND-type flash memories 10 via the corresponding bus line Ch. Specifically, the channel controller CC0 is connected to the NAND-type flash memories 10A and 10B in the NAND package PKG0 via the bus line Ch0. The channel controller CC1 is connected to the NAND-type flash memories 10C and 10D in the NAND package PKG0 via the bus line Ch1. The channel controller CC2 is connected to the NAND-type flash memories 10A and 10B in the NAND package PKG1 via the bus line Ch2. The channel controller CC3 is connected to the NAND-type flash memories 10C and 10D in the NAND package PKG1 via the bus line Ch3.

As described above, each of the NAND packages PKG includes the plurality of NAND-type flash memories 10 connected to different channel controllers CC. For example, the NAND-type flash memories 10 connected to a common bus line Ch are allocated to different banks BNK.

The bank BNK is defined by a set of the NAND-type flash memories 10 connected to different bus lines Ch, for example. A set of the NAND packages PKG0 and PKG1 includes, for example, banks BNK0 and BNK1. For example, the bank BNK0 includes the NAND-type flash memories 10A and 10C in the NAND package PKG0 and the NAND-type flash memories 10A and 10C in the NAND package PKG0. The bank BNK1 includes the NAND-type flash memories 10B and 10D in the NAND package PKG0 and the NAND-type flash memories 10B and 10D in the NAND package PKG1.

It should be noted that the configuration of the memory system 1 described above is merely an example, and the present invention is not limited thereto. For example, the number of the NAND packages PKG and the number of the volatile memories included in the memory system 1 may each be designed in any number. The memory system 1 may include other volatile memories in place of the DRAM 30. Each function of the memory controller 20 may be realized by a dedicated hardware circuit or may be realized by executing a firmware with the CPU 21.

The number of the NAND-type flash memories 10 included in the NAND package PKG may be designed in any number. The number of the channel controllers CC connected to each of the NAND packages PKG may be designed in any number. The number of the banks BNK may be appropriately changed based on the number of the NAND-type flash memories 10 included in each of the NAND packages PKG and the number of the channel controllers CC connected to the NAND package PKG.

[1-1-2] Configuration of NAND-Type Flash Memory 10

FIG. 3 shows a configuration example of the NAND-type flash memory 10 according to the first embodiment. As shown in FIG. 3, the NAND-type flash memory 10 includes, for example, a memory cell array 11, an input/output circuit 12, a register set 13, a logic controller 14, a sequencer 15, a ready/busy controller 16, a voltage generator 17, a row decoder module 18, and a sense amplifier module 19.

The memory cell array 11 includes blocks BLK0 to BLKn (n is an integer of 1 or more). The block BLK is a group of memory cells capable of nonvolatilely holding data, and is used as a unit of use of data, for example. Each memory cell is associated with a bit line BL and a word line WL.

The input/output circuit 12 transmits and receives input/output signals I/O1 to I/O8 of, for example, 8-bit width to and from the memory controller 20. The input/output signal I/O may include, for example, data DAT, address information ADD, command CMD, and the like. For example, in the write operation, the input/output circuit 12 transfers the write data DAT received from the memory controller 20 to the sense amplifier module 19. On the other hand, in the read operation, the input/output circuit 12 transmits the read data DAT transferred from the sense amplifier module 19 to the memory controller 20.

The register set 13 includes a status register 13A, an address register 13B, and a command register 13C. The status register 13A holds status information STS. The status information STS may include a status of the NAND-type flash memory 10 and a parameter related to the read operation. The status information STS is transferred to the input/output circuit 12 under control of the sequencer 15, for example, and then output to the memory controller 20. The address register 13B holds the address information ADD transferred from the input/output circuit 12. The address information ADD may include, for example, a block address, a page address, a column address, and the like. The address information ADD is transferred to the voltage generator 17, the row decoder module 18, and the sense amplifier module 19, for example, under the control of the sequencer 15. The command register 13C holds the command CMD transferred from the input/output circuit 12. The command CMD is referred to by the sequencer 15.

The logic controller 14 controls each of the input/output circuit 12 and the sequencer 15 based on a control signal received from the memory controller 20. As such a control signal, for example, a chip enable signal/CE, a command latch enable signal CLE, an address latch enable signal ALE, a write enable signal/WE, a read enable signal/RE, and a write protect signal/WP are used.

The chip enable signal/CE is a signal for enabling the NAND-type flash memory 10. The command latch enable signal CLE is a signal for notifying the input/output circuit 12 that the received input/output signal I/O is the command CMD. The address latch enable signal ALE is a signal for notifying the input/output circuit 12 that the received input/output signal I/O is the address information ADD. The write enable signal/WE is a signal for instructing the input/output circuit 12 to input the input/output signal I/O. The read enable/RE is a signal instructing the input/output circuit 12 to output the input/output signal I/O. The write protect signal/WP is a signal for placing the NAND-type flash memory 10 in a protected state when a power supply is turned on and off.

The sequencer 15 controls the overall operation of the NAND-type flash memory 10. For example, the sequencer 15 controls the voltage generator 17, the row decoder module 18, the sense amplifier module 19, and the like based on the address information ADD and the command CMD held in the register set 13 to execute various operations.

The ready/busy controller 16 generates a ready/busy signal RBn based on an operation state of the sequencer 15. The ready/busy signal RBn is a signal for notifying the memory controller 20 whether the NAND-type flash memory 10 is in a ready state to accept a command from the memory controller 20 or in a busy state in which no command is accepted.

The voltage generator 17 generates a desired voltage under the control of the sequencer 15. Then, the voltage generator 17 supplies the generated voltage to the memory cell array 11, the row decoder module 18, the sense amplifier module 19, and the like.

The row decoder module 18 is connected to a word line or the like provided in the memory cell array 11. For example, the row decoder module 18 selects the block BLK executing various operations based on the block address. Then, the row decoder module 18 transfers the voltage supplied from the voltage generator 17 to various wires in the selected block BLK.

The sense amplifier module 19 is connected to the bit line provided in the memory cell array 11. In the read operation, the sense amplifier module 19 reads the data DAT from the memory cell array 11 and transfers the read data DAT to the input/output circuit 12. During the write operation, the sense amplifier module 19 applies a desired voltage to the bit line based on the data DAT received from the input/output circuit 12.

[1-1-3] Configuration of Memory Cell Array 11
(Circuit Configuration of Memory Cell Array 11)

FIG. 4 is an example of a circuit configuration of the memory cell array 11 included in the NAND-type flash memory in the first embodiment, in which the single block BLK is extracted and shown. The block BLK includes, for example, four string units SU0 to SU3, as shown in FIG. 4. Each of the string units SU includes a plurality of NAND strings NS.

The plurality of NAND strings NS are associated with bit lines BL0 to BLm (m is an integer of 1 or more), respectively. Each of the NAND strings NS includes, for example, memory cell transistors MT0 to MT15, dummy transistors LDT and UDT, and select transistors ST1 and ST2.

The memory cell transistor MT includes a control gate and a charge accumulation layer and nonvolatilely stores data. Each of the dummy transistors LDT and UDT has the same configuration as, for example, the memory cell transistor MT. Further, each of the dummy transistors LDT and UDT is not used for storing data. Each of the select transistors ST1 and ST2 is used for selecting the string unit SU during various operations.

In each of the NAND strings NS, a drain of the select transistor ST1 is connected to the associated bit line BL. The memory cell transistors MT8 to MT15 are connected in series between a source of the select transistor ST1 and a drain of the dummy transistor UDT. A source of the dummy transistor UDT is connected to a drain of the dummy transistor LDT. The memory cell transistors MT0 to MT7 are connected in series between a source of the dummy transistor LDT and a drain of the select transistor ST2.

In the same block BLK, gates of the select transistors ST1 included in the string units SU0 to SU3 are commonly connected to the select gate lines SGD0 to SGD3, respectively. Control gates of the memory cell transistors MT0 to MT15 are commonly connected respectively to word lines WL0 to WL15. Control gates of the dummy transistors UDT and LDT are commonly connected respectively to dummy word lines UDWL and LDWL. A gate of the select transistor ST2 is commonly connected to a select gate line SGS.

Different column addresses are allocated to the bit lines BL0 to BLm. Each of the bit lines BL is commonly connected to the select transistor ST1 of the corresponding NAND string NS between the blocks BLK. Each of the word lines WL0 to WL15 and the dummy word lines UDWL and LDWL is provided for each of the blocks BLK. A source line SL is shared between, for example, the blocks BLK.

A group of the memory cell transistors MT connected to the common word line WL in the single string unit SU is referred to as a cell unit CU, for example. For example, the storage capacity of the cell unit CU including the memory cell transistors MT each storing 1 bit data is defined as "one page data". The cell unit CU may have a storage capacity of two or more page data according to the number of bits of data stored in the memory cell transistor MT.

It should be noted that the configuration of the NAND-type flash memory 10 described above is merely an example, and the present invention is not limited thereto. For example, the number of the memory cell transistors MT and the select transistors ST1 and ST2 included in each of the NAND strings NS may be designed in any number. The number of the string units SU included in each of the blocks BLK may be designed in any number. The arrangement and number of transistors to be set as dummy transistors may be determined to arbitrary arrangement and number.

(Configuration of Memory Cell Array 11)

Hereinafter, an example of a configuration of the memory cell array 11 included in the NAND-type flash memory 10 in the first embodiment will be described. In the drawings referred to below, the X direction corresponds to an extending direction of the word line WL, the Y direction corresponds to an extending direction of the bit line BL, and the Z direction corresponds to a vertical direction corresponding to a surface of a semiconductor substrate 40 on which the NAND-type flash memory 10 is formed. In the cross-sectional views referred to below, constituent elements such as an insulating layer (interlayer insulating film), wiring, and a contact are appropriately omitted in order to make the figure easy to see. In the plan view, hatching is given as appropriate to make the figure easy to see. The hatching given to the plan view is not necessarily related to the material or characteristics of the hatched component.

FIG. 5 is an example of a planar layout of the memory cell array 11 included in the NAND-type flash memory 10 in the first embodiment, and extracts and illustrates the respective structures corresponding to the string units SU0 and SU1. As shown in FIG. 5, a region where the memory cell array 11 is formed includes, for example, a plurality of slits SLT, the string units SU, and the bit lines BL.

Each of the slits SLT extends in the X direction and is arranged in the Y direction. For example, the single string unit SU is disposed between the slits SLT adjacent to each other in the Y direction.

Each of the string units SU includes a plurality of memory pillars MP. The memory pillars MP are arranged, for example, in a zigzag manner spreading in the XY plane. Each of the memory pillars MP functions as, for example, the single NAND string NS.

The bit lines BL each extend in the Y direction and are arranged in the X direction. For example, each of the bit lines BL is disposed so as to overlap with at least one of the memory pillars MP for each of the string units SU. In this example, the two bit lines BL are arranged to overlap each other in each of the memory pillars MP.

A contact CP is provided between one of the bit lines BL overlapping the memory pillar MP and the memory pillar MP. Each of the memory pillars MP is electrically connected to the corresponding bit line BL via the contact CP.

FIG. 6 is a cross-sectional view taken along the line VI-VI of FIG. 5 and shows an example of a cross-sectional structure of the memory cell array 11 included in the NAND-type flash memory 10 in the first embodiment. As shown in FIG. 6, for example, the semiconductor substrate 40, conductor layers 41 to 48, the memory pillar MP, and the contact CP are included in the region where the memory cell array 11 is formed.

Specifically, the conductor layer 41 is provided above the semiconductor substrate 40 with an insulating layer interposed therebetween. For example, the conductor layer 41 is formed in a plate shape extending along the XY plane and used as the source line SL. Although not shown, circuits such as the sense amplifier module 19 are provided in a region between the semiconductor substrate 40 and the conductor layer 41.

On the conductor layer 41, the slits SLT extending along an XZ plane are arranged in the Y direction. An insulator is embedded in the slit SLT.

On the conductor layer 41 and between the adjacent slits SLT, the conductor layer 42, the eight conductor layers 43, the conductor layer 44, the conductor layer 45, the eight conductor layers 46, and the conductor layer 47 are provided in order from the lower layer. Among these conductor layers, the conductor layers adjacent to each other in the Z direction are stacked via an interlayer insulating film. Each of the conductor layers 42 to 47 is formed in a plate shape along the XY plane.

The conductor layer 42 is used as the select gate line SGS. The eight conductor layers 43 are used respectively as the word lines WL0 to WL7 in order from the lower layer. The conductor layers 44 and 45 are used as the dummy word lines LDWL and UDWL, respectively. The eight conductor layers 46 are used respectively as the word lines WL8 to WL15 in order from the lower layer. The conductor layer 47 is used as the select gate line SGD.

The conductor layer 48 is provided above the conductor layer 47 with an insulating layer interposed therebetween. For example, the conductor layer 48 is formed in a line shape extending along the Y direction and is used as the bit line BL. That is, the conductor layers 48 are arranged along the X direction in a region not shown.

Each of the memory pillars MP is formed in a columnar shape extending along the Z direction and penetrates, for example, the conductor layers 42 to 47. For example, an upper end of the memory pillar MP is included in a layer between a layer provided with the conductor layer 47 and a layer provided with the conductor layer 48. A lower end of the memory pillar MP is in contact with the conductor layer 41.

Further, each of the memory pillars MP includes a plurality of columnar portions connected in the Z direction. Specifically, the structure of the memory pillar MP may be classified into a lower pillar LMP, an upper pillar UMP, and a joint JT.

The upper pillar UMP is provided above the lower pillar LMP. The lower pillar LMP and the upper pillar UMP are bonded to each other, for example, via the joint JT. For example, the outer diameter of the joint JT is larger than the outer diameter of a contact portion between the lower pillar LMP and the joint JT, and larger than the outer diameter of a contact portion between the upper pillar UMP and the joint JT. The distance in the Z direction of a joint layer provided with the joint JT (the distance between the conductor layers 44 and 45) is wider than the distance between the adjacent conductor layers 43 and is wider than the distance between the adjacent conductor layers 46.

A detailed configuration inside the memory pillar MP will be described below.

Figure 7:
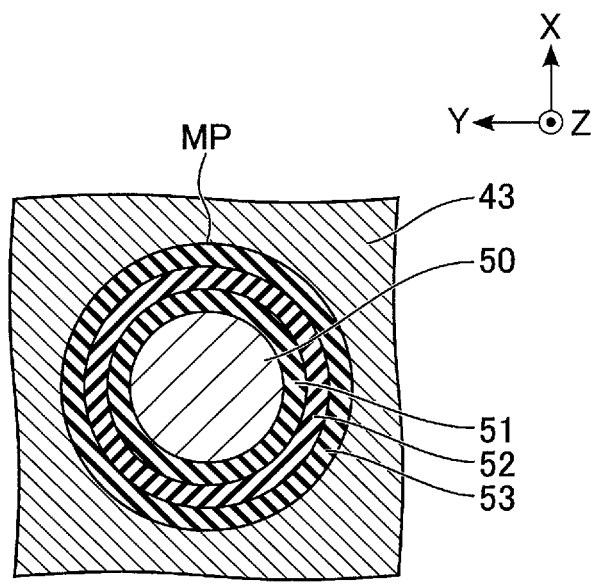
FIG. 7 is a cross-sectional view showing an example of a cross-sectional structure of a memory pillar included in the memory cell array included in the NAND-type flash memory in the first embodiment.

FIG. 7 is a cross-sectional view taken along the line VII-VII of FIG. 6 and shows an example of a cross-sectional structure of the memory pillar MP and the word line WL in a layer including the conductor layer 43. As shown in FIG. 7, the memory pillar MP includes, for example, a semiconductor member 50, a tunnel oxide film 51, an insulating film 52, and a block insulating film 53.

In the layer including the conductor layer 43, the semiconductor member 50 is provided at a central portion of the memory pillar MP. The tunnel oxide film 51 surrounds a side surface of the semiconductor member 50. The insulating film 52 surrounds a side surface of the tunnel oxide film 51. The block insulating film 53 surrounds a side surface of the insulating film 52. The conductor layer 43 surrounds a side surface of the block insulating film 53. In other words, the block insulating film 53 is provided on an inner wall of a memory hole forming a memory pillar MH. The insulating film 52 is provided on an inner wall of the block insulating film 53. The tunnel oxide film 51 is provided on an inner wall of the insulating film 52. The semiconductor member 50 is provided on an inner wall of the tunnel oxide film 51.

The cross-sectional structure of the memory pillar MP in other portions is the same as the cross-sectional structure described with reference to FIG. 7, for example, so that the description thereof is omitted. In the memory pillar MP, a material different from that of the semiconductor member 50 may be included in an inner wall of the semiconductor member 50.

In the configuration of the memory pillar MP described above, for example, a portion where the memory pillar MP intersects the conductor layer 42 functions as the select transistor ST2. A portion where the memory pillar MP intersects the conductor layer 43 and a portion where the memory pillar MP intersects the conductor layer 46 each function as the memory cell transistor MT.

A portion where the memory pillar MP intersects the conductor layer 44 functions as the dummy transistor LDT. A portion where the memory pillar MP intersects the conductor layer 45 functions as the dummy transistor LDT. A portion where the memory pillar MP intersects the conductor layer 46 functions as the select transistor ST1.

That is, the semiconductor member 50 functions as a channel of each of the memory cell transistor MT, the dummy transistors LDT and UDT, and the select transistors ST1 and ST2. The insulating film 52 functions as a charge accumulation layer of the memory cell transistor MT. Each of the select transistor ST2, the memory cell transistors MT0 to MT7, and the dummy transistor LDT is provided corresponding to the lower pillar LMP. Each of the select transistor ST1, the memory cell transistors MT8 to MT15, and the dummy transistor UDT is provided corresponding to the upper pillar UMP.

Returning to FIG. 6, a columnar contact CP is provided on the semiconductor member 50 in each of the memory pillars MP. The single conductor layer 48, that is, the single bit line BL is in contact with an upper surface of the contact CP. The memory pillar MP and the conductor layer 48 may be electrically connected via two or more contacts or may be electrically connected via other wiring.

In one example of the structure of the memory cell array 11 described above, the structure on the conductor layer 41 and between the adjacent slits SLT corresponds to the string unit SU. The present invention is not limited thereto, and the structure of the memory cell array 11 may be other structures.

For example, the number of the string units SU provided between the adjacent slits SLT may be designed in any number. The number and arrangement of the memory pillars MP shown in FIG. 5 are merely examples, and the memory pillars MP may be designed in any number and arrangement. The number of the bit lines BL overlapping with each of the memory pillars MP may be designed in any number.

The memory cell transistor MT, the dummy transistors UDT and LDT, and the select transistors ST1 and ST2 included in each of the NAND string NS may each be designed in any number. The number of the word lines WL, the dummy word lines UDWL and LDWL, and the select gate lines SGD and SGS may be changed based on the number of the memory cell transistors MT, the dummy transistors UDT and LDT, and the select transistors ST1 and ST2, respectively. The conductor layers 42 provided in a plurality of layers may be allocated to the select gate line SGS. The conductor layers 47 provided in a plurality of layers may be allocated to the select gate line SGD.

The memory pillar MP may have a structure in which a pillar penetrating the conductor layer 47 and a pillar penetrating the other conductor layers 42 to 46 are connected in the Z direction. Each of the memory pillars MP may not have the joint JT. When each of the memory pillars MP does not have the joint JT, the upper pillar UMP and the lower pillar LMP in the memory pillar MP are directly connected without interposition of the joint JT. A conductor layer used as a dummy word line may be included between the lowermost conductor layer 43 and the conductor layer 42. Similarly, a conductor layer used as a dummy word line may be included between the uppermost conductor layer 46 and the conductor layer 47.

[1-1-4] Circuit Configuration of Row Decoder Module 18

FIG. 8 shows an example of a circuit configuration of the row decoder module 18 included in the NAND-type flash memory 10 in the first embodiment and further shows wiring between the voltage generator 17 and the memory cell array 11. As shown in FIG. 8, the row decoder module 18 includes, for example, row decoders RD0 to RDn. The row decoders RD0 to RDn are associated with the blocks BLK0 to BLKn, respectively.

Hereinafter, a detailed circuit configuration of the row decoder RD will be described, focusing on the row decoder RD0 corresponding to the block BLK0. Since circuit configurations of the other row decoders RD are similar to the circuit configuration of the row decoder RD0, the description thereof will be omitted.

The row decoder RD includes, for example, a block decoder BD and transistors TR0 to TR22. The block decoder BD decodes the block address and applies a predetermined voltage to a transfer gate line TG based on the decoding result. The transfer gate line TG is commonly connected to gates of the transistors TR0 to TR22. Each of the transistors TR0 to TR22 is an n-channel MOS transistor with high withstand voltage.

The transistor TR is connected between a signal line wired from the voltage generator 17 and a wire provided in the block BLK0. Specifically, a drain of the transistor TR0 is connected to a signal line SGSD. A source of the transistor TR0 is connected to the select gate line SGS of the block BLK0.

Drains of the transistors TR1 to TR8 are connected to the signal lines CG0 to CG7, respectively. Sources of the transistors TR1 to TR8 are connected to the respective one ends of the word lines WL0 to WL7 corresponding to the block BLK0. A drain of the transistor TR9 is connected to a signal line LCGD. A source of the transistor TR9 is connected to the dummy word line LDWL. A drain of the transistor TR10 is connected to a signal line UCGD. A source of the transistor TR10 is connected to the dummy word line UDWL.

Drains of the transistors TR11 to TR18 are connected to the signal lines CG8 to CG15, respectively. Sources of the transistors TR11 to TR18 are connected to the respective one ends of the word lines WL8 to WL15 corresponding to the block BLK0. Drains of the transistors TR19 to TR22 are connected to signal lines SGDD0 to SGDD3, respectively. Sources of the transistors TR19 to TR22 are connected to select gate lines SGD0 to SGD3, respectively.

With the above configuration, the row decoder module 18 can select the block BLK executing various operations. Specifically, during various operations, the block decoder BD corresponding to the selected block BLK applies a voltage of "H" level to the transfer gate line TG, and the block decoder BD corresponding to the unselected block BLK applies a voltage of "L" level to the transfer gate line TG.

In this specification, the "H" level corresponds to the voltage at which the n-channel MOS transistor is turned on and the p-channel MOS transistor is turned off. The "L" level corresponds to the voltage at which the n-channel MOS transistor is turned off and the p-channel MOS transistor is turned on.

For example, when the block BLK0 is selected, the transistors TR0 to TR22 included in the row decoder RD0 are turned on, and the transistors TR0 to TR22 included in the other row decoders RD are turned off. In this case, a current path is formed between various wires provided in the block BLK0 and the corresponding signal line, and a current path between various wires provided in another block BLK and the corresponding signal line is shut off.

As a result, a voltage applied to each signal line by the voltage generator 17 is applied to various wires provided in the selected block BLK0 via the row decoder RD0. The row decoder module 18 can operate in the same manner even when another block BLK is selected.

It should be noted that the configuration of the row decoder module 18 described above is merely an example, and the present invention is not limited thereto. For example, the number of the transistors TR included in the row decoder module 18 may be designed in number based on the number of wires provided in each of the blocks BLK.

[1-1-5] Circuit Configuration of Sense Amplifier Module 19

Figure 9:
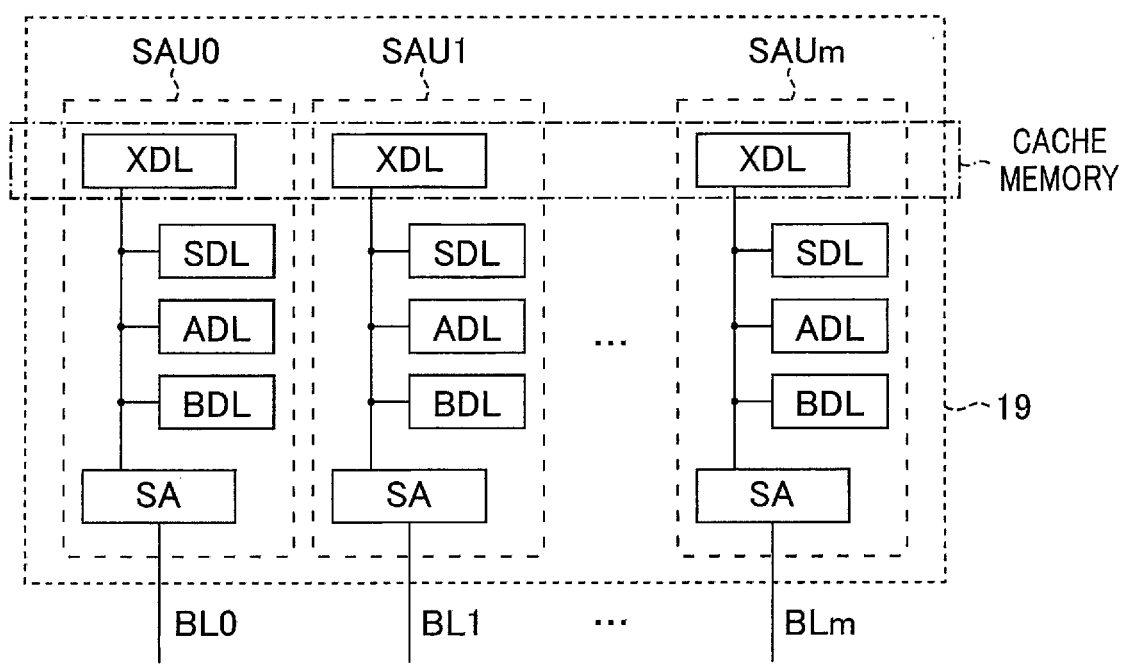
FIG. 9 is a circuit diagram showing an example of a circuit configuration of a sense amplifier module included in the NAND-type flash memory in the first embodiment.

FIG. 9 shows an example of a circuit configuration of the sense amplifier module 19 included in the NAND-type flash memory 10 in the first embodiment. As shown in FIG. 9, the sense amplifier module 19 includes, for example, sense amplifier units SAU0 to SAUm. The sense amplifier units SAU0 to SAUm are associated respectively with the bit lines BL0 to BLm.

Each of the sense amplifier units SAU includes, for example, a sense amplifier part SA and latch circuits SDL, ADL, BDL, and XDL. The sense amplifier part SA and the latch circuits SDL, ADL, BDL, and XDL are connected so as to be capable of transmit and receive data to and from each other.

The sense amplifier part SA determines whether the read data is "0" or "1" based on the voltage of the corresponding bit line BL in the read operation, for example. In other words, the sense amplifier part SA senses the read data on the corresponding bit line BL and determines data to be stored in the selected memory cell.

Each of the latch circuits SDL, ADL, BDL, and XDL temporarily retains read data, write data, and the like. The latch circuit XDL is connected to an input/output circuit (not shown) and may be used for data input/output between the sense amplifier unit SAU and the input/output circuit. The latch circuit XDL may be used as a cache memory of the NAND-type flash memory 10. For example, even if the latch circuits SDL, ADL, and BDL are being used, the NAND-type flash memory 10 can be held in the ready state if the latch circuit XDL is not used.

FIG. 10 shows an example of a circuit configuration of the sense amplifier unit SAU included in the sense amplifier module 19 included in the NAND-type flash memory 10 in the first embodiment. As shown in FIG. 10, the sense amplifier part SA includes, for example, transistors 60 to 68 and a capacitor 69. The latch circuit SDL includes, for example, transistors 70 and 71 and inverters 72 and 73.

For example, the transistor 60 is a p-channel MOS transistor. Each of the transistors 61 to 68, 70 and 71 is an n-channel MOS transistor. Transistor 63 is an n-channel MOS transistor with high withstand voltage.

One end of the transistor 60 is connected to a power supply line. A gate of the transistor 60 is connected to a node INV (SDL) of the latch circuit SDL. For example, a power supply voltage Vdd is applied to the power supply line connected to one end of the transistor 60. One end of the transistor 61 is connected to the other end of the transistor 60. The other end of the transistor 61 is connected to a node COM. A control signal BLX is input to a gate of the transistor 61.

One end of the transistor 62 is connected to the node COM. A control signal BLC is input to a gate of the transistor 62. One end of the transistor 63 is connected to the other end of the transistor 62. The other end of the transistor 63 is connected to the corresponding bit line BL. A control signal BLS is input to a gate of the transistor 63. One end of the transistor 64 is connected to the node COM. The other end of the transistor 64 is connected to a node SRC. A gate of the transistor 64 is connected to the node INV (SDL). For example, a ground voltage Vss is applied to the node SRC. One end of the transistor 65 is connected to the other end of the transistor 60. The other end of the transistor 65 is connected to a node SEN. A control signal HLL is input to a gate of the transistor 65.

One end of the transistor 66 is connected to the node SEN. The other end of the transistor 66 is connected to the node COM. A control signal XXL is input to a gate of the transistor 66. One end of the transistor 67 is grounded. A gate of the transistor 67 is connected to the node SEN. One end of the transistor 68 is connected to the other end of the transistor 67. The other end of the transistor 68 is connected to a bus LBUS. A control signal STB is input to a gate of the transistor 68. One end of the capacitor 69 is connected to the node SEN. A clock CLK is input to the other end of the capacitor 69.

In the latch circuit SDL, one end of each of the transistors 70 and 71 is connected to the bus LBUS. The other ends of the transistors 70 and 71 are connected to the node INV and a node LAT, respectively. Control signals STI and STL are input to the respective gates of the transistors 70 and 71. An input node of the inverter 72 and an output node of the inverter 73 are connected to the node LAT. An output node of the inverter 72 and an input node of the inverter 73 are connected to the node INV.

The circuit configuration of the latch circuits ADL, BDL and XDL is the same as the circuit configuration of the latch circuit SDL, for example. On the other hand, in the latch circuit ADL, control signals ATI and ATL are input to the respective gates of the transistors 70 and 71. In each of the latch circuits BDL and XDL, a control signal different from that for the latch circuit SDL is input to each of the transistors 70 and 71. The nodes INV and LAT of each of the latch circuits SDL, ADL, BDL, and XDL are each independently provided.

Each of the control signals BLX, BLC, BLS, HLL, XXL, STB, STI, STL, ATI and ATL described above is generated by the sequencer 15, for example. For example, the sequencer 15 can independently control the latch circuits SDL, ADL, BDL, and XDL.

The timing at which the sense amplifier part SA determines data read out to the bit line BL is based on the timing at which the sequencer 15 asserts the control signal STB. In the following description, the expression "asserts the control signal STB" corresponds to an operation in which the sequencer 15 temporarily changes the control signal STB from "L" level to "H" level.

It should be noted that the configuration of the sense amplifier module 19 described above is merely an example, and the present invention is not limited thereto. For example, the number of latch circuits included in the sense amplifier module 19 may be appropriately changed based on the number of bits of data stored in the memory cell transistor MT. Depending on the circuit configuration of the sense amplifier module 19, the operation corresponding to the expression "asserts the control signal STB" may correspond to an operation in which the sequencer 15 temporarily changes the control signal STB from "H" level to "L" level.

[1-1-6] Data Assignment

Figure 11:
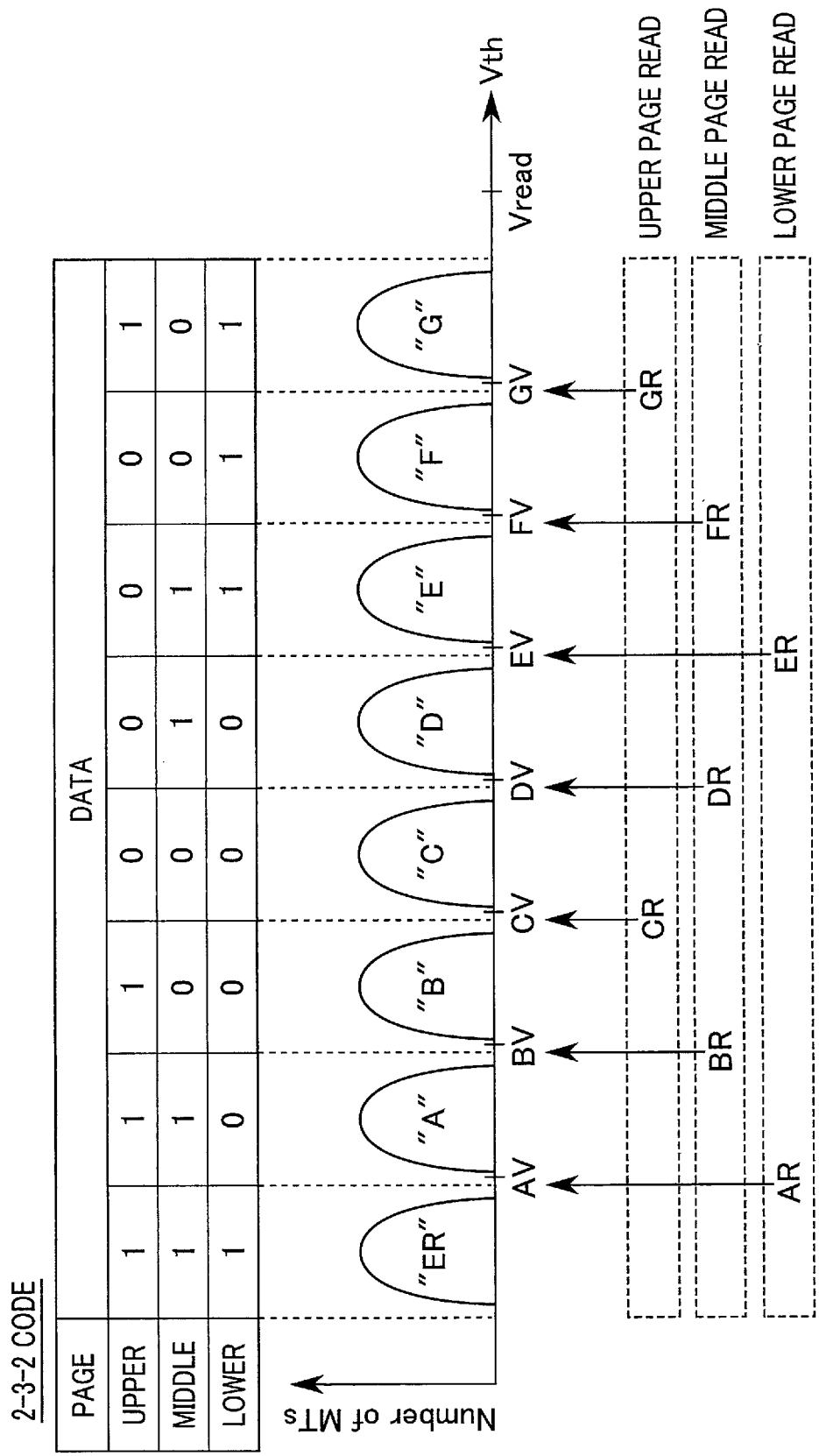
FIG. 11 is a diagram showing an example of threshold distribution, read voltage, and verify voltage of a memory cell transistor in the memory system according to the first embodiment.

FIG. 11 shows an example of threshold distribution, read voltage, and verify voltage of the memory cell transistor MT in the memory system 1 according to the first embodiment. In the threshold distribution shown in FIG. 11, the vertical axis corresponds to the number of the memory cell transistors MT, and the horizontal axis corresponds to a threshold voltage of the memory cell transistor MT. As shown in FIG. 11, in the memory system 1 according to the first embodiment, for example, eight types of threshold distributions may be formed by the threshold voltages of the memory cell transistors MT included in the single cell unit CU.

In this specification, the eight types of threshold distributions (write states) are referred to as "ER" state, "A" state, "B" state, "C" state, "D" state, "E" state, "F" state, and "G" state in order from the lower threshold voltage.

Read voltages to be used in the read operation are respectively set between adjacent threshold distributions. For example, a read voltage AR is set between the maximum threshold voltage at the "ER" state and the minimum threshold voltage at the "A" state. Likewise, a read voltage BR is set between the "A" state and the "B" state. A read voltage CR is set between the "B" state and the "C" state. A read voltage DR is set between the "C" state and the "D" state. A read voltage ER is set between the "D" state and the "E" state. A read voltage FR is set between the "E" state and the "F" state. A read voltage GR is set between the "F" state and the "G" state.

For example, in a case where the read voltage AR is applied to the gate of the memory cell transistor MT, the memory cell transistor MT is turned on when the threshold voltage is distributed at the "ER" state, and the memory cell transistor MT is turned off when the threshold voltage is distributed at the "A" state or more. Similarly, in a case where the read voltage BR is applied to the gate of the memory cell transistor MT, the memory cell transistor MT is turned on when the threshold voltage is included at the "A" state or less, and the memory cell transistor MT is turned off when the threshold voltage is included at the "B" state or more. Even when another read voltage is applied to the gate of the memory cell transistor MT, the memory cell transistor MT is appropriately turned on or off according to the threshold voltage.

As a voltage higher than the highest threshold distribution, a read pass voltage Vread is set. Specifically, the read pass voltage Vread is set to be higher than the maximum threshold voltage at the "G" state, for example. When the read pass voltage Vread is applied to the gate of the memory cell transistor MT, the memory cell transistor MT is retained in an on state regardless of stored data.

The verify voltages to be used in the write operation are respectively set between adjacent threshold distributions. Specifically, verify voltages AV, BV, CV, DV, EV, FV, and GV are set respectively corresponding to the "A" state, the "B" state, the "C" state, the "D" state, the "E" state, the "F" state, and the "G" state.

For example, the verify voltage AV is set between the maximum threshold voltage at the "ER" state and the minimum threshold voltage at the "A" state and near the "A" state. The verify voltage BV is set between the maximum threshold voltage at the "A" state and the minimum threshold voltage at the "B" state and near the "B" state. Similarly, other verify voltages are set near the corresponding write state. That is, the verify voltages AV, BV, CV, DV, EV, FV and GV are set to be higher than the read voltages AR, BR, CR, DR, ER, FR and GR, respectively.

In the write operation, when the memory system 1 detects that the threshold voltage of the memory cell transistor MT storing certain data has exceeded the verify voltage corresponding to this data, the memory system 1 completes a program of the memory cell transistor MT.

Different 3-bit data are assigned to the threshold distributions of the eight types of memory cell transistors MT described above. Below is an example of data assignment for threshold distribution.

"ER" state: "111 (high order bit/middle order bit/low order bit)" data
  "A" state: "110" data
  "B" state: "100" data
  "C" state: "000" data
  "D" state: "010" data
  "E" state: "011" data
  "F" state: "001" data
  "G" state: "101" data.

When such data assignment is applied, one page data (lower page data) including low order bits is determined by read processing using the read voltages AR and ER. One page data (middle page data) including middle order bits is determined by read processing using the read voltages BR, DR and FR. One page data (upper page data) including high order bits is determined by read processing using the read voltages CR and GR.

That is, the lower page data, the middle page data, and the upper page data are determined by the read processing using two types, three types, and two types of read voltages, respectively. Such data assignment is referred to as "2-3-2 code", for example. In this specification, the case where the "2-3-2 code" is applied to data assignment to the memory cell transistor MT will be described as an example.

[1-2] Operation

Next, an operation of the memory system 1 according to the first embodiment will be described. The memory system 1 according to the first embodiment spontaneously executes the patrol operation during a period in which operation based on an instruction from the host device 2 is not being executed. In the patrol operation, an optimum read voltage is searched using a tracking read or a shift read, and a correction value is recorded on the LUT. Further, the patrol operation has a purpose of detecting defects to check whether or not data stored in the cell unit CU can be read out. Details of the tracking read, the shift read, and the patrol operation will be sequentially described below.

[1-2-1] Tracking Read

An initial value of a read voltage is set such that the number of error bits decreases when, for example, the memory cell transistors MT included in the cell unit CU form ideal threshold distribution. However, there is a possibility that the threshold voltage of the memory cell transistor MT changes after the write operation.

Thus, the memory system 1 according to the first embodiment executes the tracking read in order to detect valleys of the threshold distribution. The tracking read executed by the memory system 1 according to the first embodiment is executed inside the NAND-type flash memory 10.

FIG. 12 shows an example of the read voltage used in tracking read in the NAND-type flash memory 10 in the first embodiment and two adjacent threshold distributions ("B" state and "C" state). In FIG. 12, the solid line corresponds to the threshold distribution immediately after writing, and the broken line corresponds to the threshold distribution after the threshold voltage fluctuates. As shown in FIG. 12, even though the threshold distribution of the memory cell transistor MT is ideally distributed immediately after the write operation, a reduction due to passage of time or an increase due to read disturbance or the like may occur after the write operation.

Further, in the memory cell transistor MT in which a cycle of writing and erasing is repeated, the data retention characteristics may deteriorate, and the threshold voltage may more significantly vary. When such a variation in the threshold voltage occurs, the number of error bits increases in read operation using a preset read voltage, and there is a possibility that error correction becomes difficult.

On the other hand, the NAND-type flash memory 10 in the first embodiment can search an optimum read voltage by executing tracking read. In the tracking read, read operation using a plurality of read voltages is executed, and a read voltage at which the number of error bits is the smallest is searched.

For example, in the tracking read corresponding to the read voltage CR, read operations using respective tracking voltages CRt1, CRt2, CRt3, CRt4 and CRt5 are executed continuously. The read operations thus executed continuously using the tracking voltages are hereinafter referred to as tracking.

The tracking voltages are set to arbitrary values, and a distance (step-up voltage) from an adjacent tracking voltage is set to be substantially constant, for example. A relationship between these voltage values is CRt1<CRt2<CRt3<CRt4<CRt5. A relationship with the initial value of the read voltage is CRt1<CR<CRt5.

In the tracking read corresponding to the other read voltages, the tracking voltage is set similarly to the tracking read corresponding to the read voltage CR. The number of tracking voltages used in the tracking read may be different for each read voltage, and may be set to an arbitrary number.

Similarly, the step-up voltage in the tracking read may be different for each read voltage, and may be set to an arbitrary number.

When the read operations using the respective tracking voltages CRt1, CRt2, CRt3, CRt4 and CRt5 are executed in the tracking read corresponding to the read voltage CR, the sequencer 15 detects a valley portion between the threshold distribution at the "B" state and the threshold distribution at the "C" state based on, for example, the number of ON cells of the memory cell transistor MT.

Then, the sequencer 15 determines the optimum read voltage based on the detected valley portion of the threshold distribution. Thereafter, the sequencer 15 executes read operation using an estimated optimum read voltage. In this read operation, for example, one of the tracking voltages used for the tracking read is used as the optimum read voltage.

Hereinafter, a command sequence corresponding to the tracking read, a voltage applied to the selected word line WL, and operation of the control signal STB will be described.

In the following description, the selected word line WL is referred to as a selected word line WLsel. It is assumed that a ready/busy signal RBn is "H" level (ready state) before the NAND-type flash memory 10 starts operation, the voltage of the selected word line WLsel is Vss, and the control signal STB is "L" level.

In the operation described below, a voltage is applied to the selected word line WLsel by the voltage generator 17 and the row decoder module 18. Address information received by the NAND-type flash memory 10 is held in the address register 13B. A command received by the NAND-type flash memory 10 is held in the command register 13C.

Figure 13:
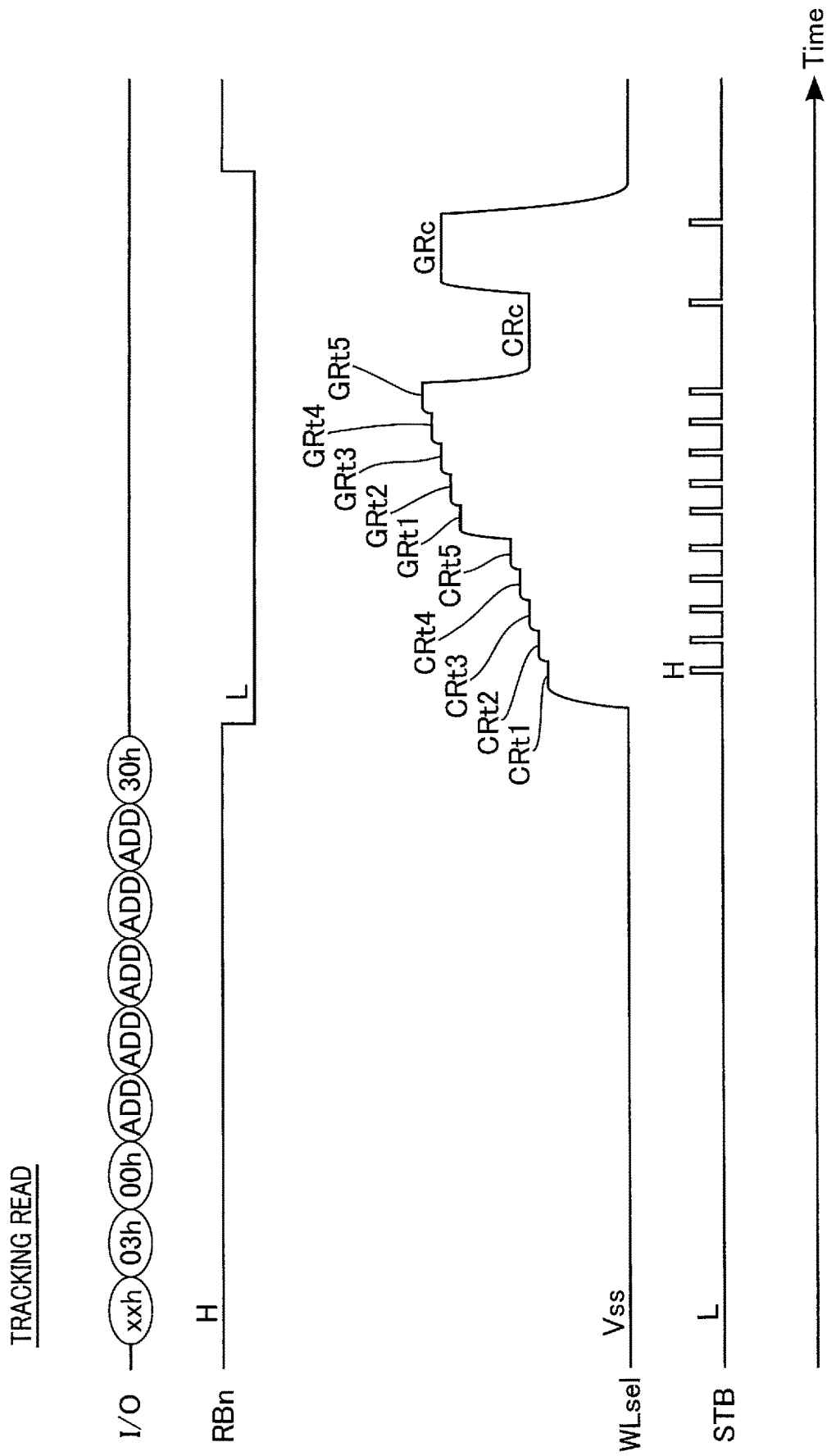
FIG. 13 is a timing chart showing an example of tracking read in the memory system according to the first embodiment.

FIG. 13 is a timing chart showing an example of tracking read in the memory system 1 according to the first embodiment and shows an example of tracking read corresponding to read operation of the upper page. As shown in FIG. 13, when tracking read of the upper page is executed, the memory controller 20 transmits, for example, a command "xxh", a command "03h", a command "00h", address information "ADD" of five cycles, and a command "30h" to the NAND-type flash memory 10 in this order.

The command "xxh" is a command instructing the NAND-type flash memory 10 to execute tracking read. The command "03h" is a command instructing the NAND-type flash memory 10 to perform the operation corresponding to the upper page. The command "00h" is a command instructing the NAND-type flash memory 10 to execute read operation. The address information "ADD" of five cycles is address information corresponding to the cell unit CU to be operated and may include a block address, a column address, a page address, and the like. The command "30h" is a command instructing the NAND-type flash memory 10 to start read operation based on a command, an address and the like received immediately before.

Upon receiving the command "30h", the NAND-type flash memory 10 transitions from the ready state to the busy state (RBn="L" level), and the sequencer 15 starts tracking read.

When the tracking read of the upper page starts, for example, the tracking voltages CRt1, CRt2, CRt3, CRt4 and CRt5 corresponding to the read voltage CR and tracking voltages GRt1, GRt2, GRt3, GRt4, and GRt5 corresponding to the read voltage GR are sequentially applied to the selected word line WLsel.

The sequencer 15 asserts the control signal STB while each tracking voltage is being applied to the selected word line WLsel. Then, the sequencer 15 estimates an optimum read voltage CRc corresponding to the read voltage CR based on the read results of the tracking voltages CRt1 to CRt5 and estimates an optimum read voltage GRc corresponding to the read voltage GR based on the read results of the tracking voltages GRt1 to GRt5. A correction value corresponding to the optimum read voltage obtained by the tracking read is held in the status register 13A, for example.

Thereafter, the optimum read voltages CRc and GRc are sequentially applied to the selected word line WLsel. The sequencer 15 asserts the control signal STB while the optimum read voltages CRc and GRc are being applied to the selected word line WLsel.

The read result based on the optimum read voltage CRc is held in a latch circuit ABL in each of the sense amplifier units SAU, for example. Thereafter, read data of the upper page is calculated based on the read result based on the optimum read voltage GRc and the read result based on the optimum read voltage CRc held in the latch circuit ABL. The calculation result is held in the latch circuit XDL in each of the sense amplifier units SAU, for example.

When the read data of the upper page is thus determined, the sequencer 15 terminates the tracking read of the upper page and makes the NAND-type flash memory 10 transition from the busy state to the ready state.

The read result using the optimum read voltage obtained by the tracking read described above may be output to the memory controller 20 based on an instruction from the memory controller 20. The correction value corresponding to the optimum read voltage obtained by the tracking read is output to the memory controller 20 based on the instruction from the memory controller 20 and may be recorded in the LUT in the RAM 22, for example.

The memory system 1 can also execute tracking read of each of the middle and lower pages in the same manner as the tracking read of the upper page. In the tracking read of the lower page, for example, a command "01h" is used instead of the command "03h". The command "01h" is a command instructing the NAND-type flash memory 10 to perform the operation corresponding to the lower page. In the tracking read of the middle page, for example, a command "02h" is used instead of the command "03h". The command "02h" is a command instructing the NAND-type flash memory 10 to perform the operation corresponding to the middle page.

In the tracking read of each of the lower and middle pages, the tracking voltage and the read voltage to be used are appropriately changed. Since the other operations in the tracking read of each of the lower and middle pages are the same as those in the tracking read of the upper page, their explanations are omitted.

[1-2-2] Shift Read

In the memory system 1 according to the first embodiment, the shift read using the tracking result (optimum read voltage) obtained by the tracking read is executed. The shift read is read operation in which the read voltage to be used is shifted from the initial value with respect to normal read operation. The shift amount of the read voltage in the shift read is set beforehand by setting change operation to be described later.

Figure 14:
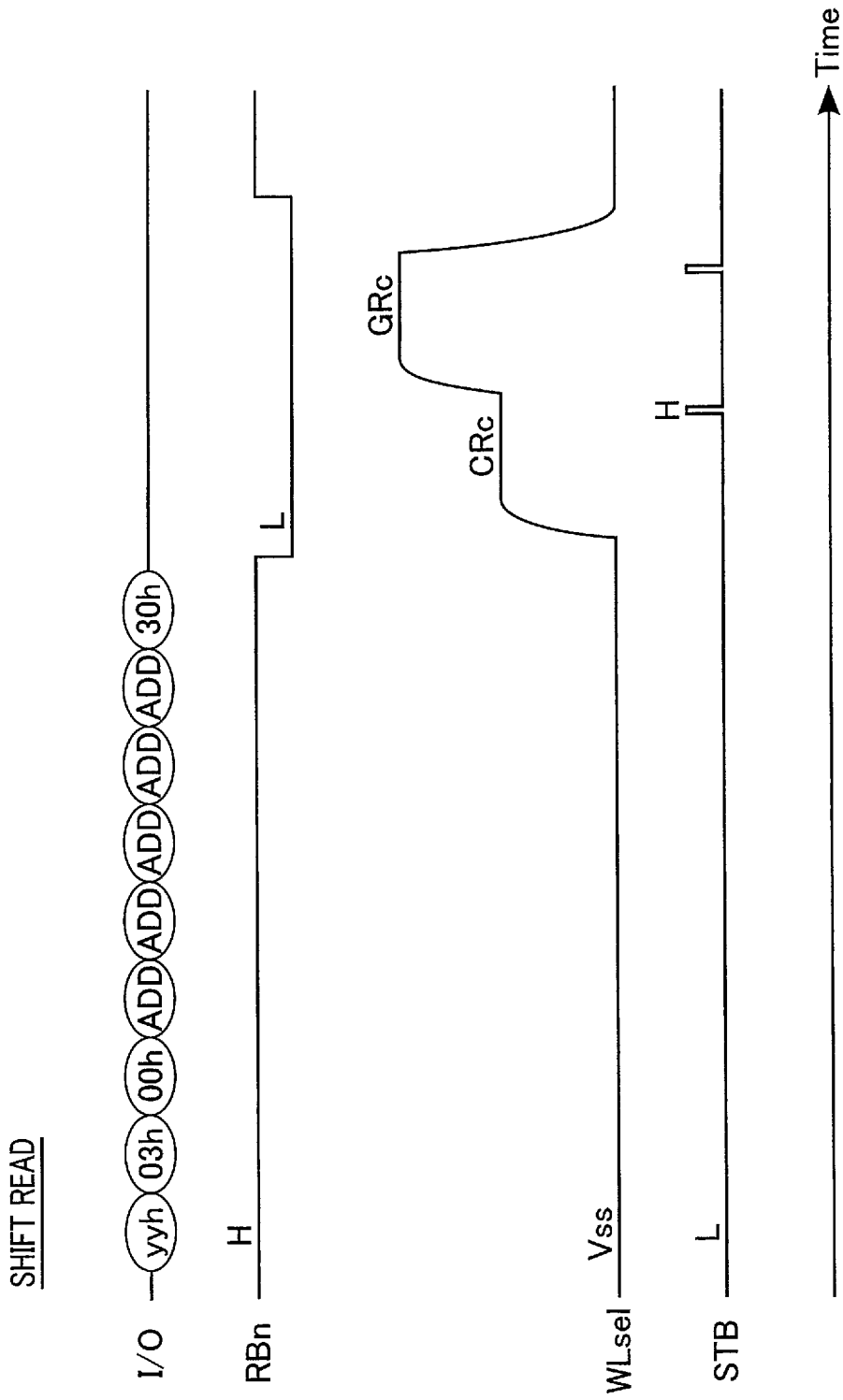
FIG. 14 is a timing chart showing an example of shift reading in the memory system according to the first embodiment.

FIG. 14 is a timing chart showing an example of shift read in the memory system 1 according to the first embodiment and shows an example of shift read corresponding to read operation of the upper page. As shown in FIG. 14, when shift read of the upper page is executed, the memory controller 20 transmits, for example, a command "yyh", the command "03h", the command "00h", the address information "ADD"

of five cycles, and the command "30h" to the NAND-type flash memory 10 in this order.

The command "yyh" is a command instructing the NAND-type flash memory 10 to execute shift read. Upon receiving the command "30h", the NAND-type flash memory 10 transitions from the ready state to the busy state (RBn="L" level), and the sequencer 15 starts shift read.

When the shift read of the upper page starts, the optimum read voltages CRc and GRc are applied sequentially. The sequencer 15 asserts the control signal STB while the optimum read voltages CRc and GRc are being applied to the selected word line WLsel.

For example, the read result based on the optimum read voltage CRc is held in the latch circuit ABL in each of the sense amplifier units SAU, for example. Thereafter, read data of the upper page is calculated based on the read result based on the optimum read voltage GRc and the read result based on the optimum read voltage CRc held in the latch circuit ABL. The calculation result is held in the latch circuit XDL in each of the sense amplifier units SAU, for example.

When the read data of the upper page is thus determined, the sequencer 15 terminates the shift read of the upper page and makes the NAND-type flash memory 10 transition from the busy state to the ready state. Then, the read result using the optimum read voltage obtained by the shift read is output to the memory controller 20 based on an instruction from the memory controller 20.

The memory system 1 can also execute shift read corresponding to each of the middle and lower pages in the same manner as the shift read of the upper page. In the shift read of the lower page, for example, the command "01h" is used instead of the command "03h". In the shift read of the middle page, for example, the command "02h" is used instead of the command "03h". In the shift read of each of the lower and middle pages, the optimum read voltage to be used is appropriately changed. Since the other operations in the shift read of each of the lower and middle pages are the same as those in the shift read of the upper page, their descriptions are omitted.

[1-2-3] Patrol Operation

The memory system 1 according to the first embodiment spontaneously executes the patrol operation during a period in which operation based on an instruction from the host device 2 is not being executed. That is, the memory system 1 according to the first embodiment executes the patrol operation independently of the instruction from the host device 2 during background operation.

The patrol operation contributes to reduction of read error in the memory system 1 and detection of the block BLK in which a defect has occurred. For example, the patrol operation is executed with respect to all the pages in all the blocks BLK for every predetermined repeated period. In other words, all the pages in all the blocks BLK included in each of the NAND-type flash memories 10 are subjected to at least one patrol operation for each predetermined period of time.

In the following description, the predetermined period of time during which the patrol operation is thus executed is referred to as a patrol period. The patrol period is set based on the time measured by the timer 28. The time corresponding to one cycle of the patrol period is, for example, one day. The present invention is not limited thereto, and the time corresponding to one cycle may be set to an arbitrary length. The memory system 1 according to the first embodiment executes history learning and defect detection, for example, in the patrol operation.

The history learning is an operation of confirming an optimum read voltage on a page targeted for the patrol operation. In the history learning, for example, tracking read is executed. A correction value (tracking result) of the read voltage obtained by the tracking read is appropriately transferred to the memory controller 20.

The defect detection is an operation of confirming whether or not it is possible to read data corresponding to the page targeted for the patrol operation. In the defect detection, for example, shift read using a tracking result is executed. The data read by shift read is transferred to the memory controller 20, and error correction processing is executed by the ECC circuit 24.

In the defect detection, if error correction of read data is possible, it is judged that the relevant page can read data. On the other hand, if the error correction of read data is impossible, it is judged that the relevant page is a bad page. For example, if a bad page is included in the block BLK in which the patrol operation is executed, data written in this block BLK is saved in another block BLK.

As described above, the purpose of the patrol operation is to create the correction value of the read voltage by the history learning and to confirm the presence/absence of a physical fault by the defect detection. The history learning does not necessarily have to be executed for all the word lines WL, and it is sufficient that the history learning is executed for an arbitrarily set representative word line WL. On the other hand, the defect detection is aimed at detecting a physical defect such as a short circuit between the word lines WL adjacent to each other, and therefore it is necessary to execute the defect detection for all the word lines WL.

(Command Sequence in Patrol Operation)

Figure 15:
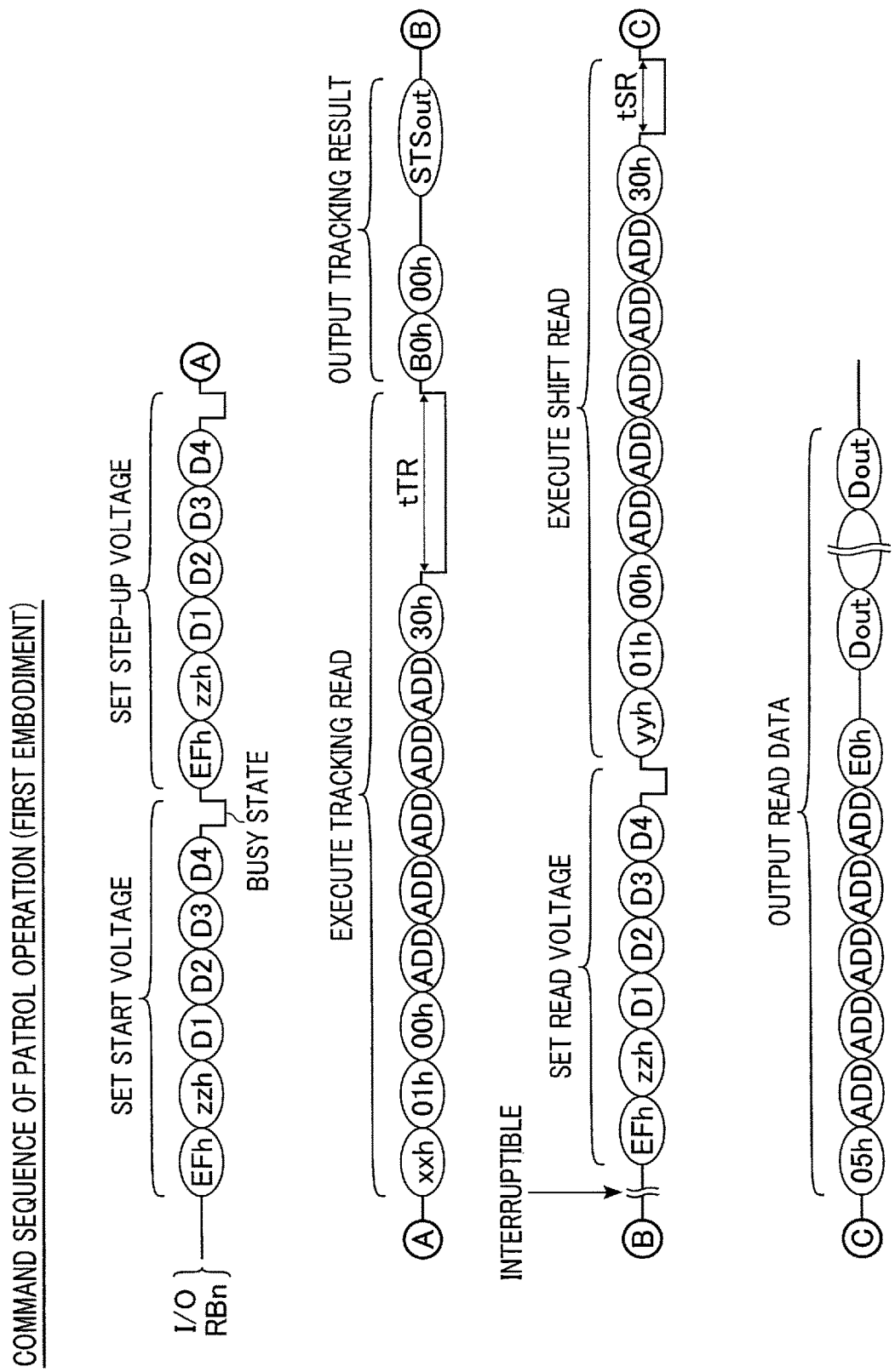
FIG. 15 is a diagram showing an example of a command sequence in patrol operation of the memory system according to the first embodiment.

FIG. 15 shows an example of a command sequence in the patrol operation of the memory system 1 according to the first embodiment. As shown in FIG. 15, for example, when starting the patrol operation, the memory system 1 executes the history learning first. In the history learning, the memory system 1 first executes a setting change operation of a parameter relating to tracking read. This "parameter" is data referred to by the sequencer 15 in various operations, and is held in the register set 13, for example.

In the setting change operation, the memory controller 20 transmits, for example, a command "EFh", an address "zzh", and data "D1", "D2", "D3" and "D4" to the NAND-type flash memory 10 in this order.

The command "EFh" is a command instructing the NAND-type flash memory 10 to execute the setting change operation. The address "zzh" includes an address designating a parameter to be subjected to the setting change operation. The data "D1" to "D4" include parameters to be changed by the setting change operation.

Upon receiving the data "D4", the NAND-type flash memory 10 transitions from the ready state to the busy state. Then, the sequencer 15 rewrites the parameters as appropriate based on the received address "zzh" and the data "D1" to "D4". When the rewriting of the parameters is completed, the NAND-type flash memory 10 transitions from the busy state to the ready state.

In this example, the memory system 1 executes a setting change operation of setting a start voltage of tracking read and a setting change operation of setting a step-up voltage in the tracking read before executing the tracking read. The present invention is not limited thereto, and the setting change operation related to the tracking read may be appropriately omitted.

When the setting change operation of the parameter relating to the tracking read is completed, the memory system 1 executes the tracking read. In the tracking read, the memory controller 20 transmits, for example, the command "xxh", the command "01h", the address information "ADD" of five cycles, and the command "30h" to the NAND-type flash memory 10 in this order.

Upon receiving the command "30h", the NAND-type flash memory 10 transitions from the ready state to the busy state and executes the tracking read as described with reference to FIG. 13. When the tracking read is completed, the NAND-type flash memory 10 transitions from the busy state to the ready state. The illustrated time tTR corresponds to processing time of the tracking read.

When execution of the tracking read is completed, the memory system 1 executes output of the tracking result. In the output of the tracking result, the memory controller 20 transmits, for example, a command "B0h" and the command "00h" to the NAND-type flash memory 10. The command "B0h" is a command instructing the NAND-type flash memory 10 to output the tracking result.

Upon receiving the command "00h", the NAND-type flash memory 10 outputs the tracking result held in the status register 13A to the memory controller 20 ("STSout"), for example.

The tracking result received by the memory controller 20 is recorded in the LUT in the RAM 22, for example. The tracking result may be held in the DRAM 30, and it is sufficient that the tracking result is held in a region other than the NAND package PKG in the memory system 1.

The operation described above corresponds to the history learning in the patrol operation. When the output of the tracking result is completed, the memory system 1 enters a state capable of executing operation based on an instruction from the host device 2 ("interruptible").

At this time, if the memory system 1 has not received the instruction from the host device 2, the memory system 1 continues to execute defect detection (shift read). On the other hand, when the memory system 1 has received the instruction from the host device 2, the memory system 1 executes an operation based on the instruction from the host device 2 and then executes the defect detection.

When the operation based on the instruction from the host device 2 is executed, the read result held in the latch circuit XDL in the sense amplifier unit SAU is discarded. On the other hand, the correction value of the read voltage obtained by the tracking read is maintained, for example, in the status register 13A.

In the defect detection, the memory system 1 first executes a setting change operation of a parameter relating to shift read. Since a command sequence in the setting change operation is the same as the setting change operation of the parameter relating to the tracking read, the description is omitted.

When this setting change operation is executed, parameters in the NAND-type flash memory 10 are appropriately rewritten based on the tracking result held in the RAM 22 in the memory controller 20, for example. As a result, in the NAND-type flash memory 10, the read voltage during execution of the shift read is set.

When the setting change operation of the parameter relating to the shift read is completed, the memory system 1 executes the shift read. In the shift read, the memory controller 20 transmits, for example, the command "yyh", the command "01h", the address information "ADD" of five cycles, and the command "30h" to the NAND-type flash memory 10 in this order.

Upon receiving the command "30h", the NAND-type flash memory 10 transitions from the ready state to the busy state and executes the shift read as described with reference to FIG. 14. When the shift read is completed, the NAND-type flash memory 10 transitions from the busy state to the ready state. The illustrated time tSR corresponds to the processing time of the shift read. The time tSR is shorter than the time tTR.

When execution of the shift read is completed, the memory system 1 executes output of read data. In the first embodiment, the "read data" indicates the read result obtained by the shift read and based on the optimum read voltage.

In the output of the read data, the memory controller 20 transmits, for example, a command "05h", the address information "ADD" of five cycles, and a command "E0h" to the NAND-type flash memory 10 in this order. The commands "05h" and "E0h" are commands instructing the NAND-type flash memory 10 to output the read data.

Upon receiving the command "E0h", the NAND-type flash memory 10 outputs the read data held in the latch circuit XDL in the sense amplifier unit SAU to the memory controller 20 ("Dout"), for example.

When the memory controller 20 receives the read data, the error correction processing is executed by the ECC circuit 24. Then, based on the result of the error correction processing, it is judged whether or not a page on which the patrol operation is executed can be read out.

The operation described above corresponds to the defect detection in the patrol operation. The memory system 1 according to the first embodiment progresses the patrol operation on a page basis by executing the history learning and the defect detection as described above.

In the memory system 1 according to the first embodiment, in the NAND-type flash memory 10 using the common bus line Ch, a processing unit (processing unit of a command) of patrol operation to be processed may be set. Hereinafter, an example of operation in a case where the processing unit of the patrol operation is different in the memory system 1 according to the first embodiment will be exemplified.

(Case Where Processing Unit of Patrol Operation is 1 Page/1 BNK)

Figure 16:
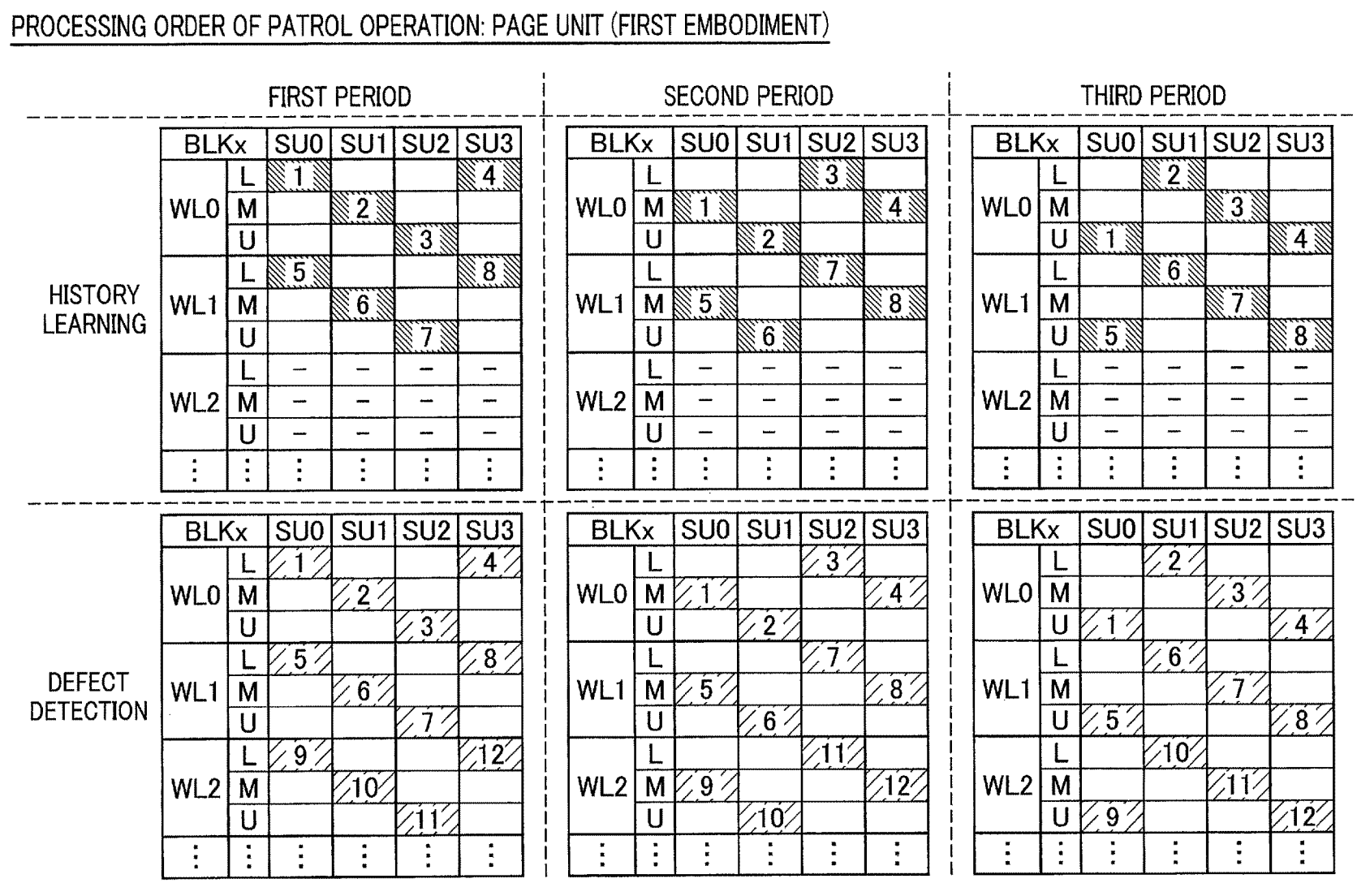

FIG. 16 is an example of processing order of the patrol operation in the memory system 1 according to the first embodiment and exemplifies a case where the processing unit of the patrol operation processed in each of the NAND-type flash memories 10 is 1 page/1 BNK. In this specification, the fact that "the processing unit of the patrol operation is 1 page/1 BNK" indicates that the patrol operation is not executed in parallel in the NAND-type flash memory 10 using the common bus line Ch, for example. Note that, the patrol operation may be executed in parallel in the NAND-type flash memory 10 using the different channel controllers CC.

As shown in FIG. 16, in this example, the patrol operation for a block BLKx (x is an integer equal to or larger than 0) may be classified into, for example, a first period, a second period, and a third period. The numbers shown in each period correspond to an execution order of the patrol operation. When the same numbers are indicated in the history learning and the defect detection in the same period, this indicates that these operations are executed continuously, for example. "L", "M", and "U" shown in FIG. 16 correspond to the lower page, the middle page, and the upper page, respectively.

In each of the first period, the second period, and the third period, history learning and defect detection in which different pages are selected are executed in a set of the selected string unit SU and word line WL.

Specifically, in the first period, the string unit SU0 and the word line WL0 are first selected, and the history learning and defect detection of the lower page are executed (the first period, "1"). Next, the string unit SU1 and the word line WL0 are selected, and the history learning and defect detection of the middle page are executed (the first period, "2"). Next, the string unit SU2 and the word line WL0 are selected, and the history learning and defect detection of the upper page are executed (the first period, "3"). Next, the string unit SU3 and the word line WL0 are selected, and the history learning and defect detection of the lower page are executed (the first period, "4").

Next, the history learning and defect detection in which the word line WL1 is selected are executed. At this time, the string unit SU and the page are selected in the same order as in the case where the word line WL0 is selected (the first period, "5" to "8").

In the first period, when the history learning and defect detection in which the word line WL1 is selected are executed, for example, the history learning may be omitted in the subsequent patrol operation. That is, in the patrol operation in which the word line WL2 is selected, for example, only the defect detection is executed (the first period, "9" to "12"). In the patrol operation in which the history learning is omitted, for example, the defect detection is executed by using the result of the history learning in another word line WL executed in the same block BLK. In the first period, the patrol operation in which another word line WL is selected is executed in the same order as the patrol operation in which the word line WL2 is selected, for example, so that the description will be omitted.

In the second period, the string unit SU0 and the word line WL0 are first selected, and the history learning and defect detection of the middle page are executed (the second period, "1"). Next, the string unit SU1 and the word line WL0 are selected, and the history learning and defect detection of the upper page are executed (the second period, "2"). Next, the string unit SU2 and the word line WL0 are selected, and the history learning and defect detection of the lower page are executed (the second period, "3"). Next, the string unit SU3 and the word line WL0 are selected, and the history learning and defect detection of the middle page are executed (the second period, "4").

Next, the history learning and defect detection in which the word line WL1 is selected are executed. At this time, the string unit SU and the page are selected in the same order as in the case where the word line WL0 is selected (the second period, "5" to "8").

In the second period, when the history learning and defect detection in which the word line WL1 is selected are executed, for example, the history learning may be omitted in the subsequent patrol operation as in the first period (the second period, "9" to "12"). In the second period, the patrol operation in which another word line WL is selected is executed in the same order as the patrol operation in which the word line WL2 is selected, for example, so that the description will be omitted.

In the third period, the string unit SU0 and the word line WL0 are first selected, and the history learning and defect detection of the upper page are executed (the third period, "1"). Next, the string unit SU1 and the word line WL0 are selected, and the history learning and defect detection of the lower page are executed (the third period, "2"). Next, the string unit SU2 and the word line WL0 are selected, and the history learning and defect detection of the middle page are executed (the third period, "3"). Next, the string unit SU3 and the word line WL0 are selected, and the history learning and defect detection of the upper page are executed (the third period, "4").

Next, the history learning and defect detection in which the word line WL1 is selected are executed. At this time, the string unit SU and the page are selected in the same order as in the case where the word line WL0 is selected (the third period, "5" to "8").

In the third period, when the history learning and defect detection in which the word line WL1 is selected are executed, the history learning may be omitted in the subsequent patrol operation as in the first period (the third period, "9" to "12"). In the third period, the patrol operation in which another word line WL is selected is executed in the same order as the patrol operation in which the word line WL2 is selected, for example, so that the description will be omitted.

The patrol operation in the first to third periods is executed as described above, whereby, in the memory system 1 according to the first embodiment, the patrol operation corresponding to three pages in all the word lines WL in the block BLKx can be executed.

In the first to third periods, the order in which pages are selected differs in the patrol operation in which each of the word lines WL is selected. In this example, at least one patrol operation is executed in all regions (all combinations of the word line WL and the string unit SU in the relevant block BLK) in each of the first to third periods.

There will be hereinafter described an operation timing of the patrol operation in a case where the patrol operations of the lower page, the middle page, and the upper page are sequentially executed in each of the NAND-type flash memories 10 connected to the common bus line Ch.

Figure 17:
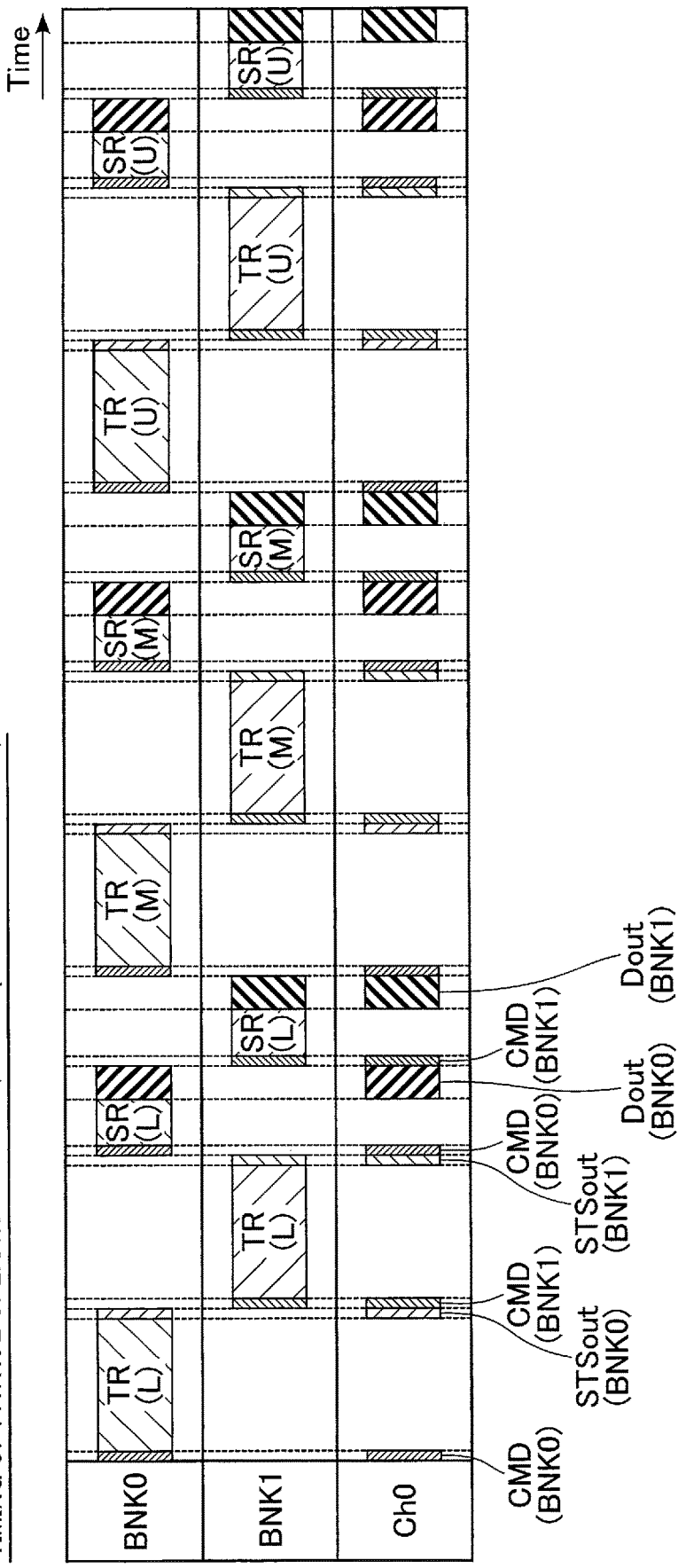
FIG. 17 is a timing chart showing an example of the patrol operation of the memory system according to the first embodiment.

FIG. 17 shows an example of the operation timing of the patrol operation in the case where the processing unit of the patrol operation is 1 page/1 BNK in the first embodiment.

In a timing chart referred to in the following description, "BNK0" and "BNK1" indicate operation states in the NAND-type flash memory 10 corresponding to the banks BNK0 and BNK1, respectively. "Ch0" indicates a signal transmitted/received via the bus line Ch0. "TR(L)", "TR(M)", and "TR(U)" indicate processing periods of the tracking read corresponding to the lower page, the middle page, and the upper page, respectively. "SR(L)", "SR(M)", and "SR(U)" indicate processing periods of the shift read corresponding to the lower page, the middle page, and the upper page, respectively.

In the following description of the timing chart, in order to simplify the description, the NAND-type flash memory 10 corresponding to the bank BNK0 is referred to as "bank BNK0", and the NAND-type flash memory 10 corresponding to the bank BNK1 is referred to as "bank BNK1". Further, it is assumed that the bus line Ch0 is used in the operation of the memory controller 20 transmitting a command to each of the banks BNK and the operation of each of the banks BNK transmitting data or status to the memory controller 20.

As shown in FIG. 17, the memory system 1 alternately executes operation corresponding to the bank BNK0 and operation corresponding to the bank BNK1.

Specifically, first, the memory controller 20 transmits the command CMD corresponding to the tracking read of the lower page to the bank BNK0. Then, the bank BNK0 executes the tracking read of the lower page and then transmits the tracking result STSout to the memory controller 20 (history learning of the lower page in BNK0).

Next, the memory controller 20 transmits the command CMD corresponding to the tracking read of the lower page to the bank BNK1. Then, the bank BNK1 executes the tracking read of the lower page and then transmits the tracking result STSout to the memory controller 20 (history learning of the lower page in BNK1).

Next, the memory controller 20 transmits the command CMD corresponding to the shift read of the lower page to the bank BNK0. Then, the bank BNK0 executes the shift read of the lower page and then transmits the read data Dout to the memory controller 20 (defect detection of the lower page in BNK0).

Next, the memory controller 20 transmits the command CMD corresponding to the shift read of the lower page to the bank BNK1. Then, the bank BNK0 executes the shift read of the lower page and then transmits the read data Dout to the memory controller 20 (defect detection of the lower page in BNK1).

In the first embodiment, when the processing unit of the patrol operation is 1 page/1 BNK, the memory controller 20 can interrupt read operation (hereinafter referred to as host read) based on an instruction from the host device 2 at the end of the shift read and at the end of the tracking read.

Subsequently, the patrol operation corresponding to the middle page and the patrol operation corresponding to the upper page are sequentially executed. Since the operation timings of the patrol operations corresponding to the middle page and the upper page are the same as the operation timing of the patrol operation corresponding to the lower page, the description thereof will be omitted.

(Case where Processing Unit of Patrol Operation is 1 WL/2 BNK)

FIG. 18 is an example of processing order of the patrol operation in the memory system 1 according to the first embodiment and exemplifies a case where the processing unit of the patrol operation processed in each of the NAND-type flash memories 10 is 1 WL/2 BNK. In this specification, the fact that "the processing unit of the patrol operation is 1 WL/2 BNK" indicates that the patrol operation is executed in parallel in the NAND-type flash memory 10 using the common bus line Ch.

The numbers shown in FIG. 18 indicate an order in which a set of the patrol operations of the lower page, the middle page, and the upper page to be executed continuously is executed. When the same numbers are indicated in the history learning and the defect detection, this indicates that these operations are executed continuously, for example.

As shown in FIG. 18, in this example, in the patrol operation for the block BLKx, the period is not classified as in the example described with reference to FIG. 16, for example. In this example, the word line WL0 is first selected, and the history learning and defect detection in which the string units SU0 to SU3 are sequentially selected are executed ("1" to "4"). Next, the word line WL1 is selected, and the history learning and defect detection in which the string units SU0 to SU3 are sequentially selected are executed ("5" to "8").

When the history learning and defect detection in which the word line WL1 is selected are executed, for example, the history learning may be omitted in the subsequent patrol operation. That is, in the patrol operation in which the word line WL2 is selected, for example, only the defect detection is executed ("9" to "12"). In the patrol operation in which the history learning is omitted, for example, the defect detection is executed by using the result of the history learning executed in the same block BLK. In this example, the patrol operation in which another word line WL is selected is executed in the same order as the patrol operation in which the word line WL2 is selected, for example, so that the description will be omitted.

The patrol operation is executed as described above, whereby, in the memory system 1 according to the first embodiment, the patrol operation corresponding to three pages in all the word lines WL in the block BLKx can be executed.

There will be hereinafter described an operation timing of the patrol operation in a case where the patrol operations of the lower page, the middle page, and the upper page are sequentially executed in each of the NAND-type flash memories 10 connected to the common bus line Ch.

Figure 19:
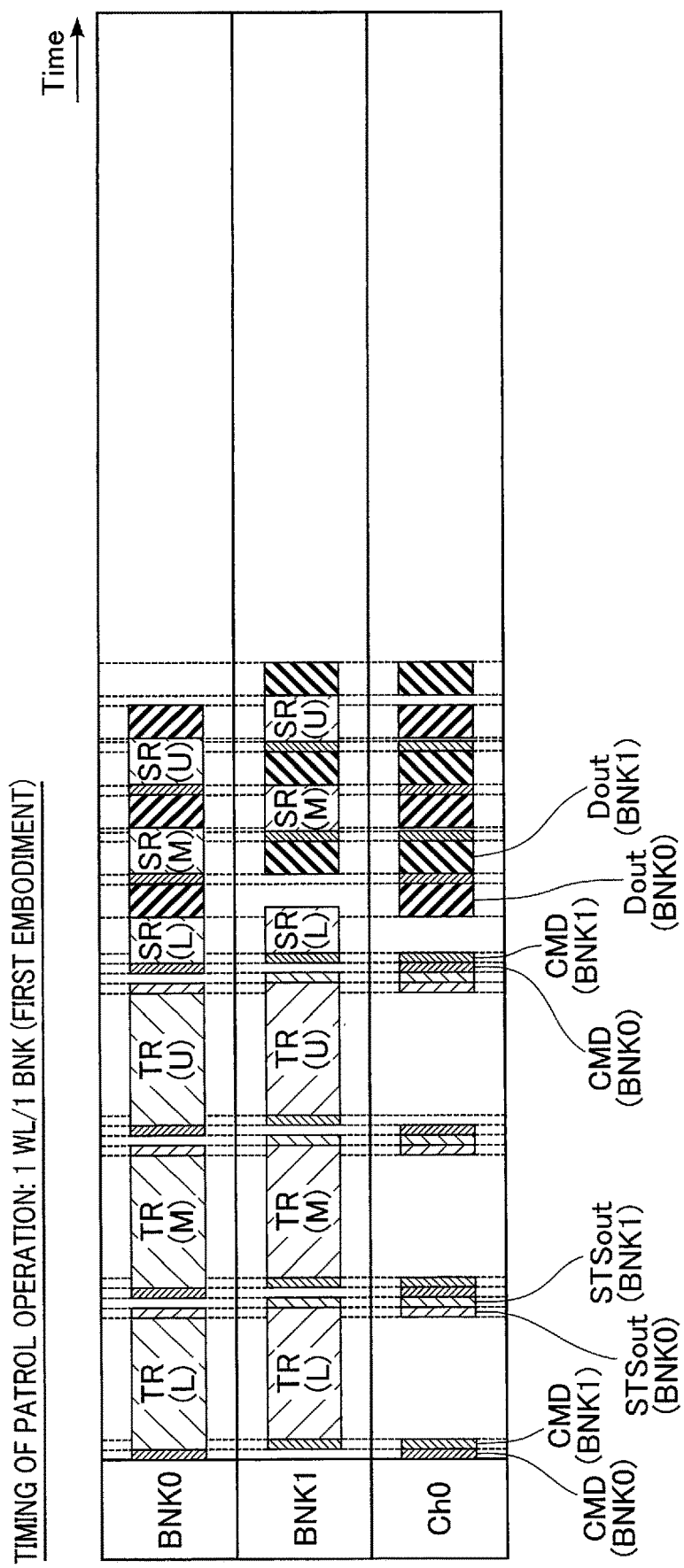
FIG. 19 is a timing chart showing an example of the patrol operation in the memory system according to the first embodiment.

FIG. 19 shows an example of the operation timing of the patrol operation in the case where the processing unit of the patrol operation is 1 WL/2 BNK in the first embodiment. As shown in FIG. 19, the memory system 1 executes the operation corresponding to the bank BNK0 and the operation corresponding to the bank BNK1 in parallel, as appropriate.

Specifically, first, the memory controller 20 sequentially transmits the command CMD corresponding to the tracking read of the lower page to the banks BNK0 and BNK1. Upon receiving the command CMD corresponding to the tracking read of the lower page, each of the banks BNK0 and BNK1 starts the tracking read of the lower page.

At this time, the tracking read in the bank BNK0 and the tracking read in the bank BNK1 can be executed in parallel. The tracking read of the lower page is completed in the order of the bank BNK0 and the bank BNK1.

When the tracking read of the lower page is completed, each of the banks BNK0 and BNK1 sequentially transmit the tracking result STSout to the memory controller 20 (history learning of the lower page in each of BNK0 and BNK1).

Next, the memory system 1 sequentially executes the history learning of the middle page and the history learning of the upper page for each of the banks BNK0 and BNK1. Since these operation timings are the same as those of the history learning of the lower page, the description will be omitted.

In the first embodiment, when the processing unit of the patrol operation is 1 WL/2 BNK, since the history learning and the defect detection can be separated, the memory controller 20 can interrupt the host read at this timing.

Upon completion of the history learning of the lower page, the middle page, and the upper page, the memory system sequentially transmits the command CMD corresponding to the shift read of the lower page to the banks BNK0 and BNK1.

Upon receiving the command CMD corresponding to the shift read of the lower page, each of the banks BNK0 and BNK1 starts the shift read of the lower page. At this time, the shift read in the bank BNK0 and the shift read in the bank BNK1 can be executed in parallel.

When the shift read of the lower page in the bank BNK0 is completed, the memory controller 20 causes the bank BNK0 to output the read data Dout of the lower page (defect detection of the lower page in BNK0). For example, while the bank BNK0 is outputting the read data Dout, the shift read of the lower page in the bank BNK1 is completed.

Upon receiving the read data Dout of the lower page from the bank BNK0, the memory controller 20 transmits the command CMD corresponding to the shift read of the middle page to the bank BNK0, and the bank BNK0 starts the shift read of the middle page.

While the bank BNK0 is executing the shift read of the middle page, the memory controller 20 causes the bank BNK1 to output the read data Dout of the lower page (defect detection of the lower page in BNK1).

For example, the output of the read data Dout of the lower page in the bank BNK1 is completed while the bank BNK0 is executing the shift read of the middle page. In other words, the shift read of the middle page in the bank BNK0 and the output of the read data Dout of the lower page in the bank BNK1 can be executed in parallel.

Upon receiving the read data Dout of the lower page from the bank BNK1, the memory controller 20 transmits the command CMD corresponding to the shift read of the middle page to the bank BNK1, and the bank BNK1 starts the shift read of the middle page.

For example, while the bank BNK1 is executing the shift read of the middle page, the shift read of the middle page in the bank BNK0 is completed. In other words, the shift read of the middle page in the bank BNK1 and the output of the read data Dout of the middle page in the bank BNK0 can be executed in parallel.

When the shift read of the middle page in the bank BNK0 is completed, the memory controller 20 causes the bank BNK0 to output the read data Dout of the middle page (defect detection of the middle page in BNK0). Subsequently, the memory controller 20 transmits the command CMD corresponding to the shift read of the upper page to the bank BNK0, and the bank BNK0 starts the shift read of the upper page.

Thereafter, similarly, the shift read in the bank BNK0 and output of read data in the bank BNK1 can be executed in parallel as appropriate, and the shift read in the bank BNK1 and output of read data in the bank BNK0 can be executed in parallel as appropriate.

In the patrol operation described above, the case where the history learning and the defect detection are executed continuously is exemplified, but the present invention is not limited thereto. For example, in the patrol operation in the first embodiment, the history learning and the defect detection may be separately executed. In this case, it is sufficient that the memory system 1 executes the defect detection at least after executing the history learning for the page targeted for the patrol operation.

In the patrol operation described above, the case where the history learning for the word line WL2 and the subsequent word lines is omitted is exemplified, but the present invention is not limited thereto. In the patrol operation in the first embodiment, the history learning may be executed for all the word lines WL, and the word line WL from which the history learning is omitted may be arbitrarily selected.

[1-3] Effects of First Embodiment

According to the memory system 1 according to the first embodiment described above, reliability of data to be stored can be guaranteed, and latency can be improved. Hereinafter, effects of the memory system 1 according to the first embodiment will be described in detail.

When error correction becomes impossible in read operation (hereinafter referred to as host read) according to an instruction from the host device 2, for example, an SSD (Solid State Drive) executes retry read. Restoration techniques such as Vth tracking can be applied to the retry read.

The Vth tracking is an operation of transmitting the read result based on the tracking voltage as described with reference to FIG. 13 to the memory controller 20 and estimating a highly accurate correction value of a read voltage. Thus, the processing time of the retry read tends to be long, and when the retry read occurs, it becomes difficult to satisfy a latency performance desired by a customer.

On the other hand, in the SSD used in a data center or the like, the patrol operation is executed during the background operation. In the patrol operation, an optimum read voltage of the memory cell is searched by Vth tracking or shift read, and a correction value on the LUT is updated.

Then, in the subsequent read operation, the SSD executes read operation using the correction value updated on the LUT. That is, the higher the accuracy of the correction value created by the patrol operation, the more it is possible to suppress the occurrence of the retry read in the SSD.

However, while the Vth tracking can create the correction value with high accuracy, there is a concern that data exchange between the memory controller 20 and the NAND-type flash memory 10 increases and a bus is occupied. As a result, it becomes difficult to increase the number of parallel processings between the banks BNK, so that the latency increases.

In a large capacity SSD, the number of chips allocated to a channel tends to increase, and a method of controlling the patrol operation in the background operation becomes important. In particular, in order to guarantee the reliability of the SSD, it is necessary to create a highly accurate correction value of a read voltage while suppressing an increase in latency due to the patrol operation.

Thus, in the memory system 1 according to the first embodiment, in the patrol operation, tracking read creating the correction value of the read voltage in the NAND-type flash memory 10 is executed. The tracking read in the first embodiment has an advantage that data output as in the Vth tracking is unnecessary and the bus is not occupied.

Consequently, in the memory system 1 according to the first embodiment, it is possible to increase the number of parallel processings of the patrol operation between the banks BNK, and to increase processing speed of the patrol operation in the entire memory system 1. In the memory system 1 according to the first embodiment, a time for executing the patrol operation is shortened.

As a result, in the memory system 1 according to the first embodiment, it is possible to suppress the occurrence of the retry read and to reduce probability of collision between the host read and the patrol operation. That is, the memory system 1 according to the first embodiment can guarantee the reliability of data and improve the latency.

In the above description, the advantage of executing the patrol operation in parallel has been described; however, the processing unit of optimum patrol operation changes according to the processing unit of the command. This point will be explained in the item of "Effects of Second Embodiment" to be described later.

[1-4] Variation of First Embodiment

In the first embodiment, the case where the processing unit is the same for each of the history learning (tracking read) and the defect detection (shift read) is exemplified, but the present invention is not limited thereto. For example, the processing unit in the history learning and the processing unit in the defect detection may be different.

Hereinafter, an example of the operation timing of the patrol operation in the memory system 1 according to the variation of the first embodiment will be described. In the variation of the first embodiment, the history learning is executed in parallel, and the defect detection is executed on a page basis.

Figure 20:
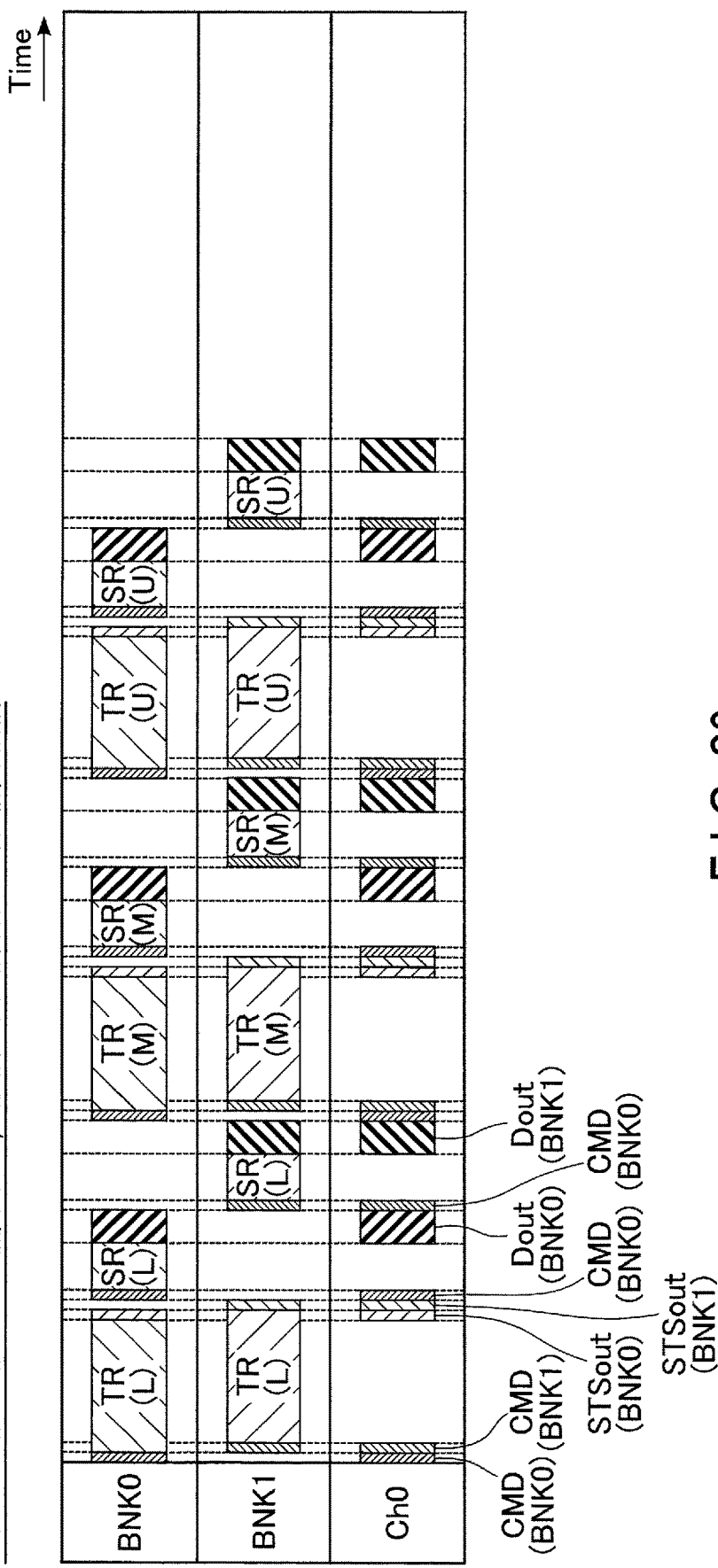
FIG. 20 is a timing chart showing an example of patrol operation of a memory system according to a variation of the first embodiment.

FIG. 20 shows an example of a timing chart of the patrol operation in the case where the processing unit of the history learning is 1 page/2 BNK and the processing unit of the defect detection is 1 page/1 BNK in the variation of the first embodiment. As shown in FIG. 20, the memory system 1 executes operations corresponding to the banks BNK0 and BNK1 in parallel as appropriate in the history learning and sequentially executes operations corresponding to the banks BNK0 and BNK1 in the defect detection.

Specifically, first, the memory controller 20 causes each of the banks BNK0 and BNK1 to execute the tracking read of the lower page similarly to the operation described with reference to FIG. 19. When the tracking read of the lower page is completed, each of the banks BNK0 and BNK1 sequentially transmit the tracking result STSout to the memory controller 20 (history learning of the lower page in each of BNK0 and BNK1).

Next, similarly to the operation described with reference to FIG. 17, the memory controller 20 causes the bank BNK0 to execute the shift read of the lower page and outputs the read data Dout of the lower page (defect detection of the lower page in BNK0).

Next, similarly to the operation described with reference to FIG. 17, the memory controller 20 causes the bank BNK1 to execute the shift read of the lower page and outputs the read data Dout of the lower page (defect detection of the lower page in BNK1).

Thereafter, similarly, the memory controller 20 causes each of the banks BNK0 and BNK1 to execute the tracking read of the middle page in parallel, causes each of the banks BNK0 and BNK1 to sequentially execute the shift read of the middle page, causes each of the banks BNK0 and BNK1 to execute the tracking read of the upper page in parallel, and causes each of the banks BNK0 and BNK1 to sequentially execute the shift read of the upper page.

In the variation of the first embodiment, the memory controller 20 can interrupt the host read at the end of 2BNK operation of the history learning and at the end of 1BNK operation of the defect detection, respectively.

By executing the patrol operation as described above, the memory system 1 according to the variation of the first embodiment can shorten the processing time of the history learning in the patrol operation. That is, the memory system 1 according to the variation of the first embodiment can speed up the patrol operation and improve the latency.

[2] Second Embodiment

A memory system 1 according to a second embodiment has the same configuration as the memory system 1 according to the first embodiment, for example. The memory system 1 according to the second embodiment executes defect detection using a read result obtained by tracking read in patrol operation. Hereinafter, points of the memory system 1 according to the second embodiment different from the first embodiment will be described.

[2-1] Patrol Operation (Command Sequence in Patrol Operation)

Figure 21:
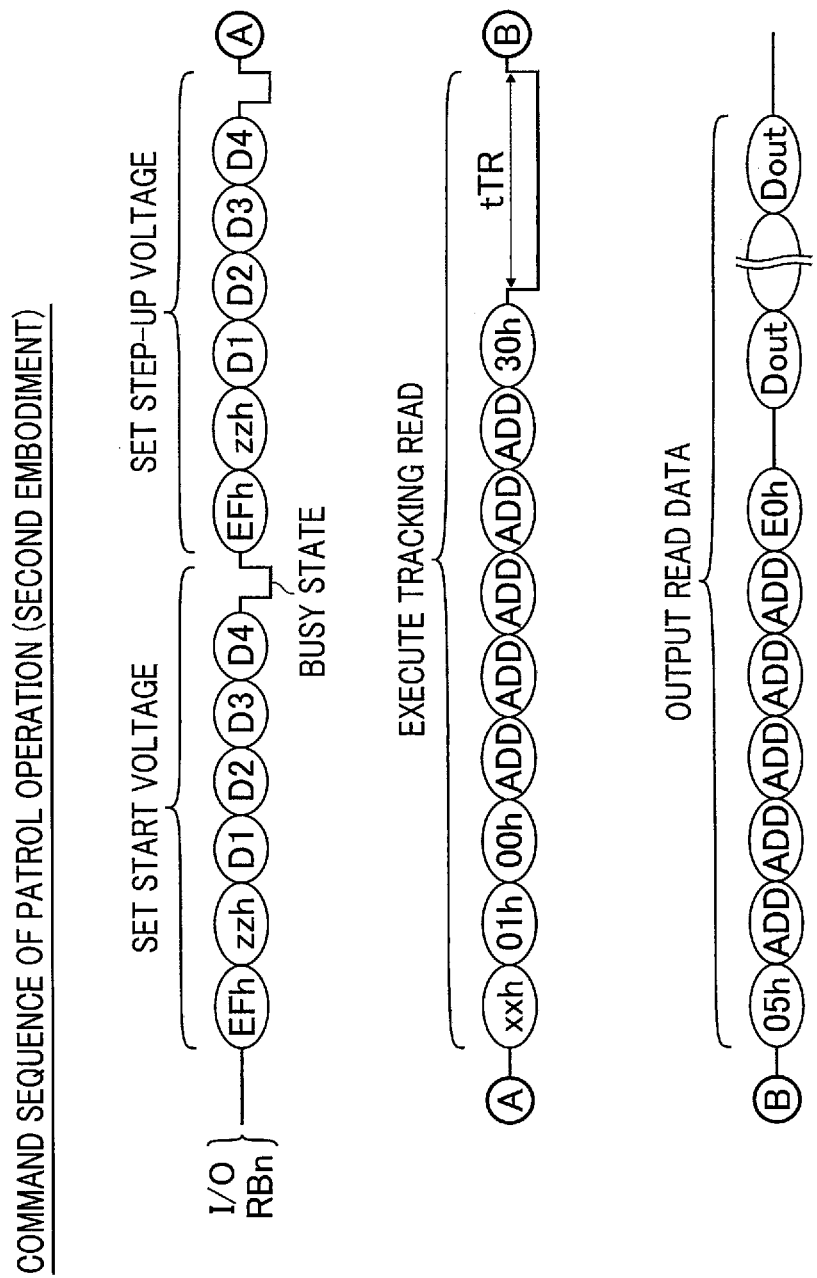
FIG. 21 is a diagram showing an example of a command sequence in patrol operation of a memory system according to a second embodiment.

FIG. 21 shows an example of a command sequence in the patrol operation of the memory system 1 according to the first embodiment. As shown in FIG. 21, for example, when starting the patrol operation, the memory system 1 executes history learning first, as in the first embodiment.

Specifically, the memory system 1 first appropriately executes a setting change operation corresponding to setting a start voltage of tracking read and a setting change operation corresponding to setting a step-up voltage in the tracking read.

When the setting change operation of the parameter relating to the tracking read is completed, the memory system 1 executes the tracking read. Since the command sequence in each of the setting change operation and the tracking read is the same as that in the first embodiment, the description will be omitted.

Upon receiving the command "30h", the NAND-type flash memory 10 transitions from the ready state to the busy state and executes the tracking read as described with reference to FIG. 13. When the tracking read is completed, the NAND-type flash memory 10 transitions from the busy state to the ready state.

When execution of the tracking read is completed, the memory system 1 executes output of read data. In the first embodiment, the "read data" indicates the read result obtained by the tracking read and based on an optimum read voltage.

The command sequence in the output of the read data is the same as that in the first embodiment. Upon receiving the command "E0h", the NAND-type flash memory 10 outputs the read data held in the latch circuit XDL in the sense amplifier unit SAU to the memory controller 20 ("Dout"), for example.

When the memory controller 20 receives the read data, the error correction processing is executed by the ECC circuit 24. Then, based on the result of the error correction processing, it is judged whether or not a page on which the patrol operation is executed can be read out.

As described above, the memory system 1 according to the second embodiment executes the defect detection using the read result in the tracking read in the patrol operation.

(Case Where Processing Unit of Patrol Operation is 1 Page/1 BNK)

A processing order of the patrol operation in a case where a processing unit of the patrol operation is 1 page/1 BNK is the same in the second embodiment and the first embodiment, for example.

Hereinafter, an example of an operation timing of the patrol operation in the case where the processing unit of the patrol operation is 1 page/1 BNK in the memory system 1 according to the second embodiment will be described.

Figure 22:
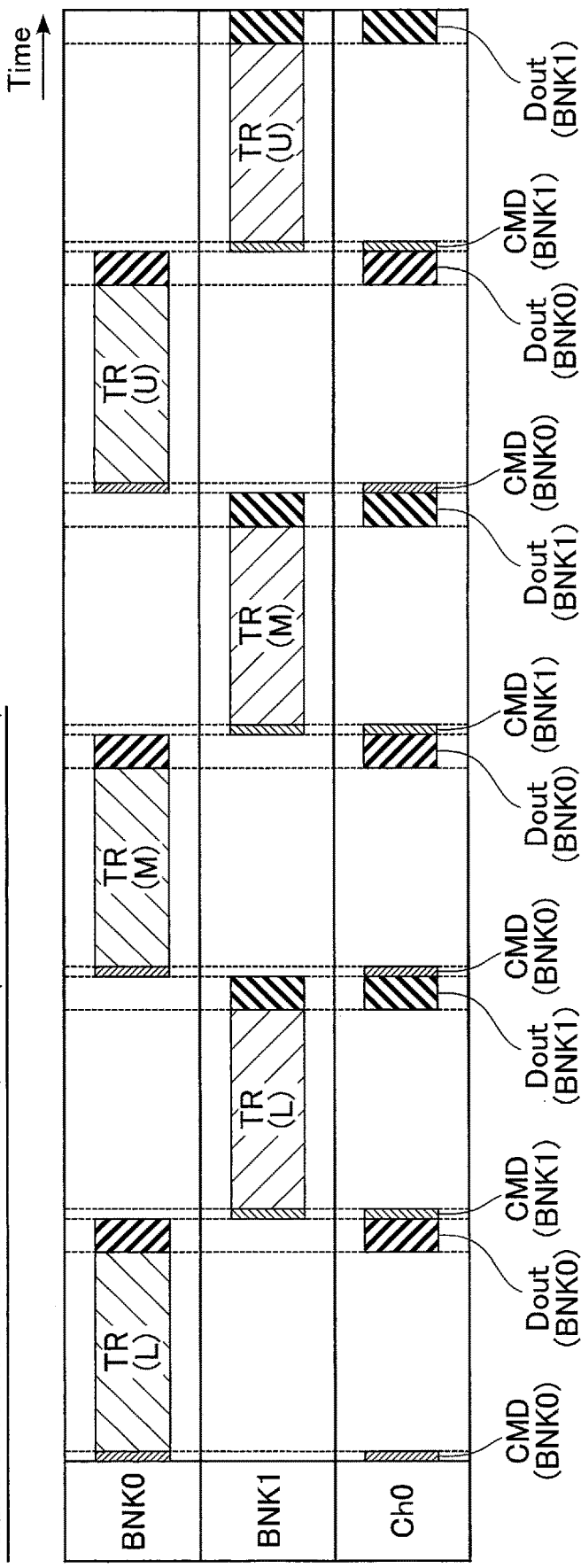
FIGS. 22 and 23 are diagrams showing an example of a timing chart in the patrol operation of the memory system according to the second embodiment.

FIG. 22 shows an example of a timing chart of the patrol operation in the case where the processing unit of the patrol operation is 1 page/1 BNK in the second embodiment. As shown in FIG. 22, the memory system 1 alternately executes operation corresponding to a bank BNK0 and operation corresponding to a bank BNK1.

Specifically, first, the memory controller 20 transmits the command CMD corresponding to the tracking read of the lower page to the bank BNK0. Then, the bank BNK0 executes the tracking read of the lower page and then transmits the read data Dout of the lower page to the memory controller 20 (patrol operation of the lower page in BNK0).

Next, the memory controller 20 transmits the command CMD corresponding to the tracking read of the lower page to the bank BNK1. Then, the bank BNK1 executes the tracking read of the lower page and then transmits the read data Dout of the lower page to the memory controller 20 (patrol operation of the lower page in BNK1).

In the second embodiment, when the processing unit of the patrol operation is 1 page/1 BNK, the memory controller 20 can interrupt host read after completion of a set of the tracking read and the output of the read data executed every 1 BNK.

Subsequently, the patrol operation corresponding to the middle page and the patrol operation corresponding to the upper page are sequentially executed. Since the operation timings of the patrol operations corresponding to the middle page and the upper page are the same as the operation timing of the patrol operation corresponding to the lower page, the description thereof will be omitted.

(Case Where Processing Unit of Patrol Operation is 1 WL/2 BNK)

The processing order of the patrol operation in a case where the processing unit of the patrol operation is 1 WL/2 BNK is the same in the second embodiment and the first embodiment, for example.

Hereinafter, an example of the operation timing of the patrol operation in the case where the processing unit of the patrol operation is 1 WL/2 BNK in the memory system 1 according to the second embodiment will be described.

Figure 23:
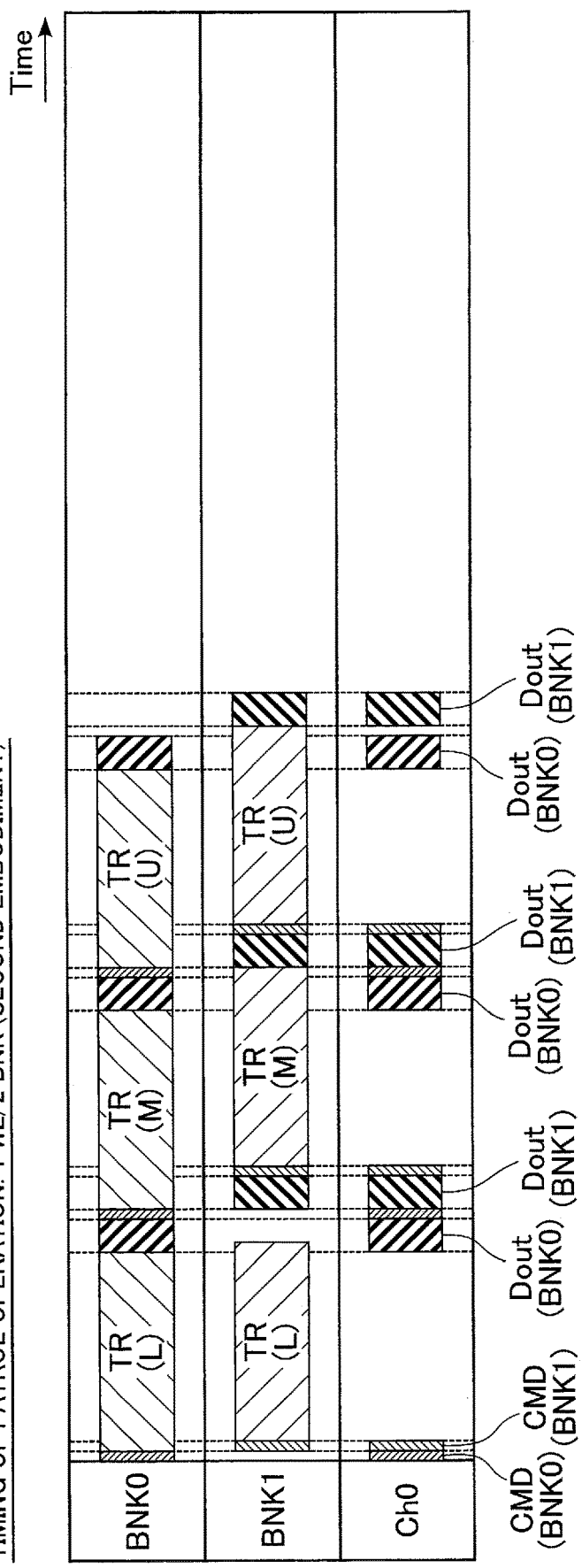

FIG. 23 shows an example of a timing chart of the patrol operation in the case where the processing unit of the patrol operation is 1 WL/2 BNK in the second embodiment. As shown in FIG. 23, the memory system 1 executes the operation corresponding to the bank BNK0 and the operation corresponding to the bank BNK1 in parallel, as appropriate.

Specifically, first, the memory controller 20 sequentially transmits the command CMD corresponding to the tracking read of the lower page to the banks BNK0 and BNK1. Upon receiving the command CMD corresponding to the tracking read of the lower page, each of the banks BNK0 and BNK1 starts the tracking read of the lower page.

At this time, the tracking read in the bank BNK0 and the tracking read in the bank BNK1 can be executed in parallel. The tracking read of the lower page is completed in the order of the bank BNK0 and the bank BNK1.

When the tracking read of the lower page in the bank BNK0 is completed, the memory controller 20 causes the bank BNK0 to output the read data Dout of the lower page (patrol operation of the lower page in BNK0).

Upon receiving the read data Dout of the lower page from the bank BNK0, the memory controller 20 transmits the command CMD corresponding to the tracking read of the middle page to the bank BNK0, and the bank BNK0 starts the tracking read of the middle page.

When the bank BNK0 is executing the tracking read of the middle page, the memory controller 20 causes the bank BNK1 to output the read data Dout of the lower page (patrol operation of the lower page in BNK1).

Upon receiving the read data Dout of the lower page from the bank BNK1, the memory controller 20 transmits the command CMD corresponding to the tracking read of the middle page to the bank BNK1, and the bank BNK1 starts the tracking read of the middle page.

Thereafter, similarly, the tracking read in the bank BNK0 and output of read data in the bank BNK1 can be executed in parallel as appropriate, and the tracking read in the bank BNK1 and output of read data in the bank BNK0 can be executed in parallel as appropriate.

In the second embodiment, when the processing unit of the patrol operation is 1 WL/2 BNK, the memory controller 20 cannot interrupt the host read until all of the 1 WL/2 BNK processing is completed.

[2-2] Effects of Second Embodiment

As described above, in the patrol operation in the memory system 1 according to the second embodiment, the defect detection is executed using the read result in the tracking read. That is, in the patrol operation in the memory system 1 according to the second embodiment, the history learning and the defect detection can be executed by a single operation of the NAND-type flash memory 10.

Consequently, in the memory system 1 according to the second embodiment, since the shift read described in the first embodiment can be omitted, the time for the entire patrol operation can be shortened. Accordingly, the memory system 1 according to the second embodiment can speed up the patrol operation as compared to the first embodiment.

In the first and second embodiments described above, although the second embodiment looks superior to the first embodiment, which one is superior depends on the command processing unit in the memory system 1.

For example, when the command processing unit is large like the 1 WL/2 BNK unit, if the host read and the patrol operation conflict, the instruction of the host read is kept waiting until the patrol operation corresponding to 1 WL/2 BNK is completed.

In this case, since the parallel operation between the banks BNK is possible in both the first and second embodiments, the processing time of the patrol operation is longer in the first embodiment executing the shift read additionally. However, when the command processing unit is large, it is not possible to separate the history learning and the defect detection, so that the second embodiment tends to have a longer waiting time when the host read and the patrol operation conflict.

In order to shorten the waiting time, it is conceivable to make the command processing unit in the memory system 1 as small as the 1 page/1 BNK unit. When the command processing unit becomes small, since the history learning and the defect detection are completed in a short time, the latency is improved.

On the other hand, when the command processing unit is small, in the memory system 1 according to the second embodiment, the read result of the tracking read disappears due to interruption of the host read. That is, in the memory system 1 according to the second embodiment, the tracking read cannot be executed in parallel between the banks BNK, and the processing time of the tracking read becomes long.

On the other hand, in the memory system 1 according to the first embodiment, as described in the variation, the history learning can be processed in parallel between the banks BNK, and the defect detection can be processed in units of the bank BNK. As a result, the memory system 1 according to the first embodiment can process tracking read with a long processing time in parallel, so that the processing time of the tracking read can be made shorter than in the second embodiment.

As described above, the memory system 1 can appropriately change the command processing unit and appropriately selectively use the first and second embodiments to execute optimum patrol operation according to the purpose of the SSD.

[3] Third Embodiment

A memory system 1 according to a third embodiment has the same configuration as the memory system 1 according to the first embodiment, for example. In the memory system 1 according to the third embodiment, in each patrol period, the patrol operation is appropriately thinned out according to an address of the word line WL. Hereinafter, points of the memory system 1 according to the third embodiment different from the first and second embodiments will be described.

[3-1] Patrol Operation

FIG. 24 shows an example of an execution cycle of the patrol operation in the memory system 1 according to a comparative example of the third embodiment. In a timing chart referred to in the following description, a period corresponding to one week from a predetermined date is extracted and shown. The word line WL and a block BLK which are targets of the patrol operation are appropriately omitted. The vertical bar shown in each item indicates that the patrol operation is being executed.

In the description of the execution cycle of the patrol operation, it is assumed that the patrol period of the memory system 1 is set to one day. That is, in the following description, for example, the patrol operation can be executed for all the word lines WL included in all the blocks BLK in the NAND-type flash memory 10 every one day.

As shown in FIG. 24, in the memory system 1 according to the comparative example of the third embodiment, in the patrol period of the first cycle ("1 day"), first, the patrol operation for the word lines WL0 to WL15 of the block BLK0 is sequentially executed, and the patrol operation for the word lines WL0 to WL15 of the block BLK1 is subsequently sequentially executed.

Thereafter, similarly, the patrol operation is sequentially executed for the block BLK for which the patrol operation is not executed. Then, in the memory system 1 according to the comparative example of the third embodiment, in the patrol periods of the second cycle ("2 day") and the subsequent cycles, the patrol operation is executed similarly to the first cycle.

Figure 25:
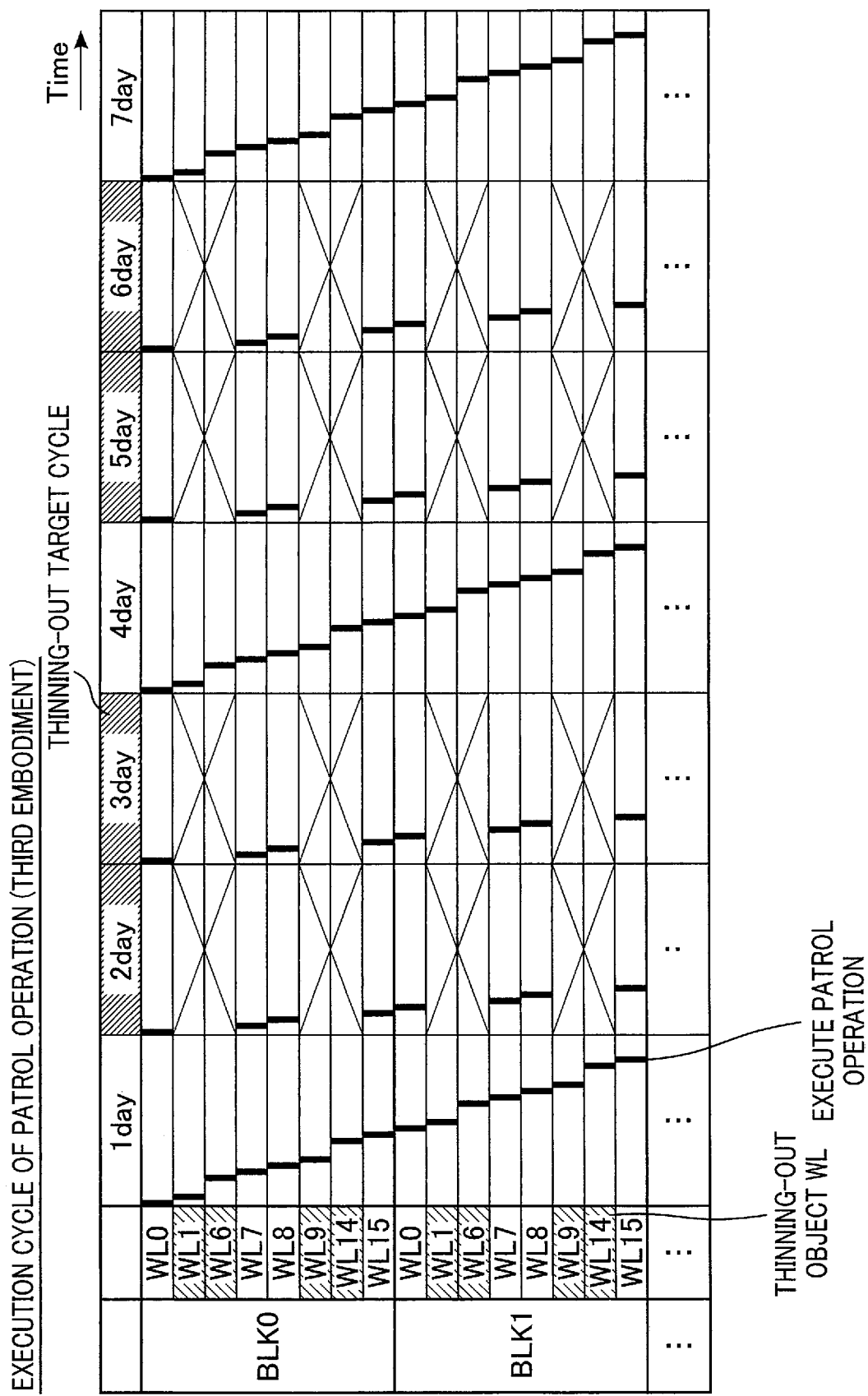
FIG. 25 is a timing chart showing an example of the execution cycle of the patrol operation in the memory system according to the third embodiment.

FIG. 25 shows an example of an execution cycle of the patrol operation in the memory system 1 according to the third embodiment. As shown in FIG. 25, in the memory system 1 according to the third embodiment, in the patrol period of the first cycle ("1 day"), as in the comparative example of the third embodiment, first, the patrol operation for the word lines WL0 to WL15 of the block BLK0 is sequentially executed, and the patrol operation for the word lines WL0 to WL15 of the block BLK1 is subsequently sequentially executed. Thereafter, similarly, the patrol operation is sequentially executed for the block BLK for which the patrol operation is not executed.

In the memory system 1 according to the third embodiment, for example, in each of the patrol periods of the second cycle ("2 day") and the third cycle ("3 day"), among all the word lines WL to be subjected to the patrol operation, the patrol operation for the word line WL other than the specific word lines WL is thinned out.

As the specific word lines WL, for example, the word lines WL0 and WL15 corresponding to the memory cell transistor MT located at an end of the NAND string NS and the word lines WL7 and WL8 corresponding to the memory cell transistor MT adjacent to a joint JT of a memory pillar MP are set.

In such a case, in each of the patrol periods of the second and third cycles, the patrol operation for each of the word lines WL1 to WL6 and WL9 to WL14 is omitted, and the patrol operation for the other word lines WL is executed.

Then, in the memory system 1 according to the third embodiment, in the patrol periods of the fourth cycle ("4 day") and the subsequent cycles, the cycle of the patrol operation is repeated similarly to the first to third cycles. That is, in the memory system 1 according to the third embodiment, the patrol period during which the patrol operation is thinned out is appropriately inserted in a repeated patrol period.

[3-2] Effects of Third Embodiment

When the memory pillar MP has a plurality of pillars connected in the Z direction, it can be inferred that reliability of data stored in the memory cell transistor MT varies according to the address of the word line WL.

For example, the memory cell transistor MT corresponding to the end of the NAND string NS and the memory cell transistor MT approaching the joint JT have larger variations in characteristics than those of the memory cell transistors MT arranged in the other portions, and it can be inferred that the data retention characteristics are inferior.

In such a case, it is conceivable that the effect of executing the patrol operation is higher in the memory cell transistor MT corresponding to the end of the NAND string NS or approaching the joint JT than in the memory cell transistor MT disposed in another portion.

As a storage capacity of the memory system 1 increases, the number of objects to be subjected to the patrol operation increases, and the time during which the memory system 1 is executing the patrol operation becomes long. In such a case, there is a high possibility that the host read and the patrol operation will conflict, and the latency of the memory system 1 may be degraded.

Thus, in the memory system 1 according to the third embodiment, the patrol period during which the patrol operation is thinned out is appropriately inserted with respect to a repeated patrol period. In the patrol period during which the patrol operation is thinned out, the patrol operation is selectively executed for the word line WL highly effective for executing the patrol operation.

In other words, in the memory system 1 according to the third embodiment, a cycle of the patrol operation is optimized according to reliability of the word line WL. By optimizing the patrol operation cycle according to the reliability, the reliability of data is maintained also in the word line WL which is an object of thinning-out of the patrol operation.

Consequently, the memory system 1 according to the third embodiment can guarantee the reliability of data to be stored, as in the case where the patrol operation for all the word lines WL is executed as in the comparative example of the third embodiment. Since the memory system 1 according to the third embodiment can reduce a processing amount of the patrol operation, the probability of the conflict between the host read and the patrol operation can be reduced, and the latency can be improved.

In the above description, the case where the single memory pillar MP has a plurality of pillars connected in the Z direction has been exemplified. However, the operation described in the third embodiment is also applicable to a case where the memory pillar MP has another structure. In the patrol operation in the third embodiment, it is sufficient that the patrol operation cycle is optimized at least according to the reliability of the word line WL.

[4] Fourth Embodiment

A memory system 1 according to a fourth embodiment has the same configuration as the memory system 1 according to the first embodiment, for example. The memory system 1 according to the fourth embodiment changes an execution frequency of patrol operation in accordance with a lapse of time after data is written in a block BLK. Hereinafter, points of the memory system 1 according to the fourth embodiment different from the first to third embodiments will be described.

[4-1] Patrol Operation

FIG. 26 shows an example of a change in read voltage after writing to a memory cell transistor MT in the memory system 1 according to the fourth embodiment. In a graph shown in FIG. 26, the vertical axis corresponds to a correction value (DAC value) of the read voltage, and the horizontal axis corresponds to a retention time indicating an elapsed time after data is written in the memory cell transistor MT. As shown in FIG. 26, each read voltage changes based on the elapsed time (data retention time) after data is written in the memory cell transistor MT.

Specifically, for example, the amount of change in each read voltage immediately after writing is larger than the amount of change in each read voltage after a predetermined time has elapsed since writing. In other words, the amount of change in read voltage is large for a while from immediately after writing, and when the time elapses to some extent, the amount of change in read voltage becomes small. Thus, the memory system 1 according to the fourth embodiment changes an execution cycle of the patrol operation after data is written, in accordance with the lapse of time after the data is written.

Figure 27:
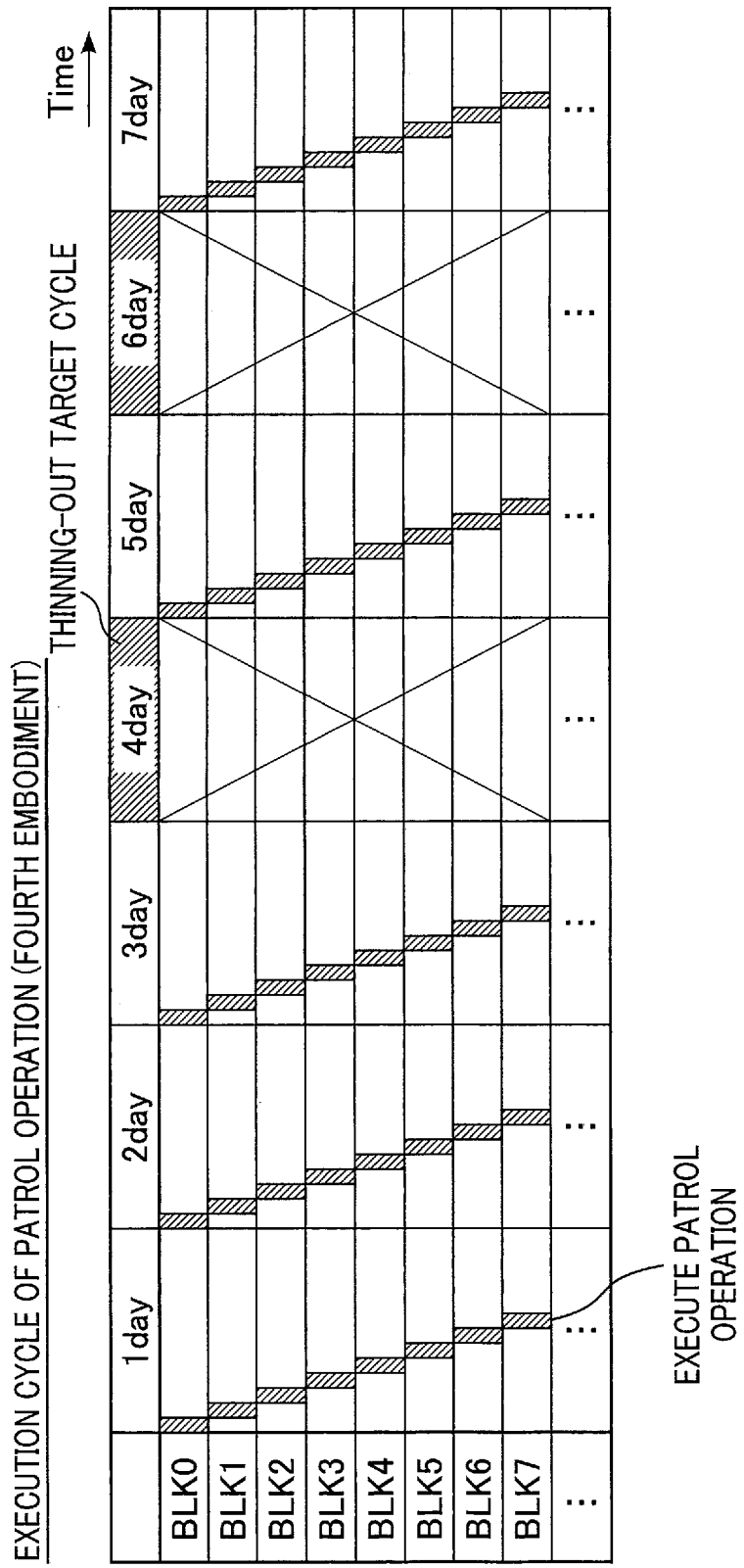
FIG. 27 is a timing chart showing an example of the execution cycle of the patrol operation in the memory system according to the fourth embodiment.

FIG. 27 shows an example of the execution cycle of the patrol operation in the memory system 1 according to the fourth embodiment. In a timing chart referred to in the following description, the vertical bar shown in each item indicates that the patrol operation is executed for all word lines WL in the block BLK, for example. It is assumed that write operation for each of the illustrated blocks BLK0 to BLK7 has been executed on the same day. The illustrated period corresponds to the number of days elapsed since data has been written in each of the blocks BLK.

As shown in FIG. 27, in the memory system 1 according to the fourth embodiment, the patrol operation is executed sequentially from the block BLK0 in a patrol period of the first cycle ("1 day"). Then, the same patrol operation as in the first cycle is executed for each of the patrol periods of the second cycle ("2 day"), the third cycle ("3 day"), the fifth cycle ("5 day"), and the seventh cycle ("7 day").

On the other hand, in the memory system 1 according to the fourth embodiment, the patrol operation is omitted in the patrol periods of, for example, the fourth cycle ("4 day") and the sixth cycle ("6 day"). That is, the patrol operation is executed every day for two days immediately after writing, and the patrol operation is omitted once every two days since third day ("thinning-out target cycle").

In the memory system 1 according to the fourth embodiment, it is possible to appropriately change the frequency of inserting the thinning-out target cycle. The thinning-out target cycle is inserted at least after a predetermined number of patrol periods are repeated from immediately after writing. The thinning-out target cycle may be inserted continuously.

In the above description, the case where the thinning-out target cycle is inserted in the repeated patrol periods is exemplified, but the present invention is not limited thereto. For example, in the operation described in the fourth embodiment, the cycle in which the patrol operation is executed may be regarded as being changed according to the lapse of time after writing. In this case, the cycle in which the patrol operation is executed is set so as to be long with the lapse of time.

[4-2] Effects of Fourth Embodiment

As described with reference to FIG. 26 in the fourth embodiment, the amount of change in read voltage changes with the lapse of time. The amount of change in read voltage is the largest after writing and decreases with the lapse of time. Such a phenomenon may be caused by a particularly large drop in a threshold voltage of the memory cell transistor MT immediately after writing.

Thus, the memory system 1 according to the fourth embodiment changes the cycle in which the patrol operation is executed, according to the lapse of time after writing. In other words, the memory system 1 according to the fourth embodiment executes the patrol operation at an appropriate frequency according to a change in data retention characteristics of the memory cell transistor MT.

Consequently, the memory system 1 according to the fourth embodiment can reduce a processing amount of the patrol operation while guaranteeing reliability of data to be stored. Accordingly, the memory system 1 according to the fourth embodiment can reduce the probability of the conflict between host read and the patrol operation and can improve the latency.

[5] Fifth Embodiment

A memory system 1 according to a fifth embodiment has the same configuration as the memory system 1 according to the first embodiment, for example. The memory system 1 according to the fifth embodiment inserts shortened patrol operation in accordance with a lapse of time after data is written in a block BLK. Hereinafter, points of the memory system 1 according to the fifth embodiment different from the first to fourth embodiments will be described.

[5-1] Abbreviated Tracking Read

In the shortened patrol operation, the memory system 1 executes abbreviated tracking read. In the abbreviated tracking read, tracking for estimating a correction value of read voltage is executed only for higher read voltage, for example. A correction value of read voltage corresponding to the lower read voltage is estimated from the correction value of the higher read voltage.

FIG. 28 shows an example of a tracking target state in the abbreviated tracking read of the memory system 1 according to the fifth embodiment. As shown in FIG. 28, in this example, when an object to be read is a middle page, tracking corresponding to a read voltage FR is executed, and tracking corresponding to each of read voltages BR and DR is omitted. When the object to be read is an upper page, tracking corresponding to a read voltage GR is executed, and tracking corresponding to a read voltage CR is omitted.

On the other hand, when the object to be read is a lower page, tracking can be executed for both read voltages AR and ER, for example. The reason for this is that a read error tends to occur between threshold distribution at "A" state corresponding to the lowest write state and threshold distribution at "ER" state. That is, in the abbreviated tracking read, a plurality of read voltages may be used in a page including read voltage corresponding to the lowest write state.

FIG. 29 is a timing chart showing an example of the abbreviated tracking read in the memory system 1 according to the fifth embodiment and shows an example of the abbreviated tracking read corresponding to read operation of the upper page. As shown in FIG. 29, when the abbreviated tracking read of the upper page is executed, a memory controller 20 transmits, for example, a command "xzh", a command "03h", a command "00h", address information "ADD" of five cycles, and a command "30h" to a NAND-type flash memory 10 in this order.

The command "xzh" is a command instructing the NAND-type flash memory 10 to execute abbreviated tracking read. Upon receiving the command "30h", the NAND-type flash memory 10 transitions from a ready state to a busy state, and a sequencer 15 starts abbreviated tracking read.

When the abbreviated tracking read of the upper page starts, for example, tracking voltages GRt1, GRt2, GRt3, GRt4, and GRt5 corresponding to the read voltage GR are sequentially applied to a selected word line WLsel.

The sequencer 15 asserts the control signal STB while each tracking voltage is being applied to the selected word line WLsel. Then, the sequencer 15 estimates an optimum read voltage GRc based on read results of the tracking voltages GRt1 to GRt5. Further, the sequencer 15 estimates an optimum read voltage CRc based on the optimum read voltage GRc.

A correction value corresponding to the optimum read voltage obtained by the abbreviated tracking read is held in a status register 13A, for example, in the same manner as normal tracking read. Thereafter, the optimum read voltages CRc and GRc are sequentially applied to the selected word line WLsel. Since the operation of the abbreviated tracking read thereafter is the same as the operation of the tracking read described with reference to FIG. 13, the description thereof will be omitted.

In this example, the memory system 1 can also execute abbreviated tracking read of other pages in the same manner as the abbreviated tracking read of the upper page. For example, in the tracking read of the middle page, a command "02h" is used instead of the command "03h". In the abbreviated tracking read of the middle page, the tracking voltage and the read voltage to be used are appropriately changed. Since the other operations in the abbreviated tracking read of the middle page are the same as those in the abbreviated tracking read of the upper page, their explanations are omitted.

[5-2] Patrol Operation

Referring again to FIG. 26, a change in each read voltage based on an elapsed time (data retention time) after data is written in the memory cell transistor MT will be described. As shown in FIG. 26, the amount of change in each read voltage greatly differs between a group having a lower read voltage and a group having a higher read voltage.

Specifically, for example, the amount of change in read voltage in each of the read voltages BR, CR, and DR is smaller than the amount of change in read voltage in each of the read voltages ER, FR, and GR. In other words, the amount of change in read voltage tends to be larger in the group having a higher read voltage (read voltages ER, FR, and GR) than in the group having a lower read voltage (read voltages BR, CR, and DR).

Thus, the memory system 1 according to the fifth embodiment appropriately inserts the shortened patrol operation using the abbreviated tracking read in accordance with a lapse of time after data is written. In the abbreviated tracking read, tracking for read voltage with a relatively large amount of change in read voltage is executed, and tracking for read voltage with a relatively small amount of change in read voltage is omitted.

FIG. 30 shows an example of an execution cycle of the patrol operation in the memory system 1 according to the fifth embodiment. As shown in FIG. 30, in the memory system 1 according to the fifth embodiment, the patrol operation is executed sequentially from a block BLK0 in a patrol period of the first cycle ("1 day"). Then, the same patrol operation as in the first cycle is executed for each of the patrol periods of the second cycle ("2 day"), the fourth cycle ("4 day"), and the seventh cycle ("7 day").

On the other hand, in the memory system 1 according to the fifth embodiment, the shortened patrol operation is executed sequentially from the block BLK0 in the patrol periods of, for example, the third cycle ("3 day") the fifth cycle ("5 day"), and the sixth cycle ("6 day") ("shortening target cycle"). That is, normal patrol operation is executed every day for two days immediately after writing, and the shortened patrol operation is appropriately inserted since third day ("thinning-out target cycle").

In the memory system 1 according to the fifth embodiment, it is possible to appropriately change the frequency of inserting the shortening target cycle. The shortening target cycle is inserted at least after a predetermined number of patrol periods are repeated from immediately after writing. The shortening target cycle may be inserted continuously.

[5-3] Effects of Fifth Embodiment

As described with reference to FIG. 26 in the fifth embodiment, the amount of change in read voltage is different for each read voltage. The amount of change in read voltage tends to increase as the read voltage increases. Such a phenomenon may be caused by the fact that the higher the threshold voltage, the larger a drop in a threshold voltage of the memory cell transistor MT immediately after writing.

Thus, the memory system 1 according to the fifth embodiment appropriately uses the normal patrol operation with high accuracy and the high-speed shortened patrol operation according to the lapse of time after writing. Specifically, the memory system 1 according to the fifth embodiment executes the normal patrol operation with high accuracy during a period in which the amount of change in read voltage is large, that is, in a predetermined period including immediately after writing. On the other hand, the memory system 1 according to the fifth embodiment appropriately executes the shortened patrol operation during a period in which the amount of change in read voltage is small, that is, after a predetermined time has elapsed.

The accuracy of the correction value of the read voltage obtained by the shortened patrol operation is inferior to the normal patrol operation. However, since the memory system 1 according to the fifth embodiment also executes the normal patrol operation as appropriate, the accuracy of the correction value corresponding to the read voltage for which tracking is omitted in the shortened patrol operation can also be guaranteed, and reliability of read data can be maintained.

As a result, the memory system 1 according to the fifth embodiment can reduce a processing amount of the patrol operation while guaranteeing the reliability of data to be stored. Accordingly, the memory system 1 according to the fifth embodiment can reduce a waiting time when host read and the patrol operation conflict and can improve the latency.

[6] Sixth Embodiment

A memory system 1 according to a sixth embodiment has the same configuration as the memory system 1 according to the first embodiment, for example. The memory system 1 according to the sixth embodiment selectively executes patrol operation in accordance with an execution data retention time after data is written in a block BLK. Hereinafter, points of the memory system 1 according to the sixth embodiment different from the first to fifth embodiments will be described.

[6-1] Patrol Operation

In the memory system 1 according to the sixth embodiment, in the patrol operation, the system temperature of the memory system 1 measured by a temperature sensor 25 or temperature information acquired from a NAND-type flash memory 10 is used. For example, a CPU 21 of a memory controller 20 updates a patrol management parameter based on a measurement result of the system temperature of the memory system 1 by the temperature sensor 25.

The patrol management parameter is held in the RAM 22, for example. In the sixth embodiment, information on the execution data retention time for each of the blocks BLK is recorded in the patrol management parameter.

The execution data retention time is a time obtained by converting a time during which the memory system 1 has been heated under various temperature conditions after data has been written in the block BLK into a time during which the memory system 1 has been heated under a specific temperature condition. For example, an elapsed time since data is written in the block BLK is measured by a timer 28, and the execution data retention time is calculated based on a measurement result of the temperature sensor 25 for each predetermined cycle.

A coefficient used when converting into time under a specific temperature condition is set based on the number of days when error correction of read data becomes impossible when the memory system 1 is heated under each temperature condition, for example. Hereinafter, it is assumed that this specific temperature is set at 40° C. The temperature used as a criterion of the execution data retention time is not limited to 40° C. and can be appropriately changed.

FIG. 31 shows an example of a temperature dependence of data retention characteristics and a patrol criteria after writing in the memory cell transistor MT in the memory system 1 according to the sixth embodiment. In the graph shown in FIG. 31, the vertical axis corresponds to an effective time @ 40° C. (Day) after data is retained, that is, the effective data retention time based on 40° C., and the horizontal axis corresponds to a heating time (Day) for the memory cell transistor MT. As shown in FIG. 31, the effective data retention time increases as the system temperature of the memory system 1 increases.

Specifically, an effective time when the memory system 1 is heated for one day at a system temperature of 40° C., for example, is calculated as one day. In this case, an effective time when the memory system 1 is heated for one day at a system temperature of 25° C. is shorter than one day, and an effective time when the memory system 1 is heated for one day at a system temperature of 70° C. is longer than one day.

An effective time during which reliability of data stored in the block BLK can be maintained is set to, for example, one month. For the block BLK in which the effective time exceeds one month, it is assumed that error correction becomes difficult, and it is preferable to execute the patrol operation.

Thus, the memory system 1 according to the sixth embodiment selectively executes the patrol operation based on the effective data retention time recorded in the patrol management parameter.

FIG. 32 shows an example of the patrol management parameter in the patrol operation of the memory system 1 according to the sixth embodiment. As shown in FIG. 32, the effective data retention time for each of the blocks BLK is recorded in the patrol management parameter in the sixth embodiment. The effective data retention time recorded in the patrol management parameter may be updated sequentially or may be updated at predetermined intervals.

When the memory system 1 according to the sixth embodiment detects the block BLK in which the effective data retention time exceeds a predetermined criterion, the memory system 1 executes the patrol operation for the block BLK. When the criteria of the patrol operation is set to "the effective time exceeds one month", in this example, blocks BLK5 and BLK6 exceed the criteria. That is, once the effective data retention time exceeds one month, the memory system 1 executes the patrol operation for each of the blocks BLK5 and BLK6.

In this example, the effective data retention time is continuously updated after the patrol operation is executed. In this case, after the patrol operation is executed, if the time set as the criteria of the patrol operation elapses again, the patrol operation is executed again. The number of executions of the patrol operation may be recorded in the patrol management parameter, and the patrol operation can be executed based on the execution number and the criteria of the patrol operation.

After the patrol operation is executed, the effective data retention time corresponding to the relevant block BLK may be reset. Even in such a case, the memory system 1 according to the sixth embodiment can selectively execute the patrol operation based on the effective data retention time for each of the blocks BLK.

[6-2] Effects of Sixth Embodiment

As described with reference to FIG. 31 in the sixth embodiment, the data retention characteristics of the memory cell transistor MT deteriorate as the system temperature increases and tend to improve as the system temperature decreases. For example, even in the memory system 1 in which the limit of maintaining the reliability of data is one day when the memory system 1 has a system temperature of 70° C., if the system temperature is 40° C., the reliability of data can be maintained for one month, for example.

Thus, when the system temperature of the memory system 1 is high, it is preferable that the frequency of the patrol operation is higher. On the other hand, when the system temperature of the memory system 1 is low, problems are unlikely to occur even if the frequency of the patrol operation is low.

Thus, the memory system 1 according to the sixth embodiment changes the frequency with which the patrol operation is executed based on the effective data retention time according to the system temperature. Specifically, in the memory system 1 according to the sixth embodiment, appropriately with reference to the measurement result of the temperature sensor 25, the measurement result is converted into the effective data retention time under a specific temperature condition, for example. In the memory system according to the sixth embodiment, a predetermined criterion is provided for the effective data retention time, and the patrol operation is executed at an appropriate frequency based on the criterion.

Consequently, the memory system 1 according to the sixth embodiment can reduce a processing amount of the patrol operation while guaranteeing the reliability of data to be stored. Accordingly, the memory system 1 according to the sixth embodiment can reduce the probability of the conflict between host read and the patrol operation and can improve the latency. Note that, the effects described above in the sixth embodiment are not always the case. For example, the frequency of the patrol operation increases as the system temperature increases. In this case, the effects described above in the sixth embodiment may not be apparent.

[7] Seventh Embodiment

A memory system 1 according to a seventh embodiment has the same configuration as the memory system 1 according to the first embodiment, for example. In the memory system 1 according to the seventh embodiment, a block BLK retaining valid data is set as a patrol target, and patrol operation is selectively executed. Hereinafter, points of the memory system 1 according to the seventh embodiment different from the first to sixth embodiments will be described.

[7-1] Patrol Operation

FIG. 33 shows an example of a patrol management parameter in the patrol operation of the memory system 1 according to the seventh embodiment. As shown in FIG. 33, in the patrol management parameter in the seventh embodiment, for example, a valid data area flag is recorded for each of the blocks BLK. The valid data area flag indicates whether or not valid data is written in the relevant block BLK.

For example, when the valid data area flag is "TRUE", this indicates that the valid data is written in this block BLK. On the other hand, when the valid data area flag is "FALSE", this indicates that only invalid data is written in this block BLK, or the block BLK is in an erased state. Then, the memory system 1 according to the seventh embodiment executes the patrol operation based on the valid data area flag.

Figure 34:
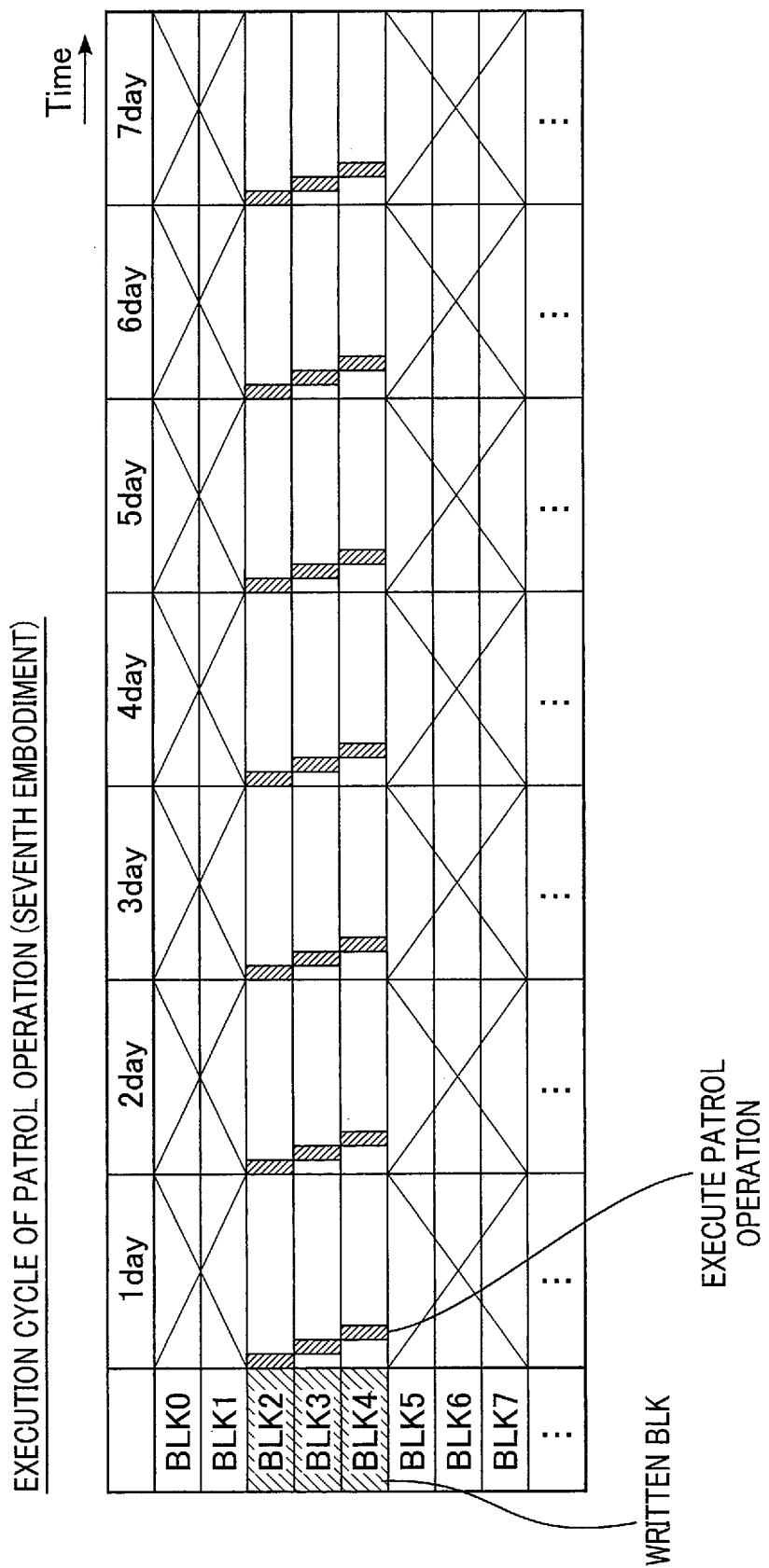
FIG. 34 is a timing chart showing an example of an execution cycle of the patrol operation in the memory system according to the seventh embodiment.

FIG. 34 shows an example of an execution cycle of the patrol operation in the memory system 1 according to the seventh embodiment. In this example, it is assumed that the valid data area flag corresponding to blocks BLK2, BLK3, and BLK4 is "TRUE", and the valid data area flag corresponding to the other blocks BLK is "FALSE".

As shown in FIG. 34, in the memory system 1 according to the seventh embodiment, in each patrol period, the patrol operation for the blocks BLK2, BLK3, and BLK4 which are the written blocks BLK is executed. On the other hand, in each patrol period, the patrol operation is not executed for the other blocks BLK in which the valid data area flag is "FALSE".

As described above, the memory system 1 according to the seventh embodiment can selectively execute the patrol operation for the block BLK in which the valid data is written, based on the valid data area flag.

In the operation described above, it can be rephrased as "the memory controller 20 reads a logical-physical conversion table from a system management area (for example, the RAM 22), executes the patrol operation for a block retaining valid data, and omits the patrol operation for data that has become invalid due to overwriting and an erased block".

[7-2] Effects of Seventh Embodiment

In the memory system 1, the block BLK including valid data and the block BLK including only invalid data coexist. The block BLK including only invalid data corresponds to, for example, the block BLK in the erased state in which writing is not executed and the block BLK in a copy source in garbage collection or the like.

Read operation is executed for the block BLK including valid data. On the other hand, the read operation is not executed for the block BLK including only invalid data. Thus, even if the patrol operation for the block BLK including only invalid data is omitted, no problem arises.

Thus, the memory system 1 according to the seventh embodiment selectively executes the patrol operation for the block BLK including valid data and omits the patrol operation for the block BLK including only invalid data.

Consequently, the memory system 1 according to the seventh embodiment can reduce a processing amount of the patrol operation. Accordingly, the memory system 1 according to the seventh embodiment can reduce the probability of the conflict between host read and the patrol operation and can improve the latency.

[8] Other Variations and the Like

The memory system of the embodiment <for example, FIG. 1, 1> includes a semiconductor memory and a memory controller. A semiconductor memory <for example, FIG. 3, 10> includes a plurality of memory cells connected in series and a plurality of word lines. Each of the plurality of word lines is connected to each of the memory cells. A memory controller <for example, FIG. 1, 20> executes the patrol operation including read operation of a semiconductor memory. The word lines are classified into one of a first group and a second group based on the address of the word line. The memory controller executes a plurality of the patrol operations in which the word lines are selected in a first patrol period. In a second patrol period <for example, FIG. 25, thinning-out target cycle> subsequent to the first patrol period, the memory controller executes the patrol operation in which the word line included in the first group is selected and omits the patrol operation in which the word line included in the second group is selected. Consequently, the memory system of the embodiment can guarantee reliability of data and improve latency.

The above embodiments can be combined as appropriate. For example, any one of the third to seventh embodiments may be applied to the first or second embodiment. The third to seventh embodiments can be combined with each other.

In the above embodiments, the data assignment to the memory cell transistor MT can be appropriately changed. For example, when 3-bit data is stored in the memory cell transistor MT, the data assignment other than the 2-3-2 code may be applied.

In the above embodiment, the case where the 3-bit data is stored in the single memory cell transistor MT has been exemplified. However, data of 1 bit, 2 bits, or 4 bits or more may be stored in the single memory cell transistor MT. Also in such a case, the memory system 1 can execute the operation described in the above embodiments.

In each of the tracking read, the shift read, and the abbreviated tracking read described in the above embodiments, the voltages applied to the selected word line WLsel are the same as the voltage of the signal line CG transferring the voltage to the row decoder module 18, for example.

That is, the voltage applied to various wires or the period during which the voltage is applied can roughly be known by examining the voltage of the corresponding signal line CG. In estimating the voltage of the word line WL from the voltage of the signal line CG, a voltage drop due to the transistor TR included in the row decoder RD may be taken into consideration. In this case, the voltage of the word line WL becomes lower than the voltage applied to the corresponding signal line CG by the voltage drop of the transistor TR.

In the above embodiments, each of the commands "xxh", "yyh", "zzh", and "zxh" used in the description can be replaced by any command.

In the above embodiments, the case where the commands "01h" to "03h" are used as the commands instructing the operations corresponding to the first to third pages, respectively, has been described as an example, but the present invention is not limited thereto. For example, the commands "01h" to "03h" may be replaced by other commands, or these commands may be omitted by including information on the page in the address information ADD.

In the above embodiment, the case where the memory cell transistors MT provided in the memory cell array 11 are three-dimensionally stacked has been described as an example, but the present invention is not limited thereto. For example, the configuration of the memory cell array 11 may be a planar NAND-type flash memory in which the memory cell transistors MT are two-dimensionally arranged. Even in such a case, the above embodiment can be realized, and similar effects can be obtained.

The memory cell array 11 in the above embodiment may have other configurations. The other configurations of the memory cell array 11 are described in, for example, Specification of U.S. patent application Publication Ser. No. 12/407,403 filed on Mar. 19, 2009, titled "THREE DIMENSIONAL STACKED NONVOLATILE SEMICONDUCTOR MEMORY", Specification of U.S. patent application Publication Ser. No. 12/406,524 filed on Mar. 18, 2009, titled "THREE DIMENSIONAL STACKED NONVOLATILE SEMICONDUCTOR MEMORY", Specification of U.S. patent application Publication Ser. No. 12/679,991 filed on Mar. 25, 2010, titled "NON-VOLATILE SEMICONDUCTOR STORAGE DEVICE AND METHOD OF MANUFACTURING THE SAME", and Specification of U.S. patent application Publication Ser. No. 12/532,030 filed on Mar. 23, 2009, titled "SEMICONDUCTOR MEMORY AND METHOD FOR MANUFACTURING SAME". The above patent applications are incorporated by reference herein in their entirety.

The "connection" in this specification means electrical connection and does not exclude the fact that another element is interposed in the connection. In the present specification, the "off state" means that a voltage less than the threshold voltage of the corresponding transistor is applied to a gate of the transistor, and, for example, it does not exclude the fact that a minute current such as a leak current of the transistor flows.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory system comprising:
a semiconductor memory comprising a plurality of memory cells and a word line connected to the plurality of memory cells; and
a memory controller configured to repeat a patrol operation in a first period, the patrol operation including a read operation of the plurality of memory cells, wherein
the first period includes a second period and a third period, the third period having a same length as the second period and following the second period,
the second period includes a period immediately after data is written in the memory cell, and
a number of repeating the patrol operation selecting the word line in the second period is different from that in the third period.

2. The memory system of claim 1, wherein the memory controller is configured to execute the patrol operation independently of an instruction from an external host device.

3. The memory system of claim 1, wherein in the patrol operation, based on a read result, the memory controller is configured to determine whether a defect occurs in the word line corresponding to the read result.

4. The memory system of claim 1, wherein in the patrol operation, the semiconductor memory is configured to search an optimum read voltage based on results of a plurality of read operations.

5. The memory system of claim 1, wherein
the number of repeating the patrol operation selecting the word line in the second period is less than that in the third period.

6. The memory system of claim 1, wherein
the memory controller is configured to control whether to execute the patrol operation in each of repeated patrol periods.

7. The memory system of claim 6, wherein
the memory controller is configured to omit the patrol operation during at least one of the patrol periods in response to a first number of patrol periods are repeated from immediately after writing.

8. The memory system of claim 1, wherein
the memory controller is configured to set the frequency of executing the patrol operation to be long with the lapse of time.

9. The memory system of claim 1, further comprising:
a plurality of blocks each comprising a plurality of the memory cells,
wherein the memory controller is configured to read a logical-physical conversion table from a system management area, execute the patrol operation for a block retaining valid data, and omit the patrol operation for data that has become invalid due to overwriting or an erased block.

10. The memory system of claim 5, wherein
the second period includes a fourth period and a fifth period, the fifth period being after the fourth period,
the fourth period includes the period immediately after the data is written in the memory cell, and
the memory controller is configured to execute the patrol operation selecting the word line in the fourth period, and skip the patrol operation selecting the word line in the fifth period.

11. A method of controlling a semiconductor memory comprising a plurality of memory cells and a word line connected to the plurality of memory cells, the method comprising:
repeating a patrol operation in a first period, the patrol operation including a read operation of the plurality of memory cells, wherein
the first period includes a second period and a third period, the third period having a same length as the second period and following the second period,
the second period includes a period immediately after data is written in the memory cell, and
a number of repeating the patrol operation selecting the word line in the second period is different from that in the third period.

12. The method of claim 11, further comprising:
executing the patrol operation independently of an instruction from an external host device.

13. The method of claim 11, further comprising:
in the patrol operation, based on a read result, determining whether a defect occurs in the word line corresponding to the read result.

14. The method of claim 11, further comprising:
in the patrol operation, searching an optimum read voltage based on results of a plurality of read operations.

15. The method of claim 11, wherein
the number of repeating the patrol operation selecting the word line in the second period is less than that in the third period.

16. The method of claim 11, further comprising:
controlling whether to execute the patrol operation in each of repeated patrol periods.

17. The method of claim 11, further comprising:
omitting the patrol operation during at least one of the patrol periods in response to a first number of patrol periods are repeated from immediately after writing.

18. The method of claim 11, further comprising:
setting the frequency of executing the patrol operation to be long with the lapse of time.

19. The method of claim 11, further comprising:
reading a logical-physical conversion table from a system management area,
executing the patrol operation for a block retaining valid data; and
omitting the patrol operation for data that has become invalid due to overwriting or an erased block, wherein
a plurality of blocks each comprises a plurality of the memory cells.

20. The method of claim 15, further comprising:
executing the patrol operation selecting the word line in a fourth period, and skipping the patrol operation selecting the word line in a fifth period, wherein
the second period includes the fourth period and the fifth period, the fifth period being after the fourth period, and
the fourth period includes the period immediately after the data is written in the memory cell.

* * * * *